US011557827B2

(12) United States Patent
Anguera Pros et al.

(10) Patent No.: US 11,557,827 B2
(45) Date of Patent: Jan. 17, 2023

(54) ANTENNALESS WIRELESS DEVICE

(71) Applicant: IGNION, S.L., Barcelona (ES)

(72) Inventors: Jaume Anguera Pros, Vinaros (ES); Aurora Andujar Linares, Barcelona (ES); Carles Puente Baliarda, Barcelona (ES); Josep Mumbru, Asnières-sur-Seine (FR)

(73) Assignee: IGNION, S.L., Barcelona (ES)

(*) Notice: Subject to any disclaimer, the term of this patent is extended or adjusted under 35 U.S.C. 154(b) by 0 days.

(21) Appl. No.: 17/479,703

(22) Filed: Sep. 20, 2021

(65) Prior Publication Data

US 2022/0077581 A1 Mar. 10, 2022

Related U.S. Application Data

(60) Continuation of application No. 16/827,048, filed on Mar. 23, 2020, now Pat. No. 11,139,574, which is a (Continued)

(30) Foreign Application Priority Data

Aug. 4, 2008 (EP) .................................... 08161722
Dec. 24, 2008 (EP) .................................... 08172925
(Continued)

(51) Int. Cl.
*H01Q 1/48* (2006.01)
*H01Q 1/24* (2006.01)
(Continued)

(52) U.S. Cl.
CPC ............... *H01Q 1/243* (2013.01); *H01Q 1/48* (2013.01); *H01Q 1/50* (2013.01); *H01Q 5/00* (2013.01);
(Continued)

(58) Field of Classification Search
CPC ............................... H01Q 1/243; H01Q 5/335
(Continued)

(56) References Cited

U.S. PATENT DOCUMENTS 4,491,843 A 1/1985 Boubouleix
4,843,468 A 6/1989 Drewery
(Continued)

FOREIGN PATENT DOCUMENTS

CN 1457533 11/2003
CN 1649206 8/2005
(Continued)

OTHER PUBLICATIONS

Munson, R., "Antenna engineering Handbook—Chapter 7—Microstrip Antennas," Johnson, R. C.—McGraw-Hill—Third Edition (Jan. 1, 1993).
(Continued)

*Primary Examiner* — Peguy Jean Pierre
(74) *Attorney, Agent, or Firm* — Edell, Shapiro & Finnan, LLC

(57) ABSTRACT

A radiating system of a wireless device transmits and receives electromagnetic wave signals in a frequency region and comprises an external port, a radiating structure, and a radiofrequency system. The radiating structure includes: a ground plane layer with a connection point; a radiation booster with a connection point and being smaller than 1/30 of a free-space wavelength corresponding to a lowest frequency of the frequency region; and an internal port between the radiation booster connection point and the ground plane layer connection point. The radiofrequency system includes: a first port connected to the radiating structure's internal port; and a second port connected to the external port. An input impedance at radiating structure's disconnected internal port has a non-zero imaginary part across the frequency
(Continued)

region. The radiofrequency system modifies impedance of the radiating structure to provide impedance matching to the radiating system within the frequency region at the external port.

20 Claims, 28 Drawing Sheets

Related U.S. Application Data continuation of application No. 15/973,124, filed on May 7, 2018, now Pat. No. 10,734,724, which is a division of application No. 15/670,872, filed on Aug. 7, 2017, now abandoned, which is a continuation of application No. 15/004,151, filed on Jan. 22, 2016, now Pat. No. 9,761,944, which is a continuation of application No. 14/738,115, filed on Jun. 12, 2015, now Pat. No. 9,276,307, which is a continuation of application No. 13/476,503, filed on May 21, 2012, now Pat. No. 9,130,259, which is a continuation of application No. 12/669,147, filed as application No. PCT/EP2009/005579 on Jul. 31, 2009, now Pat. No. 8,203,492.

(60) Provisional application No. 61/142,523, filed on Jan. 5, 2009, provisional application No. 61/086,838, filed on Aug. 7, 2008.

(30) Foreign Application Priority Data

Jul. 13, 2009 (ES) ............................ ESP200930444
Jul. 24, 2009 (ES) ............................ ESP200930499

(51) Int. Cl.

| | |
|---|---|
| ***H01Q 5/00*** | (2015.01) |
| ***H01Q 5/335*** | (2015.01) |
| ***H01Q 5/35*** | (2015.01) |
| ***H01Q 5/50*** | (2015.01) |
| ***H01Q 1/50*** | (2006.01) |
| ***H01Q 9/04*** | (2006.01) |

(52) U.S. Cl.

CPC ............... *H01Q 5/335* (2015.01); *H01Q 5/35* (2015.01); *H01Q 5/50* (2015.01); *H01Q 9/0407* (2013.01); *H05K 999/99* (2013.01)

(58) Field of Classification Search

USPC .......................................................... 343/860
See application file for complete search history.

(56) References Cited

U.S. PATENT DOCUMENTS

| | | | |
|---|---|---|---|
| 5,363,114 | A | 11/1994 | Shoemaker |
| 5,489,912 | A | 2/1996 | Holloway |
| 5,657,386 | A | 8/1997 | Schwanke |
| 5,666,125 | A | 9/1997 | Luxon et al. |
| 5,784,032 | A | 7/1998 | Johnston et al. |
| 5,826,201 | A | 10/1998 | Gratias |
| 5,903,822 | A | 5/1999 | Sekine et al. |
| 6,011,518 | A | 1/2000 | Yamagishi et al. |
| 6,087,990 | A | 7/2000 | Thill et al. |
| 6,133,883 | A | 10/2000 | Munson et al. |
| 6,211,826 | B1 | 4/2001 | Aoki |
| 6,218,989 | B1 | 4/2001 | Schneider et al. |
| 6,218,992 | B1 | 4/2001 | Sadler et al. |
| 6,373,439 | B1 | 4/2002 | Zürcher et al. |
| 6,388,631 | B1 | 5/2002 | Livingston et al. |
| 6,621,469 | B2 | 9/2003 | Judd et al. |
| 6,674,411 | B2 | 1/2004 | Boyle |
| 6,762,723 | B2 | 7/2004 | Nallo et al. |
| 6,791,498 | B2 | 9/2004 | Boyle et al. |
| 6,795,027 | B2 | 9/2004 | Boyle |
| 6,873,299 | B2 | 3/2005 | Dakeya et al. |
| 6,996,421 | B2 | 2/2006 | Kaegebein |
| 7,069,043 | B2 | 6/2006 | Sawamura et al. |
| 7,176,845 | B2 | 2/2007 | Fabrega-Sanchez et al. |
| 7,209,087 | B2 | 4/2007 | Tang et al. |
| 7,215,284 | B2 | 5/2007 | Collinson |
| 7,274,340 | B2 | 9/2007 | Ozden et al. |
| 7,345,634 | B2 | 3/2008 | Ozkar et al. |
| 7,421,321 | B2 | 9/2008 | Breed et al. |
| 7,511,675 | B2 | 3/2009 | Puente Baliarda et al. |
| 7,683,839 | B2 | 3/2010 | Ollikainen et al. |
| 7,688,276 | B2 | 3/2010 | Quintero Illera et al. |
| 7,760,146 | B2 | 7/2010 | Ollikainen |
| 2001/0051983 | A1 | 12/2001 | Williams |
| 2002/0011954 | A1 | 1/2002 | Judd et al. |
| 2002/0149524 | A1 | 10/2002 | Boyle |
| 2003/0058176 | A1 | 3/2003 | Keilen et al. |
| 2003/0063036 | A1 | 4/2003 | Sato et al. |
| 2003/0174092 | A1 | 9/2003 | Sullivan et al. |
| 2004/0058723 | A1 | 3/2004 | Mikkola et al. |
| 2004/0145527 | A1 | 7/2004 | Mikkola |
| 2005/0110687 | A1 | 5/2005 | Starkie et al. |
| 2005/0237247 | A1 | 10/2005 | Kinnunen et al. |
| 2006/0214856 | A1 | 9/2006 | Nakano et al. |
| 2007/0109196 | A1 | 5/2007 | Tang et al. |
| 2007/0109208 | A1 | 5/2007 | Turner |
| 2007/0146212 | A1 | 6/2007 | Ozden |
| 2007/0152885 | A1 | 7/2007 | Sorvala |
| 2007/0152886 | A1 | 7/2007 | Baliarda et al. |
| 2007/0171131 | A1 | 7/2007 | Sorvala |
| 2008/0018543 | A1 | 1/2008 | Baliarda et al. |
| 2008/0030410 | A1 | 2/2008 | Ying |
| 2008/0042909 | A1 | 2/2008 | Puente Baliarda et al. |
| 2008/0100514 | A1 | 5/2008 | Abdul-Gaffoor |
| 2008/0129604 | A1 | 6/2008 | Chang et al. |
| 2009/0005110 | A1 | 1/2009 | Ozden |
| 2009/0015486 | A1 | 1/2009 | Han et al. |
| 2009/0309797 | A1 | 12/2009 | Ozden |
| 2009/0322619 | A1 | 12/2009 | Ollikainen et al. |
| 2009/0322623 | A1 | 12/2009 | Xie et al. |
| 2010/0052992 | A1 | 3/2010 | Okamura et al. |
| 2010/0073253 | A1 | 3/2010 | Ollikainen et al. |
| 2011/0117976 | A1 | 5/2011 | Nishikido et al. |
| 2012/0249390 | A1 | 10/2012 | Shirakawa et al. |
| 2012/0287009 | A1 | 11/2012 | Tu et al. |
| 2015/0097741 | A1* | 4/2015 | Pachler .................. H01Q 21/30 343/742 |
| 2015/0116159 | A1 | 4/2015 | Chen et al. |
| 2015/0116168 | A1* | 4/2015 | Yosui ..................... H01Q 5/328 343/722 |
| 2018/0334112 | A1 | 11/2018 | Sung et al. |

FOREIGN PATENT DOCUMENTS

| | | |
|---|---|---|
| CN | 1720638 | 1/2006 |
| CN | 201069869 | 6/2008 |
| DE | 2362240 | 7/1974 |
| EP | 0969375 | 1/2000 |
| EP | 1093098 | 4/2001 |
| EP | 1258054 | 11/2002 |
| EP | 1662604 | 5/2006 |
| ES | 2112163 | 3/1998 |
| FR | 2211766 | 7/1974 |
| GB | 2344969 | 6/2000 |
| JP | 2002223114 | 8/2002 |
| JP | 2005175846 | 6/2005 |
| JP | 2006279159 | 10/2006 |
| KR | 10-0695813 | 3/2007 |
| KR | 10-2008-0080409 | 9/2008 |
| KR | 20090016494 | 2/2009 |
| WO | 94/26000 | 11/1994 |
| WO | 97/06578 | 2/1997 |
| WO | 97/47054 | 12/1997 |
| WO | 99/27608 | 6/1999 |
| WO | 00/76023 | 12/2000 |
| WO | 01/54225 | 7/2001 |

(56) References Cited

FOREIGN PATENT DOCUMENTS

| | | |
|---|---|---|
| WO | 02/13306 | 2/2002 |
| WO | 02/063712 | 8/2002 |
| WO | 02/071541 | 9/2002 |
| WO | 2004/051799 | 6/2004 |
| WO | 2006/020285 | 2/2006 |
| WO | 2006/097496 | 9/2006 |
| WO | 2007/039071 | 4/2007 |
| WO | 2007/039668 | 4/2007 |
| WO | 2007/128340 | 11/2007 |
| WO | 2007/141187 | 12/2007 |
| WO | 2008/009391 | 1/2008 |
| WO | 2008/045151 | 4/2008 |
| WO | 2008/119699 | 10/2008 |
| WO | 2010/010529 | 1/2010 |
| WO | 2012017013 | 2/2012 |

OTHER PUBLICATIONS

Na, "Software—Box counting dimension [electronic], "Sewanee—http://www.sewanee.edu/Physics/PHYSICS123/BOX%20COUNTING%20DIMENSION.html, (Apr. 1, 2002).

Neary, D., "Fractal methods in image analysis and coding," Dublin City University—www.redbrick.dcu.ie/*bolsh/thesis/node16.html and *node22.html, (Jan. 22, 2001).

Ng, V., "Diagnosis of melanoma with fractal dimensions," TENCON, 1993. IEEE Conference, (Jan. 1, 1993).

Ollikaninen, J. et al., "Design and implementation techniques of wideband mobile communications antennas," Helsinki University of Technology (Nov. 1, 2004).

Park, et al., "Performance improvement methodology of isolation in a Dual-standby mobile phone by optimizing antenna topology and position," Antennas and Propagation Society (APS), 2008. IEEE International Symposium, (Jul. 5, 2008).

Peitgen, H.O., et al., "Chaos and fractals. New frontiers of science," Springer, pp. 212-216; 387-388 (Feb. 12, 1993).

Penn, A., "Fractal dimension of low-resolution medical images," Engineering in Medicine and Biology Society (EMBS), 18th ,1996. IEEE Annual International Conference of the, (Jan. 1, 1996).

Poutanen, J., "Interaction between mobile terminal antenna and user," Helsinki University of Technology (Sep. 10, 2007).

Poutanen, J., et al., "Behaviour of mobile terminal antennas near human tissue at a wide frequency range," Antenna Technology: Small Antennas and Novel Metamaterials (IWAT), 2008. IEEE International Workshop on, (Jan. 1, 2008).

Pozar, D.M.; Schaubert, D. H., "Microstrip antennas. The analysis and design of microstrip antennas and arrays," IEEE Press; Pozar, Schaubert, p. 431 (Jan. 1, 1995).

Rahola, J., "Characteristic mode analysis: eigenvalue analysis of antenna structures," Nokia (Oct. 12, 2007).

Rao, Q.; Wen, G., "Ultra-small cubic folded strip antenna for handset devices," Antennas and Propagation Society (APS), 2008. IEEE International Symposium, (Jul. 11, 2008).

Rouvier, R. et al., "Fractal analysis of bidimensional profiles and application to electromagnetic scattering from soils," IEEE (Jan. 1, 1996).

Russell, D.A., et al., "Dimension of strange attractors," Physical Review, vol. 45, No. 14 (Oct. 6, 1980).

Sarkar, N., "An efficient differential box-counting approach to compute fractal dimension of image," Systems, Man and Cybernetics, 1994. IEEE International Conference on, vol. 24, No. 1 (Jan. 3, 1994).

Schroeder, W. L., "Miniaturization of mobile phone antennas by utilization of chassis mode resonances," Microwave Conference (EuMC), 36th, 2006. European, (Sep. 1, 2006).

Serrano, R. et al., "Active balanced feeding for compact wideband antennas," Antennas and Propagation Society (APS), 2007. IEEE International Symposium, (Jun. 10, 2007).

Skrivervik, A. K. et al., "PCS antenna design—The challenge of miniaturization," Antennas and Propagation Magazine, IEEE, (Aug. 1, 2001).

So, P. et al., "Box-counting dimension without boxes—Computing D0 from average expansion rates," Physical Review, vol. 60, No. 1 (Jul. 1, 1999).

Su, C., "EMC internal patch antenna for UMTS operation in a mobile device," Antennas and Propagation, IEEE Transactions on, vol. 53 , No. 11 (Nov. 1, 2005).

Su, C. M. et al., "User's hand effects on EMC internal GSM/DCS mobile phone antenna," Antennas and Propagation Society (APS), 2006 IEEE International Symposium, (Jan. 2, 2006).

Talmola, P., "Finding the right frequency: impact of spectrum availability upon the economics of mobile broadcasting," RF for DVB-H/DMB Mobile Broadcast, IET Seminar on, (Jun. 30, 2006).

Tang, Y., "The application of fractal analysis to feature extraction," IEEE (Jan. 1, 1999).

Vainikainen, P., et al., "Recent development of MIMO antennas and their evaluation for small mobile terminals," Microwave Radar and Wireless Communications (MIKON), 17th , 2008. International Conference on, (May 19, 2008).

Vainikainen, P., "Design and measurements of small antennas for mobile terminals," Helsinki University of Technology (Jun. 20, 2006).

Vainikainen, P., "Design and measurements of small antennas for mobile terminals—Part II," Helsinki University of Technology (Jun. 22, 2006).

Villanen, J., "Miniaturization and evaluation methods of mobile terminal antenna structures," Helsinki University of Technology. Radio Laboratory Publications (Sep. 3, 2007).

Villanen, J., "Compact antenna structures for mobile handsets," Vehicular Technology (VTC), 58th, 2003. IEEE Conference, (Oct. 6, 2003).

Villanen, J., "Coupling element based mobile terminal antenna structures," Antennas and Propagation, IEEE Transactions on, (Jul. 1, 2006).

Villanen, J., et al., "Performance analysis and design aspects of mobile-terminal multiantenna configurations," Vehicular Technology (VTC), 67th, 2008. IEEE Conference, vol. 57 , No. 3 (May 1, 2008).

Wong, K.; Huang, C., "Printed Loop Antenna with a Perpendicular Feed for Penta-Band Mobile Phone Application," Antennas and Propagation, IEEE Transactions on, vol. 56 , No. 7 (Jul. 1, 2008).

Wong, K. L., "Internal GSM/DCS antenna backed by a step-shaped ground plane for a PDA phone Antennas and Propagation," IEEE Transactions on, vol. 54 , No. 8 (Aug. 1, 2006).

Wong, K. L., "Surface-mountable EMC monopole chip antenna for WLAN operation," Antennas and Propagation, IEEE Transactions on, vol. 54 , No. 4 (Apr. 1, 2006).

Wong, K. L., "Internal shorted patch antenna for UMTS folder-type mobile phone," Antennas and Propagation, IEEE Transactions on, vol. 53 , No. 10 (Oct. 1, 2005).

Wong, K. L., "Planar antennas for wireless communications_Full," Wiley Interscience (Jan. 1, 2003).

Wong, K. L., "Planar antennas for wireless communications," Wiley, pp. 1-49 (Jan. 1, 2003).

Wong, K. L., et al., "Wideband internal folded planar monopole antenna for UMTS/WiMax folder-type mobile phone," Microwave and Optical Technology Letters, vol. 48 (Feb. 2, 2006).

Wong, K. L.; Tu, S. Y., "Ultra-wideband loop antenna coupled-fed by a monopole feed for penta-band folder-type mobile phone," Microwave and Optical Technology Letters, vol. 50 (Oct. 10, 2008).

Document 0190—Defendant HTC Corporation's First amended answer and counterclaim to plaintiffs amended complaint. Defendants, Oct. 2, 2009.

EP00909089—Minutes from Oral Proceedings, EPO, Jan. 28, 2005.

EP00909089—Office Action dated Feb. 7, 2003, EPO, Feb. 7, Feb. 7, 2003.

EP00909089—Response to Office Action dated Feb. 7, 2003, Herrero & Asociados, Aug. 14, 2003.

EP00909089—Summons to attend oral proceedings, EPO, Oct. 28, 2004.

(56) References Cited

OTHER PUBLICATIONS

EP00909089—Written submissions, Herrero & Asociados, Dec. 15, 2004.
Expert report of Dwight L. Jaggard (redacted)—expert witness retained by Fractus, Fractus, Feb. 23, 2011.
Letter from Baker Botts to Kenyon & Kenyon LLP, Winstead PC and Howison & Arnott LLP including exhibits., Defendants—Baker Botts, Oct. 28, 2009.
PCT/EP00/00411—International preliminary examination report dated Aug. 29, 2002—Notification concerning iocuments transmitted, EPO, Aug. 29, 2002.
PCT/EP2009/005578—International Search Report and Written Opinion of the International Searching Authority, WIPO, dated Feb. 17, 2011.
PCT/EP2009/005579—International Search Report and Written Opinion of the International Searching Authority, EPO, dated May 4, 2010.
Carr, J.J., Practical Antenna Handbook, 4th edition, New York: McGraw-Hill, 2001, p. 203-229, 457-477.
Chen, Z.N., Antennas for Portable Devices, John Wiley & Sons, 2007, pp. 20, 30, 46, 159-160.
Falconer, K, Fractal geometry. Mathematical foundations and applications, Wiley, Jan. 1, 2003, Table of contents.
Lindberg, P., Design techniques for internal terminal antennas, Design of ultra wideband antenna matching networks: via simplified real frequency technique, Springer, 2014, p. 67-71.
Pozar, D., A review of bandwidth enhancement techniques for microstrip antennas, Microstrip antennas: the analysis and design of microstrip antennas and arrays, New York: Institute of Electrical and Electronics Engineers, 1995, p. 159-160.
Pues, H.F., Van De Capelle, A.R., An impedance-matching technique for increasing the bandwidth of microstrip antennas, Microstrip antennas: the analysis and design of microstrip antennas and arrays, New York: Institute of Electrical and Electronics Engineers, 1995, p. 167-175.
Rebuttal expert report of Dr. Dwight L. Jaggard (redacted version), Fractus, Feb. 16, 2011.
Rebuttal expert report of Dr. Stuart A. Long (redacted version), Fractus, Feb. 16, 2011.
U.S. Appl. No. 10/422,578—Office Action dated Apr. 7, 2005, USPTO, Apr. 7, 2005.
U.S. Appl. No. 10/422,578—Office Action dated Aug. 23, 2007, USPTO, Aug. 23, 2007.
U.S. Appl. No. 10/422,578—Office Action dated Aug. 24, 2005, USPTO, Aug. 24, 2005.
U.S. Appl. No. 10/422,578—Office Action dated Jan. 26, 2006, USPTO, Jan. 26, 2006.
U.S. Appl. No. 10/422,578—Office Action dated Mar. 12, 2007, USPTO, Mar. 12, 2007.
U.S. Appl. No. 10/422,578—Office action dated Mar. 26, 2008, USPTO, Mar. 26, 2008.
U.S. Appl. No. 10/422,578—Office Action dated Oct. 4, 2004, USPTO, Oct. 4, 2004.
U.S. Appl. No. 12/669,147—Notice of allowance dated Feb. 22, 2012, USPTO, Feb. 22, 2012.
U.S. Appl. No. 12/669,928—Notice of allowance dated Apr. 12, 2012, USPTO, Apr. 12, 2012.
Addison, P. S., "Fractals and Chaos—An illustrated course—Full," Institute of Physics Publishing Bristol and Philadelphia (Jan. 1997).
Aguilar, et al., "Small handset antenna for FM reception," Microwave and Optical Technology Letters (Oct. 1, 2008).
Balanis, C. A., "Antenna Theory—Analysis and design—Chapter 4—Linear wire antennas," Hamilton Printing, pp. 133-194 (Jan. 1, 1982).
Bank, M.; Levin , B., "The development of a cellular phone antenna with small irradiation of human-organism tissues," Antennas and Propagation Magazine, IEEE, vol. 49 , No. 4 (Jan. 1, 2007).
Bedair, A.; Abdel-Mooty Abdel-Rahman, A B., "Design and development of high gain wideband microstrip antenna and DGS filters using numerical experimentation approach," Universitat Magdeburg. Fakultat Elektrotechnik und Informationstechnik der Otto-von-Guericke- (Jun. 1, 2005).
Behdad, N., et al. ."Slot antenna design for wireless communications systems." Antennas and Propagation (EUCAP), 2nd , 2007. European Conference on (Nov. 8, 2007).
Berizzi, F., "Fractal analysis of the signal scattered from the sea surface," Antennas and Propagation, IEEE Transactions on, vol. 47, No. 2 (Feb. 1, 1999).
Bialkpwski, M., et al., "An equivalent circuit model of a radial line planar antenna with coupling probes," Antennas and Propagation Society (APS), 2002. IEEE International Symposium (Jun. 16, 2002).
Boshoff, H., "A fast box counting algorithm for determining the fractal dimension of sampled continuous functions," EEE (Jan. 1, 1992).
Byandas, A. et al., "Investigations into operation of single—and multi-layer configurations of planar inverted-F antenna," Antennas and Propagation Magazine, IEEE, vol. 49 , No. 4 (Aug. 1, 2007).
Cabedo Fabres, M., "Systematic design of antennas using the theory of characteristic modes," Universitat Politecnica de Valencia (Feb. 1, 2007).
Cabedo Fabres, M., "Modal analysis of a radiating slotted PCB for mobile handsets," Antennas and Propagation (EUCAP), 1st, Nice, 2006. European Conference on (Nov. 6, 2006).
Cabedo Fabres, M., et al., "The theory of characteristics modes revisited: a contribution to the design of antennas tor modern applications," Antennas and Propagation Magazine, IEEE, vol. 49, No. 5 (Oct. 1, 2007).
Cabedo Fabres, M., et al., "Wideband radiating ground plane with notches," Antennas and Propagation Society (APS), 2005. IEEE International Symposium (Jul. 3, 2005).
Carver, K.R. et al., "Microstrip antenna technology," Antennas and Propagation, IEEE Transactions on, AP29, No. 1 (Jan. 1, 1981).
Chaudhury, S. K., et al., "Multiple antenna concept based on characteristic modes of mobiles phone chassis," Antennas and Propagation (EUCAP), 2nd, 2007 European Conference on (Nov. 11, 2007).
Chen, S. et al., "On the calculation of Fractal features from images," Pattern Analysis and Machine Intelligence, IEEE Transactions on, vol. 15, No. 10 (Oct. 1, 1993).
Collins, B. S., "Improving the RF performance of clamshell handsets," Antenna Technology : Small Antennas and Novel Metamaterials (IWAT), 2006. IEEE International Workshop on, (Mar. 6, 2006).
Fang, S.; Shieh, M., "Compact monopole antenna for GSM7DCS/PCS mobile phone," IEEE (Jan. 1, 2005).
Feng, J., "Fractional box-counting approach to fractal dimension estimation," Pattern Recognition, 13th, 1996. International Conference on, (Jan. 1, 1996).
Garg, R. et al., "Microstrip antenna design handbook," Artech House, p. 845 (Jan. 1, 2001).
Hall, P. S., et al., "Reconfigurable antenna challenges for future radio systems," Antennas and Propagation (EUCAP), 3rd , 2009. European Conference on, (Mar. 23, 2009).
Hansen, R. C., "Fundamental limitations in antennas," Proceedings of the IEEE, vol. 69 , No. 2, pp. 170-182 (Feb. 1, 1981).
Hirose, K., et al., "Low-profile circularly polarized radiation elements loops with balanced and unbalanced feeds," Antennas and Propagation Society (APS), 2008. IEEE International Symposium, (Jul. 5, 2008).
Hong, W. et al., "Low-profile, multi-element, miniaturized monopole antenna," Antennas and Propagation, IEEE Transactions on, (Jan. 1, 2009).
Hsu, M. R.; Wong, K., "Ceramic chio antenna for WWAN Operation," Microwave Conference (APMC), 2008. Asia-Pacific, (Dec. 16, 2008).
Huynh, M. C., "A numerical and experimental investigation of planar inverted-F antennas for wireless communication applications," Virginia Polytechnic Institute and State University (Oct. 19, 2000).
Iivonen, J., "Isolated antenna structures of mobile terminals ,Helsinki University of Technology," p. 98 (Aug. 16, 2009).

(56) References Cited

OTHER PUBLICATIONS

Johnson, R. C., "Antenna engineering handbook—Table of contents," McGraw-Hill (Jan. 1, 1993).
Jung, C.; Lee, M., "Reconfigurable Scan-Beam Single-Arm Spiral Antenna Integrated With RF-MEMS Switches," Antennas and Propagation, IEEE Transactions on, vol. 54 , No. 2 (Feb. 1, 2006).
Kababik, P., "Potential advantage of using non rectangular ground in small antennas featuring wideband impedance match," Antennas and Propagation Society (APS), 2007. IEEE International Symposium, (May 1, 2007).
Kababik, P., et al., "An application of a narrow slot cut in the ground to improve multi-band operation of a small antenna," Antennas and Propagation Society (APS), 2007. IEEE International Symposium, (Jun. 10, 2007).
Kababik, P., et al., "Broadening the range of resonance tuning in multiband small antennas," Wireless Communication Technology, 2003. IEEE Topical Conference on, (Oct. 15, 2003).
Kababik, P., et al., "Broadening the bandwidth in terminal antennas by tuning the coupling between the element and ts ground," Antennas and Propagation Society (APS), 2005. IEEE International Symposium, vol. 3 (Jul. 3, 2005).
Kildal, P. S., et al., "Report on the state of the art in small terminal antennas: Technologies, requirements and standards," ACE (Antenna Centre of Excellence), p. 120 (Dec. 31, 2004).
Kim, Y.; Lee, S., "Design and fabrication of a planar inverted-f antenna for the wireless lan in the 5 GHz band," Microwave and Optical Technology Letters, vol. 34 , No. 6 , pp. 469-475 (Sep. 20, 2002).
Kivekas, O., et al., "Design of high-efficiency antennas for mobile communications devices," Helsinki University of Technology (Aug. 1, 2005).
Kobayashi, K., "Estimation of 3D fractal dimension of real electrical tree patterns," Properties and Applications of Dielectric Materials, 4th , 1994. International Conference on, (Jul. 1, 1994).
Kraus, J. D., "Antennas," McGraw-Hill Book Company, TOC (Jan. 1, 1988).
Kyro, M, et al., "Dual-element antenna for DVB-H terminal," Loughborough (LAPC), 2008. Antennas and Propagation Conference (Mar. 17, 2008).
Lin, C. I., et al., "Printed monopole slot antenna for multiband operation in the mobile phone," Antennas and Propagation Society (APS), 2006. IEEE International Symposium, (May 1, 2006).
Lindberg, P et al., "Wideband active and passive antenna solutions for handheld terminals," Uppsala Universitet. Acta Universitatis Upsaliensis (Jan. 1, 2007).
Martinez-Vazquez, M., "A Review of ACE small terminal antennas activities," ACE (Antenna Centre of Excellence) (Nov. 10, 2004).
Meinke, H., "Taschenbuch der hochfrequenztechnik—XP002560328," Springer, N. 14 (Jan. 1, 1992).
Meinke, H., "Taschenbuch der hochfrequenztechnik—XP002462630," Springer (Jan. 1, 1992).
Meinke, H., Gundlach, F., "Taschenbuch der Hochfrequenztechnik: Paperback of high frequency engineering with the collaboration of several experts," Springer (Jan. 1, 1968).
Meinke, H., et al., "Taschenbuch der hochfrequenztechnik—Handbook of high frequency technique," Springer (Jan. 1, 1968).
Mi, M. et al., "RF Energy harvesting with multiple antennas in the same space," Antennas and Propagation Magazine, IEEE, vol. 47 , No. 5 (Oct. 1, 2005).
Minard, P., et al., "On-Board integration of compact printed WiFi antennas with existing DECT Antenna System," Antennas and Propagation Society (APS), 2008. IEEE International Symposium, (Jul. 5, 2008).
Morishita, H. et al., "Design concept of antennas for small mobile terminals and the future perspective," Antennas and Propagation Magazine, IEEE, (Oct. 1, 2002).

* cited by examiner

ANTENNALESS WIRELESS DEVICE

CROSS REFERENCE TO RELATED APPLICATIONS

This application is a continuation of U.S. patent application Ser. No. 16/827,048 filed Mar. 23, 2020, which is a continuation of U.S. patent application Ser. No. 15/973,124 filed May 7, 2018, issued as U.S. Pat. No. 10,734,724, on Aug. 4, 2020, which is a divisional of U.S. patent application Ser. No. 15/670,872 filed Aug. 7, 2017, now abandoned, which is a continuation of U.S. patent application Ser. No. 15/004,151, filed Jan. 22, 2016, issued as U.S. Pat. No. 9,761,944 on Sep. 12, 2017, which is a continuation of U.S. patent application Ser. No. 14/738,115 filed Jun. 12, 2015, issued as U.S. Pat. No. 9,276,307, on Mar. 1, 2016, which is a continuation of U.S. patent application Ser. No. 13/476,503 filed May 21, 2012, issued as U.S. Pat. No. 9,130,259, on Sep. 8, 2015, which is a continuation of U.S. patent application Ser. No. 12/669,147 filed Jan. 14, 2010, issued as U.S. Pat. No. 8,203,492, on Jun. 19, 2012, which is a 371 national phase of International application No. PCT/EP2009/005579, filed Jul. 31, 2009, which claims the benefit of U.S. Provisional Application No. 61/142,523, filed on Jan. 5, 2009, and also claims the benefit of U.S. Provisional Application No. 61/086,838, filed on Aug. 7, 2008, the entire contents of which are hereby incorporated by reference.

FIELD OF THE INVENTION

The present invention relates to the field of wireless handheld devices, and generally to wireless portable devices which require the transmission and reception of electromagnetic wave signals.

BACKGROUND

Wireless handheld or portable devices typically operate one or more cellular communication standards and/or wireless connectivity standards, each standard being allocated in one or more frequency bands, and said frequency bands being contained within one or more regions of the electromagnetic spectrum.

For that purpose, a space within the wireless handheld or portable device is usually dedicated to the integration of a radiating system. The radiating system is, however, expected to be small in order to occupy as little space as possible within the device, which then allows for smaller devices, or for the addition of more specific equipment and functionality into the device. At the same time, it is sometimes required for the radiating system to be flat since this allows for slim devices or in particular, for devices which have two parts that can be shifted or twisted against each other.

Many of the demands for wireless handheld or portable devices also translate to specific demands for the radiating systems thereof.

A typical wireless handheld device must include a radiating system capable of operating in one ore more frequency regions with good radioelectric performance (such as for example in terms of input impedance level, impedance bandwidth, gain, efficiency, or radiation pattern). Moreover, the integration of the radiating system within the wireless handheld device must be correct to ensure that the wireless device itself attains a good radioelectric performance (such as for example in terms of radiated power, received power, or sensitivity).

This is even more critical in the case in which the wireless handheld device is a multifunctional wireless device. Commonly-owned U.S. Pat. No. 8,738,103 and patent publication WO2008/009391 and describe a multifunctional wireless device. The entire disclosure of said patent publication numbers WO2008/009391 and U.S. Pat. No. 8,738,103 are hereby incorporated by reference.

For a good wireless connection, high gain and efficiency are further required. Other more common design demands for radiating systems are the voltage standing wave ratio (VSWR) and the impedance which is supposed to be about 50 ohms.

Other demands for radiating systems for wireless handheld or portable devices are low cost and a low specific absorption rate (SAR).

Furthermore, a radiating system has to be integrated into a device or in other words a wireless handheld or portable device has to be constructed such that an appropriate radiating system may be integrated therein which puts additional constraints by consideration of the mechanical fit, the electrical fit and the assembly fit.

Of further importance, usually, is the robustness of the radiating system which means that the radiating system does not change its properties upon smaller shocks to the device.

A radiating system for a wireless device typically includes a radiating structure comprising an antenna element which operates in combination with a ground plane layer providing a determined radioelectric performance in one or more frequency regions of the electromagnetic spectrum. This is illustrated in FIG. 28, in which it is shown a conventional radiating structure 2800 comprising an antenna element 2801 and a ground plane layer 2802. Typically, the antenna element has a dimension close to an integer multiple of a quarter of the wavelength at a frequency of operation of the radiating structure, so that the antenna element is at resonance at said frequency and a radiation mode is excited on said antenna element.

Although the radiating structure is usually very efficient at the resonance frequency of the antenna element and maintains a similar performance within a frequency range defined around said resonance frequency (or resonance frequencies), outside said frequency range the efficiency and other relevant antenna parameters deteriorate with an increasing distance to said resonance frequency.

Furthermore, the radiating structure operating at a resonance frequency of the antenna element is typically very sensitive to external effects (such as for instance the presence of plastic or dielectric covers that surround the wireless device), to components of the wireless device (such as for instance, but not limited to, a speaker, a microphone, a connector, a display, a shield can, a vibrating module, a battery, or an electronic module or subsystem) placed either in the vicinity of, or even underneath, the antenna element, and/or to the presence of the user of the wireless device.

Any of the above mentioned aspects may alter the current distribution and/or the electromagnetic field distribution of a radiation mode of the antenna element, which usually translates into detuning effects, degradation of the radioelectric performance of the radiating structure and/or the radioelectric performance wireless device, and/or greater interaction with the user (such as an increased level of SAR).

A further problem associated to the integration of the radiating structure, and in particular to the integration of the antenna element, in a wireless device is that the volume dedicated for such an integration has continuously shrunk with the appearance of new smaller and/or thinner form factors for wireless devices, and with the increasing convergence of different functionality in a same wireless device.

Some techniques to miniaturize and/or optimize the multiband behavior of an antenna element have been described in the prior art. However, the radiating structures therein described still rely on exciting a radiation mode on the antenna element.

For example, commonly-owned U.S. Pat. No. 7,554,490 describes a new family of antennas based on the geometry of space-filling curves. Also, commonly-owned U.S. Pat. No. 7,528,782 relates to a new family of antennas, referred to as multilevel antennas, formed by an electromagnetic grouping of similar geometrical elements. The entire disclosures of the aforesaid U.S. Pat. Nos. 7,554,490 and 7,528,782 are hereby incorporated by reference.

Some other attempts have focused on antenna elements not requiring a complex geometry while still providing some degree of miniaturization by using an antenna element that is not resonant in the one or more frequency ranges of operation of the wireless device.

For example, WO2007/128340 discloses a wireless portable device comprising a non-resonant antenna element for receiving broadcast signals (such as, for instance, DVB-H, DMB, T-DMB or FM). The wireless portable device further comprises a ground plane layer that is used in combination with said antenna element. Although the antenna element has a first resonance frequency above the frequency range of operation of the wireless device, the antenna element is still the main responsible for the radiation process and for the electromagnetic performance of the wireless device. This is clear from the fact that no radiation mode can be excited on the ground plane layer because the ground plane layer is electrically short at the frequencies of operation (i.e., its dimensions are much smaller than the wavelength).

With such limitations, while the performance of the wireless portable device may be sufficient for reception of electromagnetic wave signals (such as those of a broadcast service), the antenna element could not provide an adequate performance (for example, in terms of input return losses or gain) for a cellular communication standard requiring also the transmission of electromagnetic wave signals.

Commonly-owned patent publication WO2008/119699 and US2010/0109955 describe a wireless handheld or portable device comprising a radiating system capable of operating in two frequency regions. The radiating system comprises an antenna element having a resonance frequency outside said two frequency regions, and a ground plane layer. In this wireless device, while the ground plane layer contributes to enhance the electromagnetic performance of the radiating system in the two frequency regions of operation, it is still necessary to excite a radiation mode on the antenna element. In fact, the radiating system relies on the relationship between a resonance frequency of the antenna element and a resonance frequency of the ground plane layer in order for the radiating system to operate properly in said two frequency regions.

The entire disclosure of the aforesaid patent publication number WO2008/119699 and US2010/0109955 are hereby incorporated by reference.

Some further techniques to enhance the behavior of an antenna element relate to optimizing the geometry of a ground plane layer associated to said antenna element. For example, commonly-owned U.S. Pat. No. 7,688,276 describes a new family of ground plane layers based on the geometry of multilevel structures and/or space-filling curves. The entire disclosure of the aforesaid U.S. Pat. No. 7,688,276 is hereby incorporated by reference.

Another limitation of current wireless handheld or portable devices relates to the fact that the design and integration of an antenna element for a radiating structure in a wireless device is typically customized for each device. Different form factors or platforms, or a different distribution of the functional blocks of the device will force to redesign the antenna element and its integration inside the device almost from scratch.

For at least the above reasons, wireless device manufacturers regard the volume dedicated to the integration of the radiating structure, and in particular the antenna element, as being a toll to pay in order to provide wireless capabilities to the handheld or portable device.

SUMMARY

Therefore, a wireless device not requiring an antenna element would be advantageous as it would ease the integration of the radiating structure into the wireless handheld or portable device. The volume freed up by the absence of the antenna element would enable smaller and/or thinner devices, or even to adopt radically new form factors which are not feasible today due to the presence of an antenna element. Furthermore, by eliminating precisely the element that requires customization, a standard solution is obtained which only requires minor adjustments to be implemented in different wireless devices.

A wireless handheld or portable device that does not require of an antenna element, yet the wireless device featuring an adequate radioelectric performance would be an advantageous solution. This problem is solved by an antennaless wireless handheld or portable device according to the present invention.

It is an object of the present invention to provide a wireless handheld or portable device (such as for instance but not limited to a mobile phone, a smartphone, a PDA, an MP3 player, a headset, a USB dongle, a laptop computer, a gaming device, a digital camera, a PCMCIA or Cardbus 32 card, or generally a multifunction wireless device) which does not require an antenna element for the transmission and reception of electromagnetic wave signals. Such an antennaless wireless device is yet capable of operation in one or more frequency regions of the electromagnetic spectrum with enhanced radioelectric performance, increased robustness to external effects and neighboring components of the wireless device, and/or reduced interaction with the user.

Another object of the invention relates to a method to enable the operation of a wireless handheld or portable device in one or more frequency regions of the electromagnetic spectrum with enhanced radioelectric performance, increased robustness to external effects and neighboring components of the wireless device, and/or reduced interaction with the user, without requiring the use of an antenna element.

An antennaless wireless handheld or portable device according to the present invention operates one, two, three, four or more cellular communication standards (such as for example GSM 850, GSM 900, GSM 1800, GSM 1900, UMTS, HSDPA, CDMA, W-CDMA, LTE, CDMA2000, TD-SCDMA, etc.), wireless connectivity standards (such as for instance WiFi, IEEE802.11 standards, Bluetooth, ZigBee, UWB, WiMAX, WiBro, or other high-speed standards), and/or broadcasts standards (such as for instance FM, DAB, XDARS, SDARS, DVB-H, DMB, T-DMB, or other related digital or analog video and/or audio standards), each standard being allocated in one or more frequency bands, and said frequency bands being contained within one, two, three or more frequency regions of the electromagnetic spectrum.

In the context of this document, a frequency band preferably refers to a range of frequencies used by a particular cellular communication standard, a wireless connectivity standard or a broadcast standard; while a frequency region preferably refers to a continuum of frequencies of the electromagnetic spectrum. For example, the GSM 1800 standard is allocated in a frequency band from 1710 MHz to 1880 MHz while the GSM 1900 standard is allocated in a frequency band from 1850 MHz to 1990 MHz. A wireless device operating the GSM 1800 and the GSM 1900 standards must have a radiating system capable of operating in a frequency region from 1710 MHz to 1990 MHz.

The antennaless wireless handheld or portable device according to the present invention may have a candy-bar shape, which means that its configuration is given by a single body. It may also have a two-body configuration such as a clamshell, flip-type, swivel-type or slider structure. In some other cases, the device may have a configuration comprising three or more bodies. It may further or additionally have a twist configuration in which a body portion (e.g. with a screen) can be twisted (i.e., rotated around two or more axes of rotation which are preferably not parallel).

For a wireless handheld or portable device which is slim and/or whose configuration comprises two or more bodies, the requirements on maximum height of the antenna element are very stringent, as the maximum thickness of each of the two or more bodies of the device may be limited to 5, 6, 7, 8 or 9 mm. The technology disclosed herein makes it possible for a wireless handheld or portable device to feature an enhanced radioelectric performance without requiring an antenna element, thus solving the space constraint problems associated to such devices.

In the context of the present document a wireless handheld or portable device is considered to be slim if it has a thickness of less than 14 mm, 13 mm, 12 mm, 11 mm, 10 mm, 9 mm or 8 mm.

According to the present invention, an antennaless wireless handheld or portable device advantageously comprises at least five functional blocks: a user interface module, a processing module, a memory module, a communication module and a power management module. The user interface module comprises a display, such as a high resolution LCD, OLED or equivalent, and is an energy consuming module, most of the energy drain coming typically from the backlight use. The user interface module may also comprise a keypad and/or a touchscreen, and/or an embedded stylus pen. The processing module, that is a microprocessor or a CPU, and the associated memory module are also major sources of power consumption. The fourth module responsible of energy consumption is the communication module, an essential part of which is the radiating system. The power management module of the antennaless wireless handheld or portable device includes a source of energy (such as for instance, but not limited to, a battery or a fuel cell) and a power management circuit that manages the energy of the device.

In accordance with the present invention, the communication module of the antennaless wireless handheld or portable device includes a radiating system capable of transmitting and receiving electromagnetic wave signals in a first frequency region. Said radiating system comprises a radiating structure comprising at least one ground plane layer including a connection point, at least one radiation booster including a connection point and an internal port. The internal port is defined between the connection point of the at least one radiation booster and the connection point of the at least one ground plane layer. The radiating system further comprises a radiofrequency system, and an external port.

In some cases, the radiating system of an antennaless wireless handheld or portable device comprises a radiating structure consisting of at least one ground plane layer including a connection point, at least one radiation booster including a connection point and an internal port.

The radiofrequency system comprises a first port connected to the internal port of the radiating structure and a second port connected to the external port of the radiating system. Said radiofrequency system modifies the impedance of the radiating structure, providing impedance matching to the radiating system in the at least the first frequency region of operation of the radiating system.

In this text, a port of the radiating structure is referred to as an internal port; while a port of the radiating system is referred to as an external port. In this context, the terms “internal” and “external” when referring to a port are used simply to distinguish a port of the radiating structure from a port of the radiating system, and carry no implication as to whether a port is accessible from the outside or not.

An aspect of the present invention relates to the use of the ground plane layer of the radiating structure as an efficient radiator to provide an enhanced radioelectric performance in one or more frequency regions of operation of the wireless handheld or portable device, eliminating thus the need for an antenna element. A radiation mode of the ground plane layer can be advantageously excited when a dimension of said ground plane layer is on the order of, or even larger than, one half of the wavelength corresponding to a frequency of operation of the radiating system.

Therefore, in an antennaless wireless device according to the present invention, no other parts or elements of the wireless handheld or portable device have significant contribution to the radiation process.

In some embodiments, said radiation mode occurs at a frequency advantageously located above (i.e., at a frequency higher than) the first frequency region of operation of the wireless handheld or portable device. In some other embodiments, the frequency of said radiation mode is within said first frequency region.

A ground plane rectangle is defined as being the minimum-sized rectangle that encompasses a ground plane layer of the radiating structure. That is, the ground plane rectangle is a rectangle whose sides are tangent to at least one point of said ground plane layer.

In some cases, the ratio between a side of the ground plane rectangle, preferably a long side of the ground plane rectangle, and the free-space wavelength corresponding to the lowest frequency of the first frequency region is advantageously larger than a minimum ratio. Some possible minimum ratios are 0.1, 0.16, 0.2, 0.3, 0.4, 0.5, 0.6, 0.8, 1, 1.2 and 1.4. Said ratio may additionally be smaller than a maximum ratio (i.e., said ratio may be larger than a minimum ratio but smaller than a maximum ratio). Some possible maximum ratios are 0.4, 0.5, 0.6, 0.8, 1, 1.2, 1.4, 1.6, 2, 3, 4, 5, 6, 8 and 10.

Setting a dimension of the ground plane rectangle, preferably the dimension of its long side, relative to the wavelength within these ranges makes it possible for the ground plane layer to support an efficient radiation mode, in which the currents flowing on the ground plane layer are substantially aligned and contribute in phase to the radiation process.

The gain of a radiating structure depends on factors such as its directivity, its radiating efficiency and its input return loss. Both the radiating efficiency and the input return loss of the radiating structure are frequency dependent (even directivity is strictly frequency dependent). A radiating structure is usually very efficient around the frequency of a radiation mode excited in the ground plane layer and maintains a similar radioelectric performance within the frequency range defined by its impedance bandwidth around said frequency. Since the dimensions of the ground plane layer (or those of the ground plane rectangle) are comparable to, or larger than, the wavelength at the frequencies of operation of the wireless device, said radiation mode may be efficient over a broad range of frequencies.

In this text, the expression impedance bandwidth is to be interpreted as referring to a frequency region over which a wireless handheld or portable device and a radiating system comply with certain specifications, depending on the service for which the wireless device is adapted. For example, for a device adapted to transmit and receive signals of cellular communication standards, a radiating system having a relative impedance bandwidth of at least 5% (and more preferably not less than 8%, 10%, 15% or 20%) together with an efficiency of not less than 30% (advantageously not less than 40%, more advantageously not less than 50%) can be preferred. Also, an input return-loss of −3 dB or better within the corresponding frequency region can be preferred.

A wireless handheld or portable device generally comprises one, two, three or more multilayer printed circuit boards (PCBs) on which to carry the electronics. In a preferred embodiment of an antennaless wireless handheld or portable device, the ground plane layer of the radiating structure is at least partially, or completely, contained in at least one of the layers of a multilayer PCB.

In some cases, a wireless handheld or portable device may comprise two, three, four or more ground plane layers. For example a clamshell, flip-type, swivel-type or slider-type wireless device may advantageously comprise two PCBs, each including a ground plane layer.

The at least one radiation booster couples the electromagnetic energy from the radiofrequency system to the ground plane layer in transmission, and from the ground plane layer to the radiofrequency system in reception. Thereby the radiation booster boosts the radiation or reception of electromagnetic radiation.

In some examples, the at least one radiation booster has a maximum size smaller than 1/30, 1/40, 1/50, 1/60, 1/80, 1/100, 1/140 or even 1/180 times the free-space wavelength corresponding to the lowest frequency of the first frequency region of operation of the antennaless wireless handheld or portable device.

In the prior art in general an antenna element is said to be small (or miniature) when it can be fitted in a small space compared to a given operating wavelength. More precisely, a radiansphere is usually taken as the reference for classifying whether an antenna element is small. The radiansphere is an imaginary sphere having a radius equal to said operating wavelength divided by two times 7C. Therefore, a maximum size of the antenna element must necessarily be not larger than the diameter of said radiansphere (i.e., approximately equal to 1/3 of the free-space operating wavelength) in order to be considered small at said given operating wavelength.

As established theoretically by H. Wheeler and L. J. Chu in the mid 1940's, small antenna elements typically have a high quality factor (Q) which means that most of the power delivered to the antenna element is stored in the vicinity of the antenna element in the form of reactive energy rather than being radiated into space. In other words, an antenna element having a maximum size smaller than 1/3 of the free-space operating wavelength may be regarded as radiating poorly by a skilled-in-the-art person.

The at least one radiation booster for a radiating structure according to the present invention has a maximum size at least smaller than 1/30 of the free-space wavelength corresponding to the lowest frequency of the first frequency region of operation. That is, said radiation booster fits in an imaginary sphere having a diameter ten (10) times smaller than the diameter of a radiansphere at said same operating wavelength.

Setting the dimensions of the radiation booster to such small values is advantageous because the radiation booster substantially behaves as a non-radiating element for all the frequencies of the first frequency region, thus substantially reducing the loss of energy into free space due to undesired radiation effects of the radiation booster, and consequently enhancing the transfer of energy between the radiation booster and the ground plane layer. Therefore, the skilled-in-the-art person could not possibly regard the radiation booster as being an antenna element.

Said maximum size is preferably defined by the largest dimension of a booster box that completely encloses said radiation booster, and in which the radiation booster is inscribed.

More specifically, a booster box for a radiation booster is defined as being the minimum-sized parallelepiped of square or rectangular faces that completely encloses the radiation booster and wherein each one of the faces of said minimum-sized parallelepiped is tangent to at least a point of said radiation booster. Moreover, each possible pair of faces of said minimum-size parallelepiped sharing an edge forms an inner angle of 90°.

In some examples, one of the dimensions of a booster box can be substantially smaller than any of the other two dimensions, or even be close to zero. In such cases, said booster box collapses to a practically two-dimensional entity. The term dimension preferably refers to an edge between two faces of said parallelepiped.

Additionally, in some of these examples the at least one radiation booster has a maximum size larger than 1/1400, 1/700, 1/350, 1/250, 1/180, 1/140 or 1/120 times the free-space wavelength corresponding to the lowest frequency of said first frequency region. Therefore, in some examples the at least one radiation booster has a maximum size advantageously smaller than a first fraction of the free-space wavelength corresponding to the lowest frequency of the first frequency region but larger than a second fraction of said free-space wavelength.

Setting the dimensions of the radiation booster to be above some certain minimum value is advantageous to obtain a higher level of the real part of the input impedance of the radiating structure (measured at the internal port of the radiating structure when disconnected from the radiofrequency system) and hence enhance the transfer of energy between the radiation booster and the ground plane layer.

In some other cases, preferably in combination with the above feature of an upper bound for the maximum size of the radiation booster although not always required, to reduce even further the losses in the radiation booster due to residual radiation effects, the radiation booster is designed so that the radiating structure has a first resonance frequency (as measured at the internal port of said radiating structure when disconnected from the radiofrequency system) at a frequency much higher than the frequencies of the first frequency region of operation. In some examples, the radiation booster connected to said internal port has a dimension substantially close to a quarter of the wavelength corresponding to said first resonance frequency. In some examples, the ratio between the first resonance frequency of the radiating structure at its internal port when disconnected from the radiofrequency system and the highest frequency of said first frequency region is preferably larger than a certain minimum ratio. Some possible minimum ratios are 3.0, 3.4, 3.8, 4.0, 4.2, 4.4, 4.6, 4.8, 5.0, 5.2, 5.4, 5.6, 5.8, 6.0, 6.2, 6.6 or 7.0.

In the context of this document, a resonance frequency of the radiating structure preferably refers to a frequency at which the input impedance of said radiating structure (as measured at its internal port when disconnected from the radiofrequency system) has an imaginary part equal to zero.

With such a small radiation booster, and with the radiating structure including said radiation booster operating in a frequency range much lower than said first resonance frequency, the input impedance of the radiating structure (measured at its internal port when the radiofrequency system is disconnected) features an important reactive component (either capacitive or inductive) within the range of frequencies of the first frequency region of operation. That is, the input impedance of the radiating structure at said internal port when disconnected from the radiofrequency system has an imaginary part not equal to zero for any frequency of the first frequency region.

In some examples the radiation booster is substantially planar defining a two-dimensional structure, while in other cases the radiation booster is a three-dimensional structure that occupies a volume. In particular, in some examples, the smallest dimension of a booster box is not smaller than a 70%, an 80% or even a 90% of the largest dimension of said booster box, defining a volumetric geometry. Radiation boosters having a volumetric geometry may be advantageous to enhance the radioelectric performance of the radiating structure, particularly in those cases in which the maximum size of the radiation booster is very small relative to the free-space wavelength corresponding to the lowest frequency of the first frequency region.

Moreover, providing a radiation booster with a volumetric geometry can be advantageous to reduce the other two dimensions of its radiator box, leading to a very compact solution. Therefore, in some examples in which the radiation booster has a volumetric geometry, it is preferred to set a ratio between the first resonance frequency of the radiating structure at its internal port when disconnected from the radiofrequency system and the highest frequency of the first frequency region above 4.8, or even above 5.4.

In a preferred embodiment, the radiation booster comprises a conductive part. In some cases said conductive part may take the form of, for instance but not limited to, a conducting strip comprising one or more segments, a polygonal shape (including for instance triangles, squares, rectangles, hexagons, or even circles or ellipses as limit cases of polygons with a large number of edges), a polyhedral shape comprising a plurality of faces (including also cylinders or spheres as limit cases of polyhedrons with a large number of faces), or a combination thereof.

In some examples, the conductive part of a radiation booster may be a contacting means of a circuit component, such as for example a pin, a soldering ball, or a soldering pad of an integrated circuit package, or of a surface-mount technology (SMT) electronic component.

In some examples, the connection point of a radiation booster is advantageously located substantially close to an end, or to a corner, of said conductive part.

In some examples, the conductive part is connected to the ground plane layer, while in other examples said conductive part is not connected to the ground plane layer. Connecting the conductive part of the radiation booster to the ground plane layer lowers effectively the real part of the input impedance of the radiating structure at its internal port when disconnected from the radiofrequency system, controlling thus the energy transfer between the radiation booster and the ground plane layer.

In another preferred example, the radiation booster comprises a gap (i.e., absence of conducting material) defined in the ground plane layer. Said gap is delimited by one or more segments defining a curve. The connection point of the radiation booster is located at a first point along said curve. The connection point of the ground plane layer is located at a second point along said curve, said second point being different from said first point.

In an example, said gap intersects the perimeter of the ground plane layer. That is, the curve defined by the one or more segments delimiting said gap is open. In another example, said gap does not intersect the perimeter of the ground plane layer (i.e., the curve defined by the one or more segments delimiting said gap is closed).

In a preferred example of the present invention, a major portion of the at least one radiation booster (such as at least a 50%, or a 60%, or a 70%, or an 80% of the surface of said radiation booster) is placed on one or more planes substantially parallel to the ground plane layer. In the context of this document, two surfaces are considered to be substantially parallel if the smallest angle between a first line normal to one of the two surfaces and a second line normal to the other of the two surfaces is not larger than 30°, and preferably not larger than 20°, or even more preferably not larger than 10°.

In some examples, said one or more planes substantially parallel to the ground plane layer and containing a major portion of a radiation booster of the radiating structure are preferably at a height with respect to said ground plane layer not larger than a 2% of the free-space wavelength corresponding to the lowest frequency of the first frequency region of operation of the radiating system. In some cases, said height is smaller than 7 mm, preferably smaller than 5 mm, and more preferably smaller than 3 mm.

In some embodiments, the at least one radiation booster is substantially coplanar to the ground plane layer. Furthermore, in some cases the at least one radiation booster is advantageously embedded in the same PCB as the one containing the ground plane layer, which results in a radiating structure having a very low profile.

In a preferred example the radiating structure is arranged within the wireless handheld or portable device in such a manner that there is no ground plane in the orthogonal projection of a radiation booster onto the plane containing the ground plane layer. In some examples there is some overlapping between the projection of a radiation booster and the ground plane layer. In some embodiments less than a 10%, a 20%, a 30%, a 40%, a 50%, a 60% or even a 70% of the area of the projection of a radiation booster overlaps the ground plane layer. Yet in some other examples, the projection of a radiation booster onto the ground plane layer completely overlaps the ground plane layer.

In some cases it is advantageous to protrude at least a portion of the orthogonal projection of a radiation booster beyond the ground plane layer, or alternatively remove ground plane from at least a portion of the projection of a radiation booster, in order to adjust the levels of impedance and to enhance the impedance bandwidth of the radiating structure. This aspect is particularly suitable for those examples when the volume for the integration of the radiating structure has a small height, as it is the case in particular for slim wireless handheld or portable devices.

In some examples, a radiation booster is preferably located substantially close to an edge of the ground plane layer, preferably said edge being in common with a side of the ground plane rectangle. In some examples, a radiation booster is more preferably located substantially close to an end of said edge or to the middle point of said edge.

In some embodiments said edge is preferably an edge of a substantially rectangular or elongated ground plane layer.

In an example, the radiation booster is located preferably substantially close to a short edge of the ground plane rectangle, and more preferably substantially close to an end of said short edge or to the middle point of said short edge. Such a placement for the radiation booster with respect to the ground plane layer is particularly advantageous when the radiating structure features at its internal port, when the radiofrequency system is disconnected, an input impedance having a capacitive component for the frequencies of the first frequency region of operation.

In another example, the radiation booster is located preferably substantially close to a long edge of the ground plane rectangle, and more preferably substantially close to an end of said long edge or to the middle point of said long edge. Such a placement for the radiation booster is particularly advantageous when the radiating structure features at its internal port, when the radiofrequency system is disconnected, an input impedance having an inductive component for the frequencies of said first frequency region.

In some other examples, a radiation booster is advantageously located substantially close to a corner of the ground plane layer, preferably said corner being in common with a corner of the ground plane rectangle.

In the context of this document, two points are substantially close to each other if the distance between them is less than 5% (more preferably less than 3%, 2%, 1% or 0.5%) of the lowest frequency of operation of the radiating system. In the same way, two linear dimensions are substantially close to each other if they differ in less than 5% (more preferably less than 3%, 2%, 1% or 0.5%) of said lowest frequency of operation.

In some examples, the connection point of the ground plane layer is located advantageously close to the connection point of the radiation booster in order to facilitate the interconnection of the radiofrequency system with the radiating structure. Therefore, those locations specified above as being preferred for the placement of the radiation booster are also advantageous for the location of the connection point of the ground plane layer. Therefore, in some examples said connection point is located substantially close to an edge of the ground plane layer, preferably an edge in common with a side of the ground plane rectangle, or substantially close to a corner of the ground plane layer, preferably said corner being in common with a corner of the ground plane rectangle. Such an election of the position of the connection point of the ground plane layer may be advantageous to provide a longer path to the electrical currents flowing on the ground plane layer, lowering the frequency of the radiation mode of the ground plane layer.

In some embodiments, the radiofrequency system comprises a matching network that transforms the input impedance of the radiating structure, providing impedance matching to the radiating system in at least the first frequency region of operation of the radiating system.

Said matching network can comprise a single stage or a plurality of stages. In some examples, the matching network comprises at least two, at least three, at least four, at least five, at least six, at least seven, at least eight or more stages.

A stage comprises one or more circuit components (such as for example but not limited to inductors, capacitors, resistors, jumpers, short-circuits, switches, delay lines, resonators, or other reactive or resistive components). In some cases, a stage has a substantially inductive behavior in the first frequency region of operation of the radiating system, while another stage has a substantially capacitive behavior in said first frequency region, and yet a third one may have a substantially resistive behavior in said first frequency region.

A stage can be connected in series or in parallel to other stages and/or to at least one port of the radiofrequency system.

In some examples, the matching network alternates stages connected in series (i.e., cascaded) with stages connected in parallel (i.e., shunted), forming a ladder structure. In some cases, a matching network comprising two stages forms an L-shaped structure (i.e., series—parallel or parallel—series). In some other cases, a matching network comprising three stages forms either a pi-shaped structure (i.e., parallel—series—parallel) or a T-shaped structure (i.e., series—parallel—series).

In some examples, the matching network alternates stages having a substantially inductive behavior, with stages having a substantially capacitive behavior.

In an example, a stage may substantially behave as a resonant circuit (such as, for instance, a parallel LC resonant circuit or a series LC resonant circuit) in the first frequency region of operation of the radiating system. The use of stages having a resonant circuit behavior allows one part of the matching network be effectively connected to another part of said matching network for a given range of frequencies, and be effectively disabled for another range of frequencies.

In an example, the matching network comprises at least one active circuit component (such as for instance, but not limited to, a transistor, a diode, a MEMS device, a relay, or an amplifier) in at least one stage.

In some embodiments, the matching network preferably includes a reactance cancellation circuit comprising one or more stages, with one of said one or more stages being connected to the first port of the radiofrequency system.

In the context of this document, reactance cancellation preferably refers to compensating the imaginary part of the input impedance at the internal port of the radiating structure when disconnected from the radiofrequency system so that the input impedance of the radiating system at its external port has an imaginary part substantially close to zero for a frequency preferably within the first frequency region. In some less preferred examples, said frequency may also be higher than the highest frequency of the first frequency region (although preferably not higher than 1.1, 1.2, 1.3 or 1.4 times said highest frequency) or lower than the lowest frequency of the first frequency region (although preferably not lower than 0.9, 0.8 or 0.7 times said lowest frequency). Moreover, the imaginary part of an impedance is considered to be substantially close to zero if it is not larger (in absolute value) than 15 Ohms, and preferably not larger than 10 Ohms, and more preferably not larger than 5 Ohms.

In a preferred embodiment, the radiating structure features at its internal port when the radiofrequency system is disconnected an input impedance having a capacitive component for the frequencies of the first frequency region of operation. In that embodiment, the reactance cancellation circuit comprises a first stage having a substantially inductive behavior for all the frequencies of the first frequency region of operation of the radiating system. More preferably, said first stage comprises an inductor. In some cases, said inductor may be a lumped inductor. Said first stage is advantageously connected in series with the first port of the radiofrequency system, said first port being connected to the internal port of the radiating structure of a radiating system.

In another preferred embodiment, the radiating structure features at its internal port when the radiofrequency system is disconnected an input impedance having an inductive component for the frequencies of the first frequency region of operation. In that embodiment, the reactance cancellation circuit comprises a first stage and a second stage forming an L-shaped structure, with said first stage being connected in parallel and said second stage being connected in series. Each of the first and the second stage has a substantially capacitive behavior for all the frequencies of the first frequency region of operation of the radiating system. More preferably, said first stage and said second stage comprise each a capacitor. In some cases, said capacitor may be a lumped capacitor. Said first stage is advantageously connected in parallel with the first port of the radiofrequency system, while said second stage is connected to said first stage.

In some embodiments, the matching network may further comprise a broadband matching circuit, said broadband matching circuit being preferably connected in cascade to the reactance cancellation circuit. With a broadband matching circuit, the impedance bandwidth of the radiating structure may be advantageously increased. This may be particularly interesting for those cases in which the relative bandwidth of the first frequency region is large.

In a preferred embodiment, the broadband matching circuit comprises a stage that substantially behaves as a resonant circuit (preferably as a parallel LC resonant circuit or as a series LC resonant circuit) in the first frequency region of operation of the radiating system.

In some examples, the matching network may further comprise in addition to the reactance cancellation circuit and/or the broadband matching circuit, a fine tuning circuit (also called third tuning circuit) to correct small deviations of the input impedance of the radiating system with respect to some given target specifications.

In a preferred example, the reactance cancellation circuit is connected to the first port of the radiofrequency system (i.e., the port connected to the internal port of the radiating structure) and the fine tuning circuit is connected to the second port of the radiofrequency system (i.e., the port connected to the external port of the radiating system). In an example, then the broadband matching circuit is operationally connected in cascade between the reactance cancellation circuit and the fine tuning circuit. In another example, the matching network does not comprise a broadband matching circuit and the reactance cancellation circuit is connected in cascade directly to the fine tuning circuit.

In some examples, at least some circuit components in the stages of the matching network are discrete lumped components (such as for instance SMT components), while in some other examples all the circuit components of the matching network are discrete lumped components. In some examples, at least some circuit components in the stages of the matching network are distributed components (such as for instance a transmission line printed or embedded in a PCB containing the ground plane layer of the radiating structure), while in some other examples all the circuit components of the matching network are distributed components.

In some examples, at least some, or even all, circuit components in the stages of the matching network may be integrated into an integrated circuit, such as for instance a CMOS integrated circuit or a hybrid integrated circuit.

In some embodiments, the radiofrequency system may comprise a frequency selective element such as a diplexer or a bank of filters to separate the electrical signals of different frequencies.

In some embodiments, the radiofrequency system includes two, three, four or more matching networks and a switching matrix. The switching matrix allows selecting which one of the two or more matching networks is operationally connected to a port of the radiofrequency system. In these embodiments, the radiofrequency system further comprises a control circuit to select which matching network is selected at any given time, hence providing reconfiguration capabilities to the radiofrequency system.

In some preferred embodiments, the switching matrix is advantageously connected to the first port of the radiofrequency system (i.e., the port connected to internal port of the radiating structure).

Moreover, in a more preferred embodiment the radiofrequency system comprises a second switching matrix, said second switching matrix being connected to the second port of the radiofrequency system (i.e., the port connected to external port of the radiating system).

A radiating system comprising such a reconfigurable radiofrequency system may be advantageous to adapt the radiating system to different working environments, or to different modes of operation of the wireless device. It may also allow re-using a same radiating system for different frequency regions that are not used simultaneously. For example a same cellular communication standard may be allocated in different frequency regions of the electromagnetic spectrum depending on the geographical region. An antennaless wireless handheld or portable device may advantageously select the matching network optimized for instance to the frequency region corresponding to a European standard, to an American standard, or to an Asian standard depending on where the wireless device is being used at any given moment.

In some examples, one, two, three or even all the stages of the matching network may contribute to more than one functionality of said matching network. A given stage may for instance contribute to two or more of the following functionalities from the group comprising: reactance cancellation, impedance transformation (preferably, transformation of the real part of said impedance), broadband matching and fine tuning matching. In other words, a same stage of the matching network may advantageously belong to two or three of the following circuits: reactance cancellation circuit, broadband matching circuit and fine tuning circuit. Using a same stage of the matching network for several purposes may be advantageous in reducing the number of stages and/or circuit components required for the matching network of a radiofrequency system, reducing the real estate requirements on the PCB of the antennaless wireless handheld or portable device in which the radiating system is integrated.

In other examples, each stage of the matching network serves only to one functionality within the matching network. Such a choice may be preferred when low-end circuit components, having for instance a worse tolerance behavior, a more pronounced thermal dependence, and/or a lower quality factor, are used to implement said matching network.

In some examples, the radiating system is capable of operating in at least two, three, four, five or more frequency regions of the electromagnetic spectrum, said frequency regions allowing the allocation of two, three, four, five, six or more frequency bands used in one or more standards of cellular communications, wireless connectivity and/or broadcast services.

In some examples, a frequency region of operation (such as for example the first frequency region) of a radiating system is preferably one of the following: 824-960 MHz, 1710-2170 MHz, 2.4-2.5 GHz, 3.4-3.6 GHz, 4.9-5.875 GHz, or 3.1-10.6 GHz.

In some embodiments, the radiating structure comprises two, three, four or more radiation boosters, each of said radiation boosters including a connection point, and each of said connection points defining, together with a connection point of the ground plane layer, an internal port of the radiating structure. Therefore, in some embodiments the radiating structure comprises two, three, four or more radiation boosters, and correspondingly two, three, four or more internal ports. In such embodiments, the radiofrequency system comprises additional ports to be connected to some, or even all, internal ports of the radiating structure.

In some examples, a same connection point of the ground plane layer is used to define at least two, or even all, internal ports of the radiating structure.

In some examples, the radiating system comprises a second external port and the radiofrequency system comprises an additional port, said additional port being connected to said second external port. That is, the radiating system features two external ports.

In some embodiments the radiating structure comprises a plastic or dielectric carrier (such as for instance made of Poly Carbonate, Liquid Crystal Polymer, Poly Oxide Methylene, PC-ABS, or PVC) that provides mechanical support to the at least one radiation booster of said radiating structure. In other cases, the at least one radiation booster is affixed to a plastic cover of the wireless handheld or portable device.

In some embodiments a radiation booster may be advantageously arranged in an integrated circuit package (i.e., a package having a form factor for integrated circuit packages).

In some embodiments, said integrated circuit package advantageously comprises a semiconductor chip or die arranged inside the package. Moreover, the radiation booster is preferably arranged in the package but not in said semiconductor die or chip.

In some cases, the integrated circuit package has a form factor selected from the list comprising: single-in-line (SIL) package, dual-in-line (DIL) package, dual-in-line with surface mount technology (DIL-SMT) package, quad-flat-package (QFP) package, quad-flat-no-lead (QFN) package, pin grid array (PGA) package, ball grid array (BGA) package, plastic ball grid array (PBGA) package, ceramic ball grid array (CBGA) package, tape ball grid array (TBGA) package, super ball grid array (SBGA) package, micro ball grid array (μBGA) package, small outline package and leadframe package. Moreover, in some examples, any of these form factors may be used in its CSP (Chip Scale Package) version, wherein the semiconductor chip or die typically fills up to an 85% of the package area.

The integrated circuit package further comprises at least one terminal (such as for instance but not limited to a pad, a pin or a lead) or, more preferably, a plurality of terminals.

In some preferred examples, the contact point of the radiation booster is connected to a terminal of the integrated circuit package. Moreover, in these examples the radiofrequency system is at least in part not included in the integrated circuit package. Having at least a part of the radiofrequency system outside the integrated circuit package may offer to the user greater flexibility in the customization of the matching network and the selection of particular circuit components to obtain a desired radioelectric performance of the radiating system.

In some cases according to the present invention, a terminal of the integrated circuit package may constitute the conductive part of the radiation booster.

In some examples, the connection point of the ground plane layer of the radiating structure is connected to at least one terminal of the integrated circuit package. In these examples, the integrated circuit package includes at least part of the radiofrequency system. Having at least part of the radiofrequency system inside the integrated circuit may enable the use of for instance active circuit components, or have an adaptive matching network which can be reconfigured to different working environments and conditions. In these cases, the radiofrequency system may advantageously further comprise a control circuit, preferably included in the semiconductor chip or die, to configure such an adaptive matching network.

BRIEF DESCRIPTION OF THE DRAWINGS

Embodiments of the invention are shown in the enclosed figures. Herein shows:

(FIG. 1B) block diagram of an antennaless wireless handheld or portable device illustrating the basic functional blocks thereof.

(FIG. 4A) Partial perspective view; and (FIG. 4B) top plan view.

(FIG. 6A) Input impedance at the internal port of the radiating structure when disconnected from the radiofrequency system; (FIG. 6B) Input impedance after connection of the reactance cancellation circuit of the radiofrequency system to the internal port of the radiating structure; and (FIG. 6C) Input impedance at the external port of the radiating system after connection of the broadband matching circuit in cascade with the reactance cancellation circuit.

(FIG. 8A) Partial perspective view; and (FIG. 8B) top plan view.

(FIG. 10A) Input impedance at the internal port of the radiating structure when disconnected from the radiofrequency system; and (FIG. 10B) Input impedance at the external port of the radiating system.

(FIG. 12A) Partial perspective view; and (FIG. 12B) top plan view.

(FIG. 4A) Input impedance at the internal port of the radiating structure when disconnected from the radiofrequency system; (FIG. 14B) Input impedance after connection of the reactance cancellation circuit of the radiofrequency system to the internal port of the radiating structure; (FIG. 14C) Input impedance after connection of the broadband matching circuit in cascade with the reactance cancellation circuit; and (FIG. 14D) Input impedance at the external port of the radiating system after connection of the fine tuning circuit in cascade with the broadband matching circuit.

(FIG. 23B) Detailed view of the radiation booster.

DETAILED DESCRIPTION

Further characteristics and advantages of the invention will become apparent in view of the detailed description of some preferred embodiments which follows. Said detailed description of some preferred embodiments of the invention is given for purposes of illustration only and in no way is meant as a definition of the limits of the invention, made with reference to the accompanying figures.

Figure 1A:
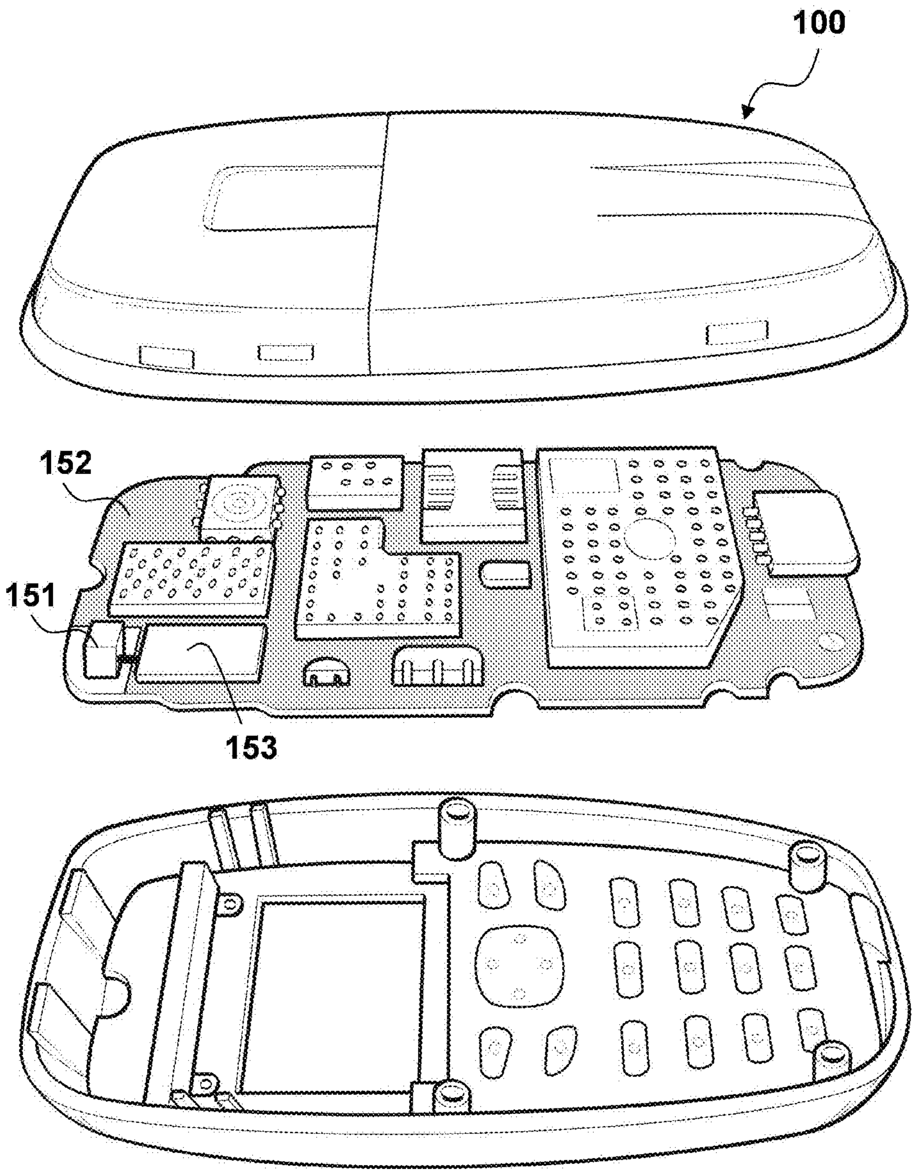
FIGS. 1A, 1B—(FIG. 1A) Example of an antennaless wireless handheld or portable device including a radiating system according to the present invention.
Figure 1B:
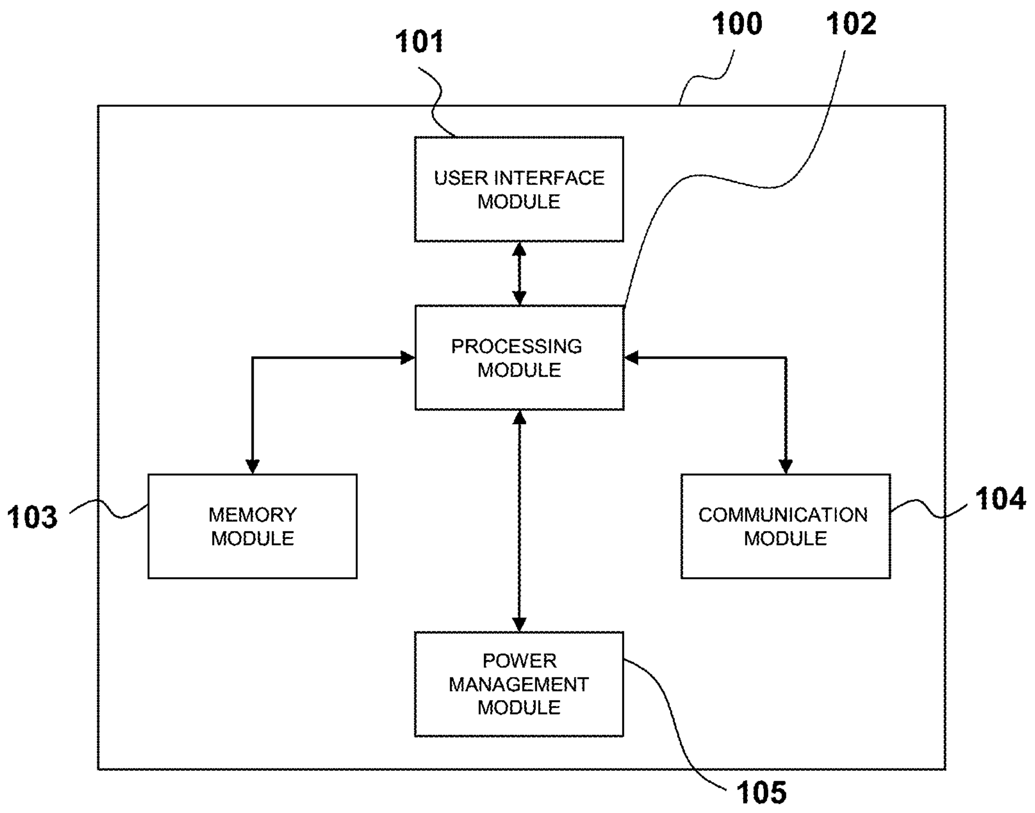

FIGS. 1A-1B show an illustrative example of an antennaless wireless handheld or portable device 100 according to the present invention. In FIG. 1A, there is shown an exploded perspective view of the antennaless wireless handheld or portable device 100 comprising a radiating structure that includes a radiation booster 151 and a ground plane layer 152 (which could be included in a layer of a multilayer PCB). The antennaless wireless handheld or portable device 100 also comprises a radiofrequency system 153, which is interconnected with said radiating structure.

Referring now to FIG. 1B, it is shown a block diagram of the antennaless wireless handheld or portable device 100 advantageously comprising, in accordance to the present invention, a user interface module 101, a processing module 102, a memory module 103, a communication module 104 and a power management module 105. In a preferred embodiment, the processing module 102 and the memory module 103 have herein been listed as separate modules. However, in another embodiment, the processing module 102 and the memory module 103 may be separate functionalities within a single module or a plurality of modules. In a further embodiment, two or more of the five functional blocks of the antennaless wireless handheld or portable device 100 may be separate functionalities within a single module or a plurality of modules.

Figure 2:
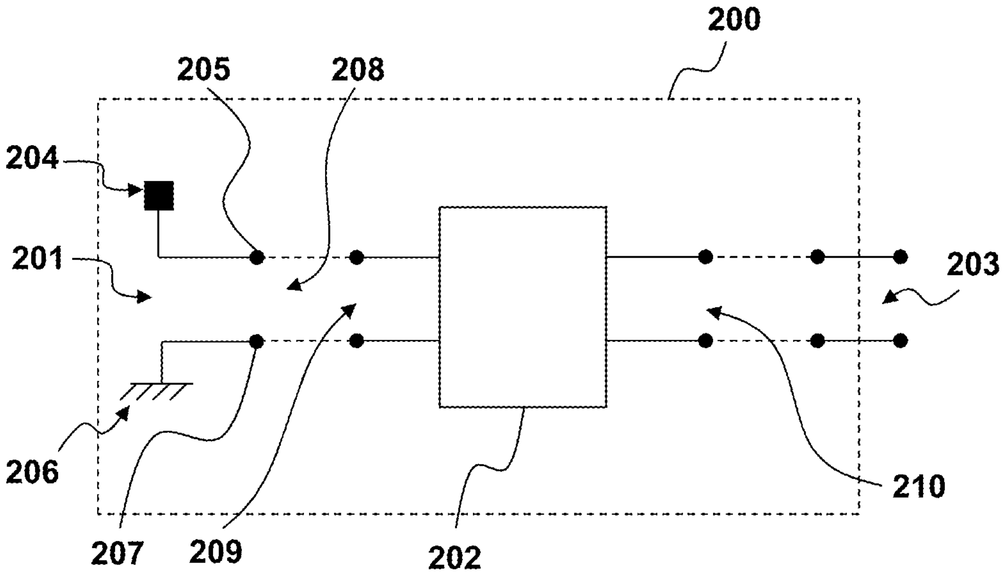
FIG. 2—Schematic representation of a radiating system according to the present invention.

In FIG. 2 it is depicted a radiating system 200 for an antennaless wireless handheld or portable device according to the present invention. The radiating system 200 comprises a radiating structure 201, a radiofrequency system 202, and an external port 203. The radiating structure 201 comprises a radiation booster 204, which includes a connection point 205, and a ground plane layer 206, said ground plane layer also including a connection point 207. The radiating structure 201 further comprises an internal port 208 defined between the connection point of the radiation booster 205 and the connection point of the ground plane layer 207. Furthermore, the radiofrequency system 202 comprises two ports: a first port 209 is connected to the internal port of the radiating structure 208, and a second port 210 is connected to the external port of the radiating system 203.

Figure 3A:
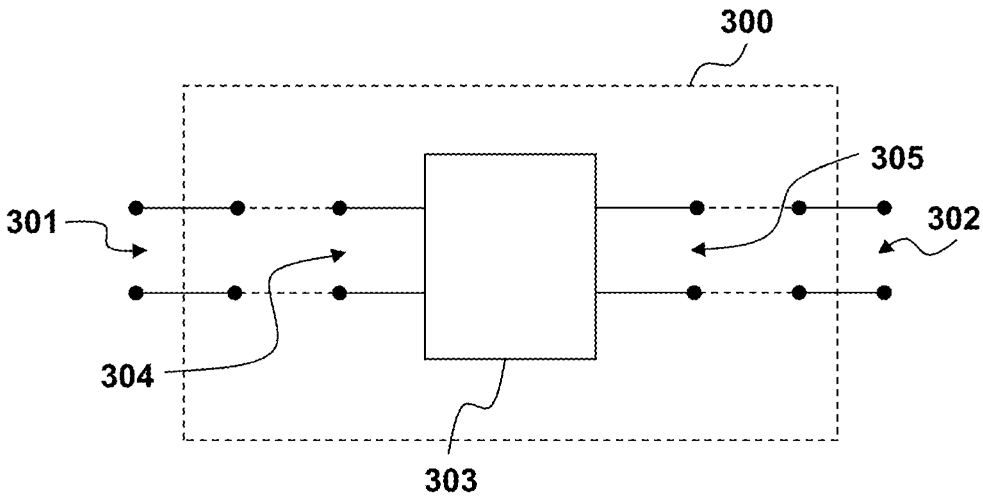
FIGS. 3A, 3B, 3C—Block diagrams of three examples of radiofrequency systems for a radiating system according to the present invention.
Figure 3B:
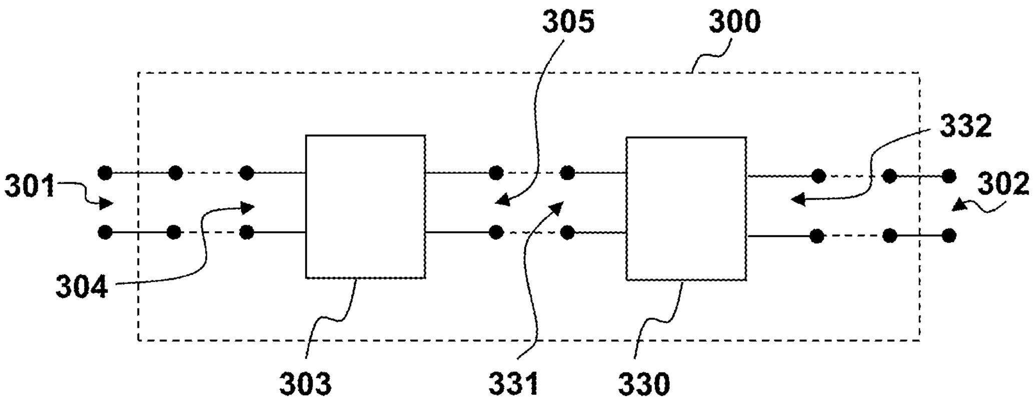
Figure 3C:
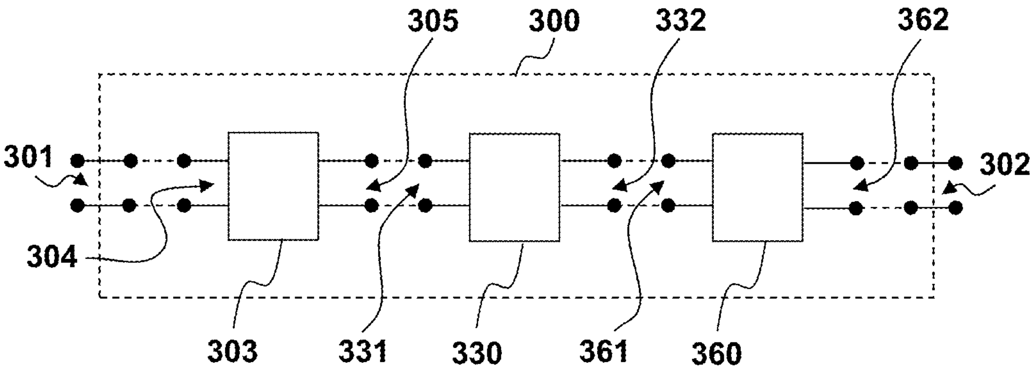

FIG. 3A-3C show the block diagrams of three preferred examples of a radio frequency system 300 comprising a first port 301 and a second port 302.

In particular, in FIG. 3A the radiofrequency system 300 includes matching network comprising a reactance cancellation circuit 303. In this example, a first port of the reactance cancellation circuit 304 may be operationally connected to the first port of the radiofrequency system 301 and another port of the reactance cancellation circuit 305 may be operationally connected to the second port of the radiofrequency system 302.

Referring now to FIG. 3B, the radiofrequency system 300 includes an alternative matching network comprising the reactance cancellation circuit 303 and a broadband matching circuit 330, which is advantageously connected in cascade with the reactance cancellation circuit 303. That is, a port of the broadband matching circuit 331 is connected to port 305. In this example, port 304 is operationally connected to the first port of the radiofrequency system 301, while another port of the broadband matching circuit 332 is operationally connected to the second port of the radiofrequency system 302.

FIG. 3C depicts a further example of the radiofrequency system 300 including yet another alternative matching network comprising, in addition to the reactance cancellation circuit 303 and the broadband matching circuit 330, a fine tuning circuit 360. Said three circuits are advantageously connected in cascade, with a port of the reactance cancellation circuit (in particular port 304) being connected to the first port of the radiofrequency system 301 and a port the fine tuning circuit 362 being connected to the second port of the radiofrequency system 302. In this example, the broadband matching circuit 330 is operationally interconnected between the reactance cancellation circuit 303 and the fine tuning circuit 360 (i.e., port 331 is connected to port 305 and port 332 is connected to port 361 of the fine tuning circuit 360).

Figure 4A:
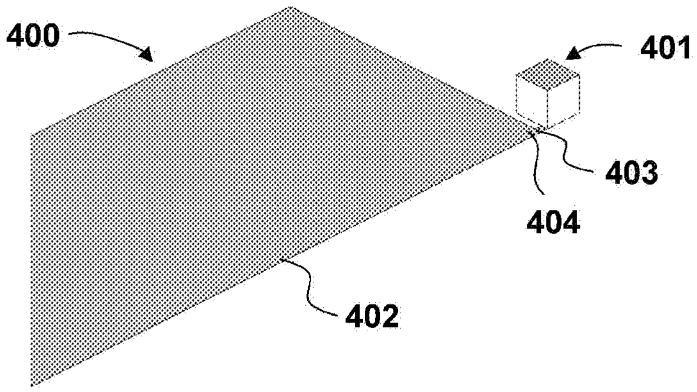
FIGS. 4A, 4B—Example of a radiating structure for a radiating system, the radiating structure including a radiation booster comprising a conductive part.
Figure 4B:
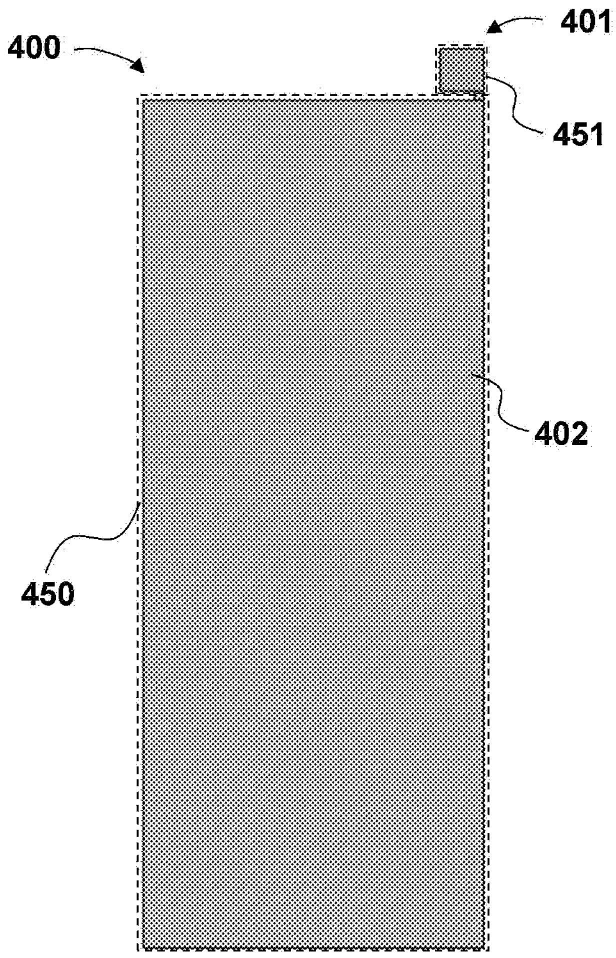

FIGS. 4A-4B show a preferred example of a radiating structure suitable for a radiating system operating in a first frequency region of the electromagnetic spectrum between 824 MHz and 960 MHz. An antennaless wireless handheld or portable device including such a radiating system may advantageously operate the GSM 850 and GSM 900 cellular communication standards (i.e., two different communication standards).

The radiating structure 400 comprises a radiation booster 401 and a ground plane layer 402. In FIG. 4B, there is shown in a top plan view the ground plane rectangle 450 associated to the ground plane layer 402. In this example, since the ground plane layer 402 has a substantially rectangular shape, its ground plane rectangle 450 is readily obtained as the rectangular perimeter of said ground plane layer 402.

The ground plane rectangle 450 has a long side of approximately 100 mm and a short side of approximately 40 mm. Therefore, in accordance with an aspect of the present invention, the ratio between the long side of the ground plane rectangle 450 and the free-space wavelength corresponding to the lowest frequency of the first frequency region (i.e., 824 MHz) is advantageously larger than 0.2. Moreover, said ratio is advantageously also smaller than 1.0.

In this example, the radiation booster 401 includes a conductive part featuring a polyhedral shape comprising six faces. Moreover, in this case said six faces are substantially square having an edge length of approximately 5 mm, which means that said conductive part is a cube. In this case, the conductive part of the radiation booster 401 is not connected to the ground plane layer 402. A booster box 451 for the radiation booster 401 coincides with the external area of said radiation booster 401. In FIG. 4B, it is shown a top plan view of the radiating structure 400, in which the top face of the booster box 451 can be observed.

In accordance with an aspect of the present invention, a maximum size of the radiation booster 401 (said maximum size being a largest edge of the booster box 451) is advantageously smaller than 1/50 times the free-space wavelength corresponding to the lowest frequency of the first frequency region of operation of the radiating structure 400. In particular, said maximum size is also advantageously larger than 1/180 times said free-space wavelength.

In FIGS. 4A-4B, the radiation booster 401 is arranged with respect to the ground plane layer so that the upper and bottom faces of the radiation booster 401 are substantially parallel to the ground plane layer 402. Moreover, said bottom face is advantageously coplanar to the ground plane layer 402. With such an arrangement, the height of the radiation booster 401 with respect to the ground plane layer is not larger than 2% of the free-space wavelength corresponding to the lowest frequency of the first frequency region.

In the radiating structure 400, the radiation booster 401 protrudes beyond the ground plane layer 402. That is, the radiation booster 401 is arranged with respect to the ground plane layer 402 in such a manner that there is no ground plane in the orthogonal projection of the radiation booster 401 onto the plane containing the ground plane layer 402. The radiation booster 401 is located substantially close to an edge of the ground plane layer 402, in particular to a short edge of the substantially rectangular ground plane layer 402 and, more precisely, the radiation booster 401 is located substantially close to a corner of said ground plane layer 402.

The radiation booster 401 comprises a connection point 403 located on the lower right corner of the bottom face of the radiation booster 401. In turn, the ground plane layer 402 also comprises a connection point 404 substantially on the upper right corner of the ground plane layer 402. An internal port of the radiating structure 400 is defined between connection point 403 and connection point 404.

The very small dimensions of the radiation booster 401 result in said radiating structure 400 having a first resonance frequency at a frequency much higher than the frequencies of the first frequency region. In this case, the ratio between the first resonance frequency of the radiating structure 400 measured at its internal port (in absence of a radiofrequency system connected to it) and the highest frequency of the first frequency region is advantageously larger than 4.2.

With such small dimensions of the radiation booster 401, the input impedance of the radiating structure 400 measured at the internal port features an important reactive component, and in particular a capacitive component, within the frequencies of the first frequency region.

Figure 6A:
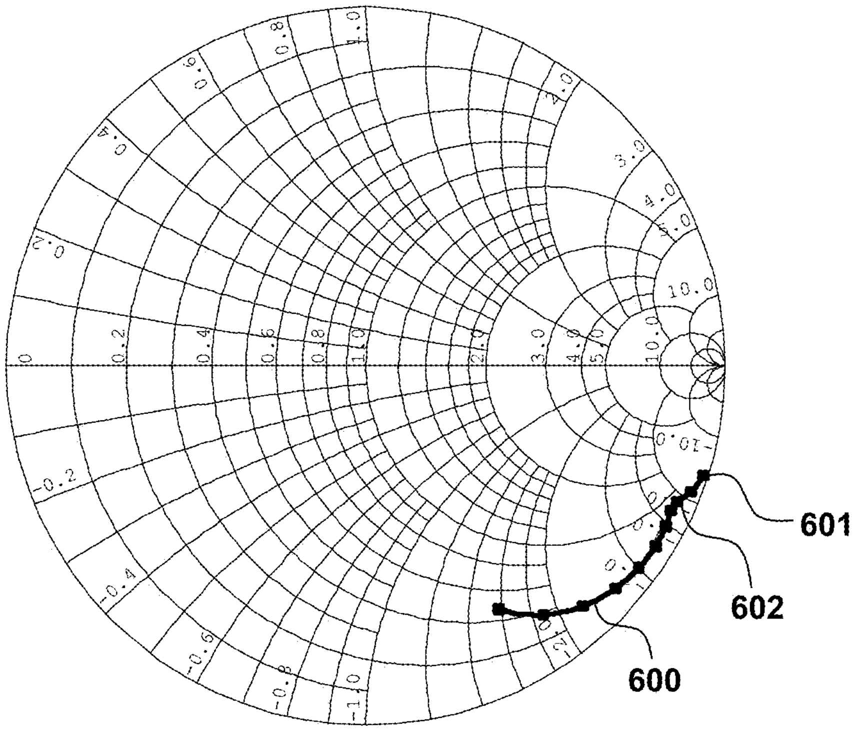
FIGS. 6A, 6B, 6C—Typical impedance transformation of the radiofrequency system of FIG. 5 on the input impedance of the radiating structure of FIGS. 4A and 4B.

This can be observed in FIG. 6A, in which curve 600 represents on a Smith chart the typical complex impedance of the antenna structure 400 as a function of the frequency when no radiofrequency system is connected to its internal port. In particular, point 601 corresponds to the input impedance at the lowest frequency of the first frequency region, and point 602 corresponds to the input impedance at the highest frequency of the first frequency region.

Curve 600 is located on the lower half of the Smith chart, which indeed indicates that said input impedance has a capacitive component (i.e., the imaginary part of the input impedance has a negative value) for all frequencies of the first frequency range (i.e., between point 601 and point 602).

Figure 5:
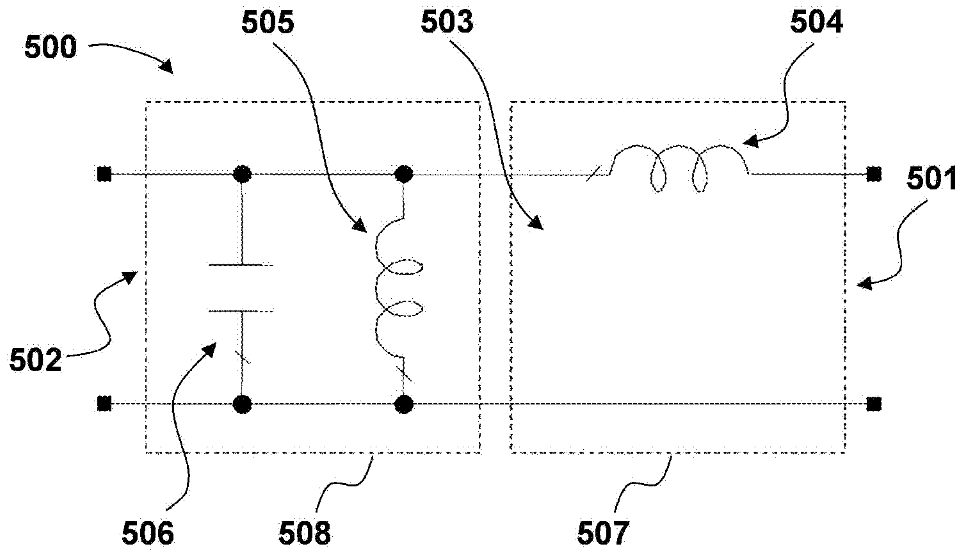
FIG. 5—Schematic representation of a radiofrequency system for a radiating system whose radiating structure is shown in FIGS. 4A and 4B.

FIG. 5 is a schematic representation of a radiofrequency system suitable for interconnection with the radiating structure of FIGS. 4A-4B to provide impedance matching to the resulting radiating system in the first frequency region of operation.

A radiofrequency system 500 comprises a first port 501 to be connected to the internal port of the radiating structure 400, and a second port 502 to be connected to the external port of the radiating system. In this example, the radiofrequency system 500 further comprises a matching network including a reactance cancellation circuit 507 and a broadband matching circuit 508.

The reactance cancellation circuit 507 includes one stage comprising one single circuit component 504 arranged in series and featuring a substantially inductive behavior in the first frequency region. In this particular example, the circuit component 504 is a lumped inductor. The inductive behavior of the reactance cancellation circuit 507 advantageously compensates the capacitive component of the input impedance of the radiating structure 400.

Figure 6B:
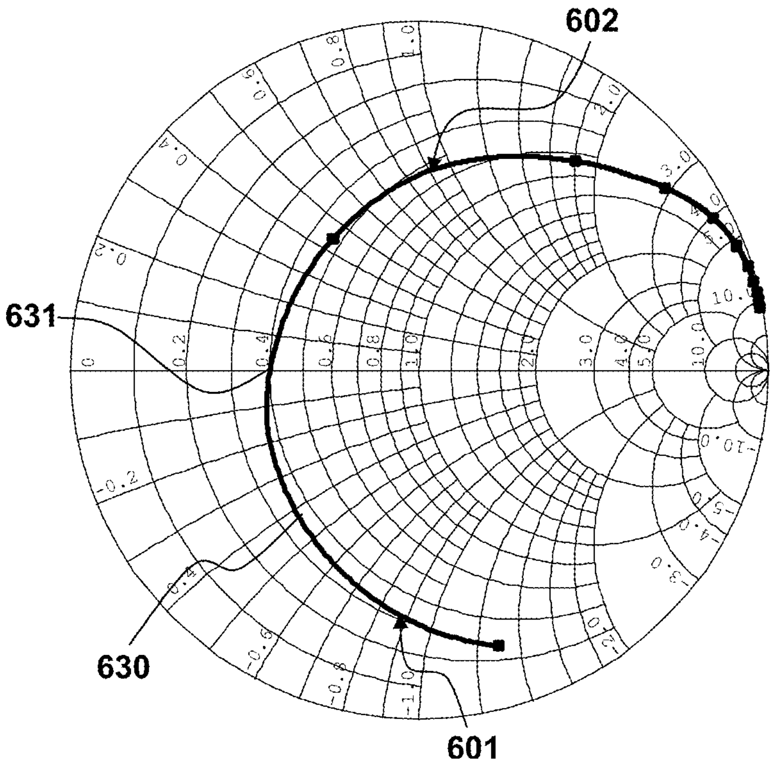
Figure 6C:
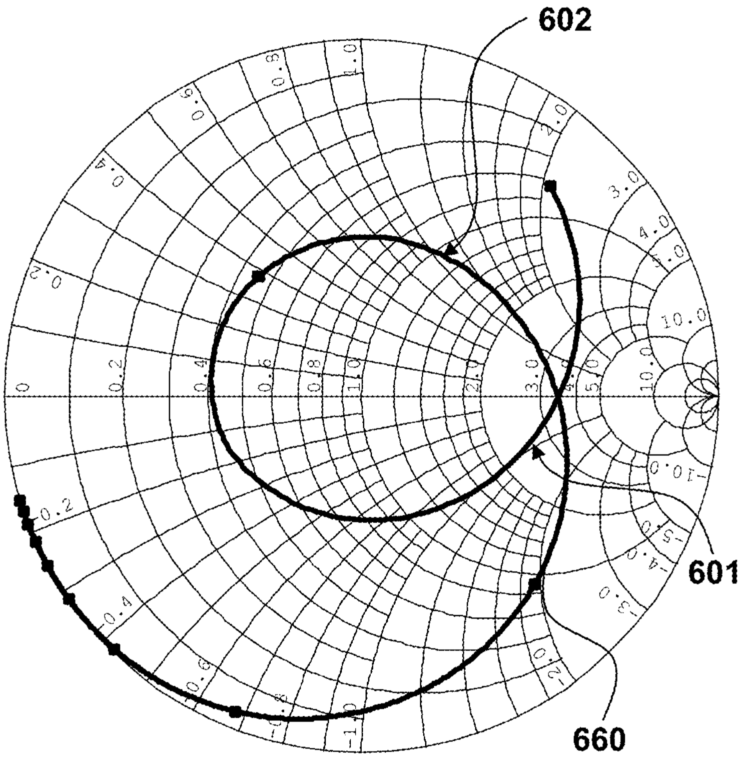

Such an effect can be observed in FIGS. 6A-6C, in which the input impedance of the radiating structure 400 (curve 600 in FIG. 6A) is transformed by the reactance cancellation circuit into an impedance having an imaginary part substantially close to zero in the first frequency region (see FIG. 6B). Curve 630 in FIG. 6B corresponds to the input impedance that would be observed at the second port of the radiofrequency system 502 if the broadband matching circuit 508 were removed and said second port 502 were directly connected to a port 503. Said curve 630 crosses the horizontal axis of the Smith Chart at a point 631 located between point 601 and point 602, which means that the input impedance has an imaginary part equal to zero for a frequency advantageously between the lowest and highest frequencies of the first frequency region.

The broadband matching circuit 508 includes also one stage and is connected in cascade with the reactance cancellation circuit 507. Said stage of the broadband matching circuit 508 comprises two circuit components: a first circuit component 505 is a lumped inductor and a second circuit component 506 is a lumped capacitor. Together, the circuit components 505 and 506 form a parallel LC resonant circuit (i.e., said stage of the broadband matching circuit 508 behaves substantially as a resonant circuit in the first frequency region of operation).

Comparing FIGS. 6B and 6C, it is noticed that the broadband matching circuit 508 has the beneficial effect of "closing in" the ends of curve 630 (i.e., transforming the curve 630 into another curve 660 featuring a compact loop around the center of the Smith chart). Thus, the resulting curve 660 exhibits an input impedance (now, measured at the second port 502, or equivalently at the external port of the radiating system) within a voltage standing wave ratio (VSWR) 3:1 referred to a reference impedance of 50 Ohms over a broader range of frequencies.

Figure 7:
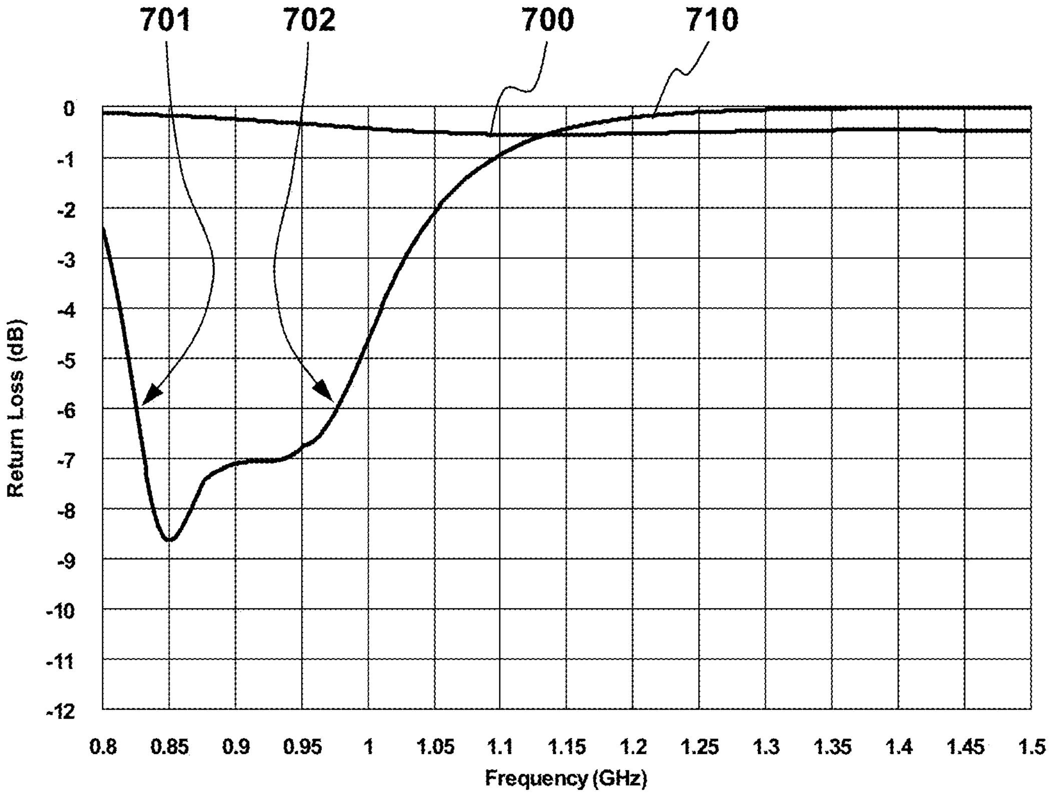
FIG. 7—Typical input return losses at the internal port of the radiating structure of FIGS. 4A-4B compared with those at the external port of a radiating system obtained after interconnecting the radiating structure of FIGS. 4A-4B with the radiofrequency system of FIG. 5.

Alternatively, the effect of the radiofrequency system of FIG. 5 on the radiating structure of FIGS. 4A-4B can be compared in terms of the input return loss. In FIG. 7 curve 700 (in dash-dotted line) presents the typical input return loss of the radiating structure 400 observed at its internal port when the radiofrequency system 500 is not connected to said internal port. From said curve 700 it is clear that the radiating structure 400 is not matched in the first frequency range and that the radiation booster 401 is non-resonant in said first frequency range. On the other hand, curve 710 (in solid line) corresponds to the input return losses at the external port of the radiating system resulting from the interconnection of the radiofrequency system 500 with the radiating structure 400. The radiofrequency system transforms the input impedance of the radiating structure 400, providing impedance matching in the first frequency region. Curve 710 shows how the radiating system exhibits return losses better than −6 dB in the first frequency region (delimited by points 701 and 702 on the curve 710), making it possible for the radiating system to provide operability for the GSM850 and the GSM900 standards.

Figure 8A:
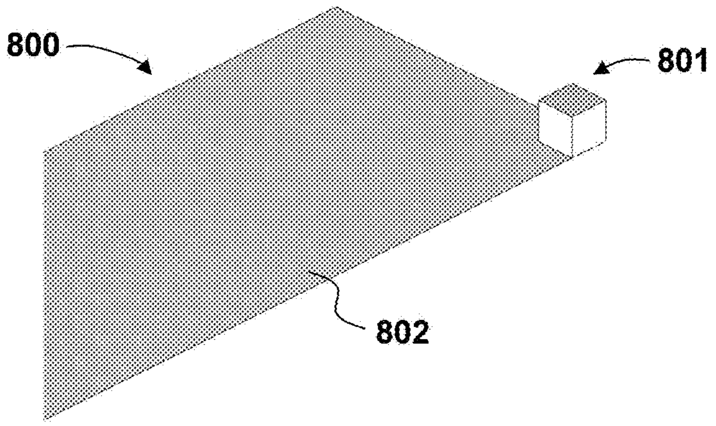
FIGS. 8A, 8B—Another example of a radiating structure including a radiation booster comprising a conductive part.
Figure 8B:
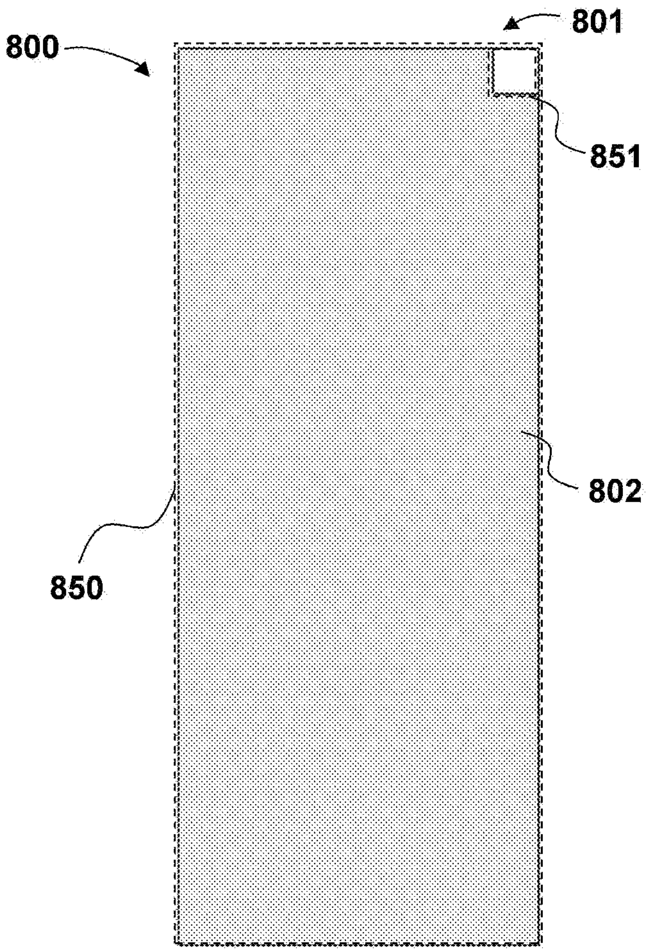

Another preferred embodiment of a radiating structure according to the present invention is disclosed in FIGS. 8A-8B, in which a radiating structure 800 comprises a radiation booster 801 and a ground plane layer 802. The radiating structure 800 is to be used in a radiating system capable of operating the GSM 900 cellular communication standard (i.e., the first frequency region extends from 880 MHz to 960 MHz).

The radiating structure 800 is very similar to the radiating structure 400 already discussed in connection with FIGS. 4A-4B. For example, the dimensions of the ground plane layer 802, and the shape and dimensions of the radiation booster 801, are the same as those of their respective counterparts in the radiating structure 400. Moreover, a ground plane rectangle 850 associated to the ground plane layer 802 and a booster box 851 associated to the radiation booster 801 are defined in the same way as it was done for the example in FIGS. 4A-4B.

However, the placement of the radiation booster 801 with respect to the ground plane layer 802 is different from what it was shown in FIGS. 4A-4B. While in the radiating structure 400, the radiation booster 401 protrudes beyond the ground plane layer 402; in the radiating structure 800, the projection of the radiation booster 801 onto the plane containing the ground plane layer 802 overlaps completely the ground plane layer 802. This can be observed in the top plan view of the radiating structure 800 in FIG. 8B, in which the projection of the booster box 851 onto the plane of the ground plane layer 802 is inside the ground plane rectangle 851.

Despite the radiation booster 801 being located above the ground plane layer 802, said radiation booster 801 is not connected to said ground plane layer 802. An internal port of the radiating structure 800 is defined between a connection point of the radiation booster 801 and a connection point of the ground plane layer 802.

Figure 9:
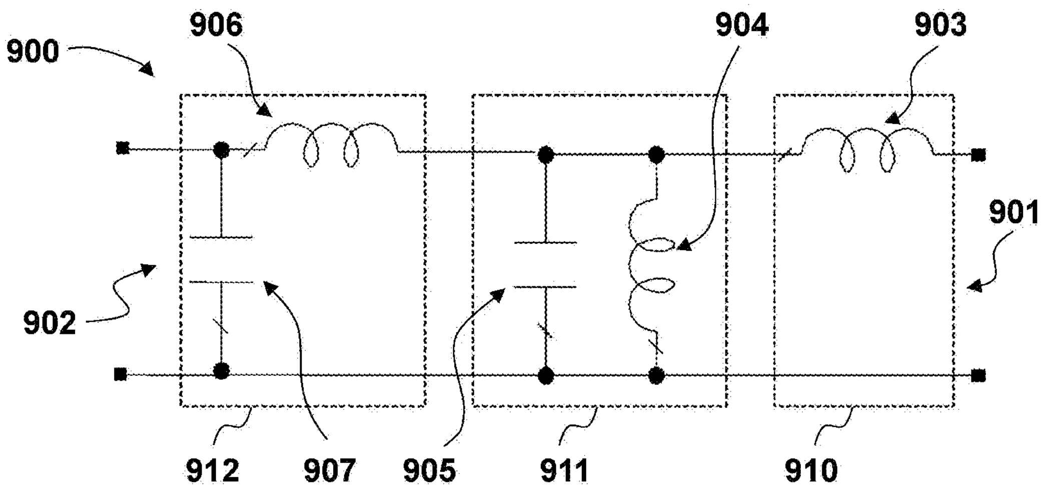
FIG. 9—Schematic representation of a radiofrequency system for a radiating system whose radiating structure is shown in FIGS. 8A-8B.

Referring now to FIG. 9, it is depicted a schematic representation of a radiofrequency system 900 suitable for interconnection with the radiating structure 800. The radiofrequency system 900 includes a matching network, a first port 901 (to be connected to the internal port of the radiating structure 800), and a second port 902 (for connection with the external port of a resulting radiating system). The matching network comprises a reactance cancellation circuit 910 and a broadband matching circuit 911, as in the example shown in FIG. 5, but also a fine tuning circuit 912.

The reactance cancellation circuit 910 is connected to the first port 901 and the fine tuning circuit 912 is connected to the second port 902. The broadband matching circuit 911 is operationally connected between the reactance cancellation circuit 910 and the fine tuning circuit 912, so that said three circuits are connected in cascade.

Figure 10A:
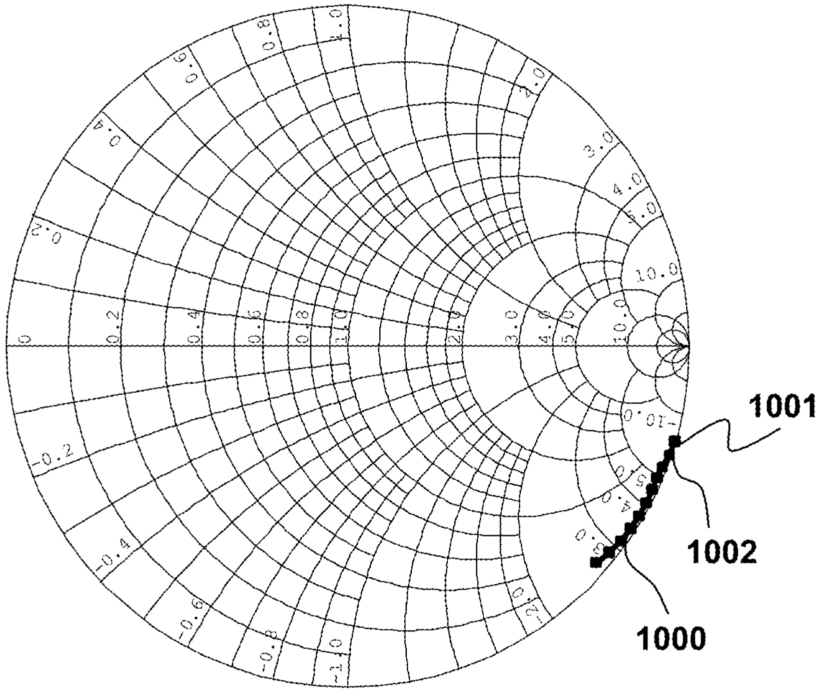
FIGS. 10A, 10B—Typical impedance transformation of the radiofrequency system of FIG. 9 on the input impedance of the radiating structure of FIGS. 8A-8B.

The input impedance of the radiating structure 800 measured at its internal port (in absence of the radiofrequency system 900) has an imaginary part featuring an important capacitive component. In FIG. 10A said input impedance is represented by curve 1000, which is clearly located in the lower half portion of the Smith chart for all frequencies of the first frequency region (represented by the interval between point 1001 and point 1002 of the curve 1000). Therefore the reactance cancellation circuit 910 comprises a circuit element 903 having a substantially inductive behavior (in particular being a lumped inductor).

The broadband matching circuit 911 is similar to the one used for the radiofrequency system 500, and includes one stage substantially behaving as an LC parallel resonant circuit comprising an inductor 904 and a capacitor 905 connected in parallel.

The fine tuning circuit 912 adds two more stages to the matching network of the radiofrequency system 900. Said two stages form an L-shaped structure having a series inductor 906 and a parallel capacitor 907. In this particular example, the fine tuning circuit 912 provides an additional transformation of the impedance, necessary to attain the required level of impedance matching in the first frequency region.

Figure 10B:
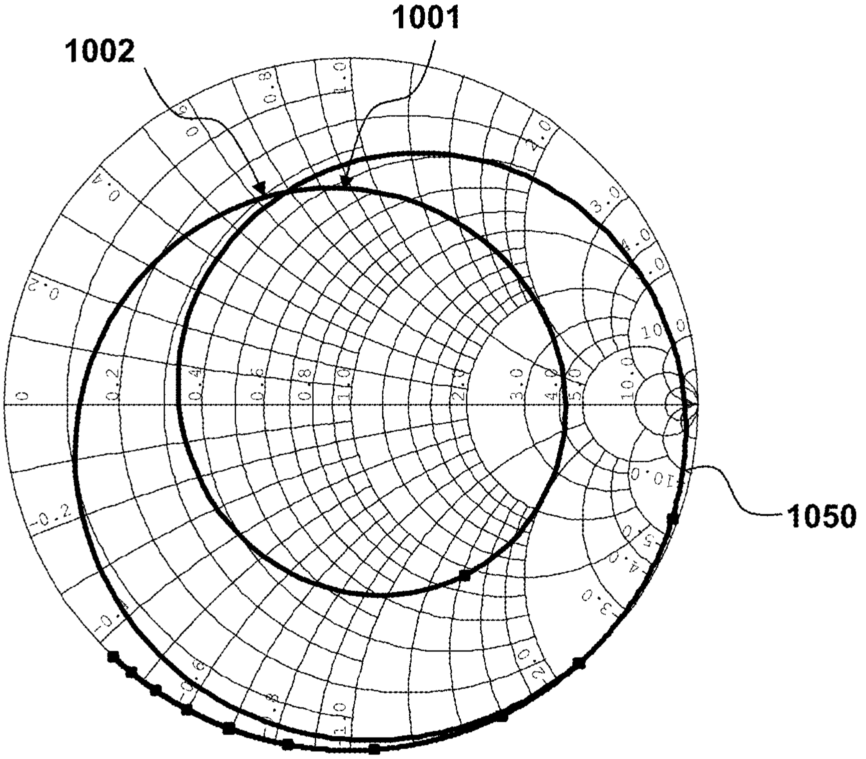

FIG. 10B shows the effect of the radiofrequency system 900 on the input impedance of the radiating structure 800, in which curve 1050 correspond to the input impedance observed at an external port of the radiating system obtained from the interconnection of radiating structure 800 and radiofrequency system 900. Thanks to the contributions of the reactance cancellation circuit 910, the broadband matching circuit 911 and the fine tuning circuit 912, the curve 1000 transforms into the curve 1050 which features a loop around the center of the Smith chart.

Figure 11:
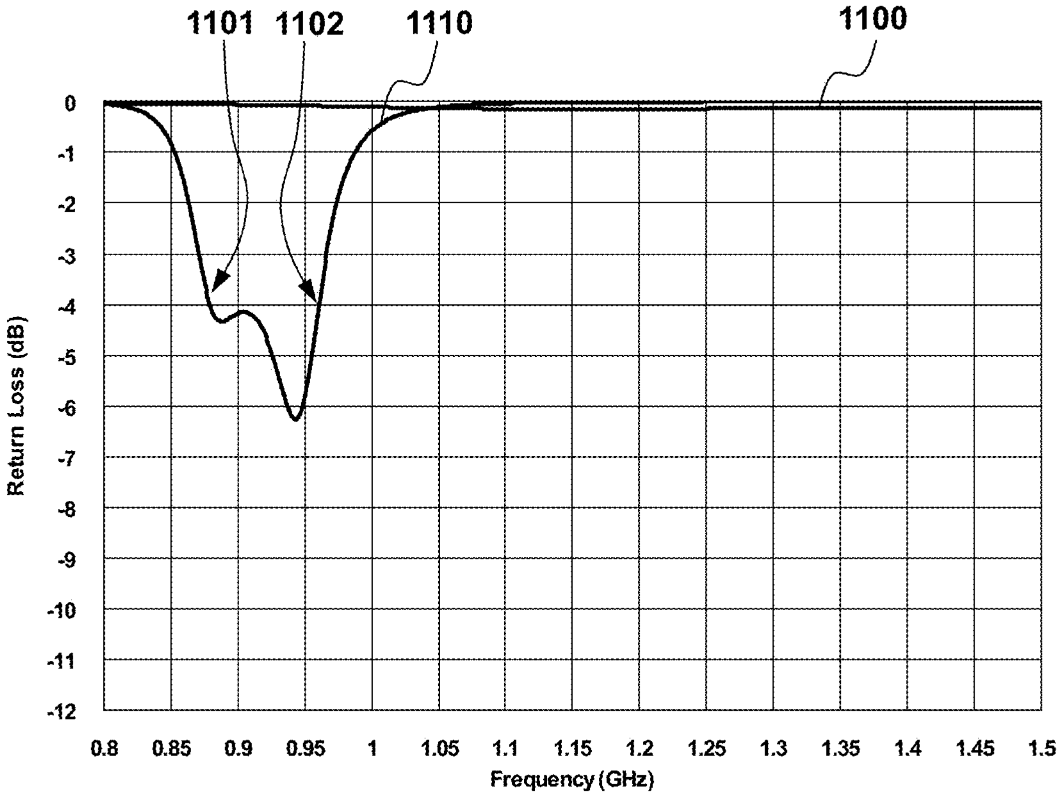
FIG. 11—Typical input return losses at the internal port of the radiating structure of FIGS. 8A and 8B compared with those at the external port of a radiating system obtained after interconnecting the radiating structure of FIGS. 8A and 8B with the radiofrequency system of FIG. 9.

The same typical results are shown in FIG. 11 in terms of input return losses. The radiofrequency system 900 transforms curve 1100 (in dash-dotted line), corresponding to the input return loss of the radiating structure 800 observed at its internal port when the radiofrequency system 900 is not connected to said internal port, into curve 1110 (in solid line), corresponding to the input return losses at the external port of the radiating system resulting from the interconnection of said radiofrequency system 900 with the radiating structure 800. Said curve 1110 feature a return loss better than −4 dB for all frequencies of the first frequency region (delimited by points 1101 and 1102 on the curve 1110).

Figure 12A:
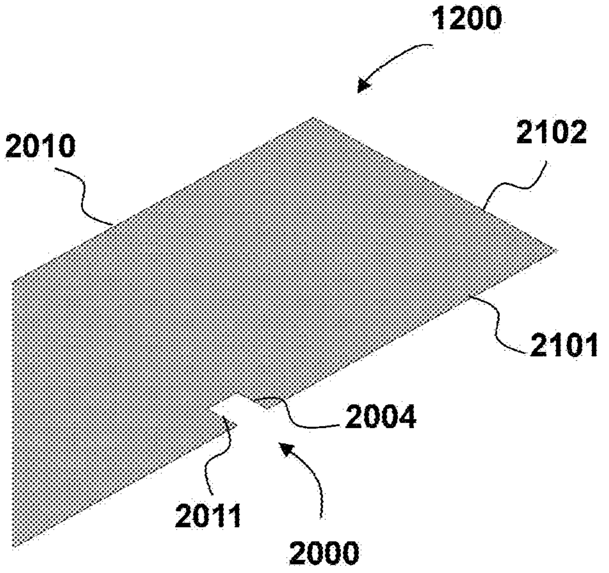
FIGS. 12A, 12B—Example of a radiating structure for a radiating system, the radiating structure including a radiation booster comprising a gap.
Figure 12B:
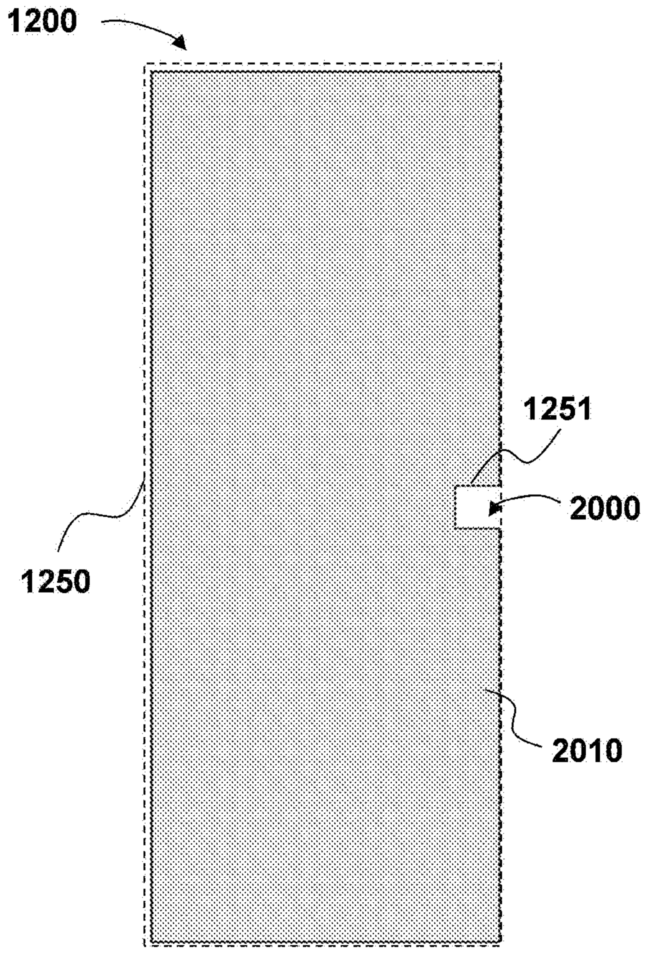

FIGS. 12A-12B show another preferred example of a radiating structure suitable for a radiating system operating in a first frequency region of the electromagnetic spectrum between 923 MHz and 969 MHz.

The radiating structure 1200 comprises a radiation booster 2000 and a ground plane layer 2010, having a substantially rectangular shape. In FIG. 12B, it is shown the ground plane rectangle 1250 associated to the ground plane layer 2010, which in this example corresponds to the rectangular perimeter of said ground plane layer 2010. The ground plane rectangle 1250 has a long side and a short side and, in accordance with the present invention, the ratio between said long side and the free-space wavelength corresponding to the lowest frequency of the first frequency region is advantageously larger than 0.16. Moreover, said ratio is advantageously also smaller than 1.2.

In this example, the radiation booster 2000 comprises a gap defined in the ground plane layer 2010. A closer view of said radiation booster 2000 is provided in FIG. 20A. Said gap of the radiation booster 2000 has a polygonal shape delimited by a plurality of segments (segments 2001, 2002 and 2003) defining a curve. A connection point of the radiation booster 2004 is located at a first point along said curve (in particular a point on segment 2003), while a connection point of the ground plane layer 2011 is located at a second point along said curve (in particular a point on segment 2001). In some examples, according to the present invention, as in this particular example, the connection point of the radiation booster 2004 and the connection point of the ground plane layer 2011 are located on two segments that are at opposite sides of the gap of the radiation booster 2000. An internal port of the radiating structure 1200 is consequently defined between the connection point of the radiation booster 2004 and the connection point of the ground plane layer 2011.

In this example said gap intersects the perimeter of the ground plane layer, which means that the curve delimiting said gap is open. As it can be seen in FIG. 20A segments 2001 and 2003 intersect the perimeter of the ground plane layer 2010.

The use of the radiation booster 2000 in the radiation structure 1200 results in a advantageously planar solution, simplifying its integration in a wireless handheld or portable device. In this example, a booster box 1251 for the radiation booster 2000 is substantially planar (i.e., one of its dimensions is substantially close to zero). Furthermore, since the gap of the radiation booster 2000 has a substantially square shape, the booster box 1251 contains the segments 2001, 2002 and 2003.

In accordance with an aspect of the present invention, a maximum size of the radiation booster 2000 (said maximum size being a largest edge of the booster box 1251) is advantageously smaller than 1/40 times the free-space wavelength corresponding to the lowest frequency of the first frequency region of operation of radiating structure 1200. Additionally, in this example said maximum size is also advantageously larger than 1/250 times said free-space wavelength.

With such small dimensions of the radiation booster 2000, the radiating structure 1200 features a first resonance frequency at a frequency much higher than the frequencies of the first frequency region and, in consequence, the input impedance of the radiating structure 1200 measured at its internal port (in absence of a radiofrequency system connected to it) has an important reactive component, in particular an inductive component, within the frequencies of said first frequency region. In this case, the ratio between the first resonance frequency of the radiating structure 1200 measured at its internal port (in absence of a radiofrequency system connected to it) and the highest frequency of the first frequency region is advantageously larger than 5.0.

In the radiating structure 1200, the radiation booster 2000 is located with respect to the ground plane layer 2010 in such a manner that the gap of the radiation booster 2000 intersects an edge of the ground plane layer 2010, in particular a long edge of a substantially rectangular ground plane layer 2010. More precisely, the radiation booster 2000 is located substantially close to the middle point of said long edge.

Figure 13:
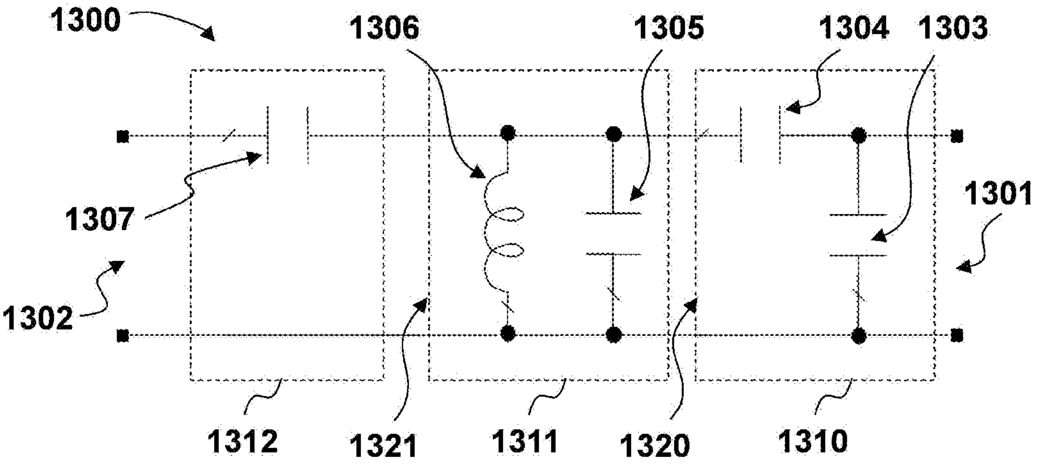
FIG. 13—Schematic representation of a radiofrequency system for a radiating system whose radiating structure is shown in FIGS. 12A-12B.

FIG. 13 depicts a schematic representation of a radiofrequency system 1300 suitable for interconnection with the radiating structure 1200. The radiofrequency system 1300 includes a matching network, a first port 1301 (to be connected to the internal port of the radiating structure 1200), and a second port 1302 (for connection with the external port of a resulting radiating system). In this example, the matching network comprises a reactance cancellation circuit 1310, a broadband matching circuit 1311, and a fine tuning circuit 1312 connected in cascade.

Figure 14A:
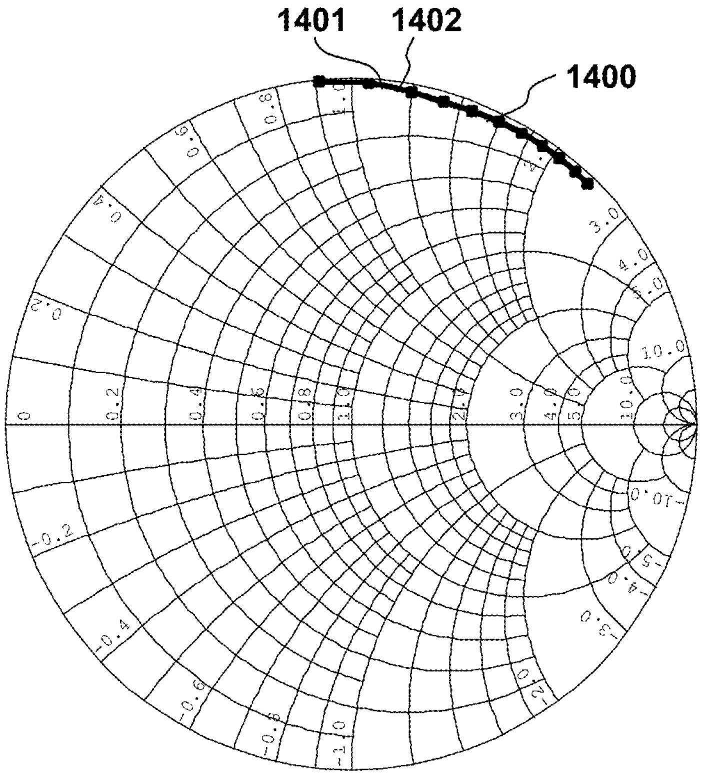
FIG. 14A-14D—Typical impedance transformation of the radiofrequency system of FIG. 13 on the input impedance of the radiating structure of FIGS. 12A-12B.

The input impedance of the radiating structure 1200 measured at its internal port (in absence of the radiofrequency system 1300) has an imaginary part featuring a significant inductive component, as it can be seen in FIG. 14A. Said input impedance is represented by curve 1400, which is located in the upper half portion of the Smith chart for all frequencies of the first frequency region (represented by the interval between point 1401 and point 1402 of the curve 1400).

Figure 14B:
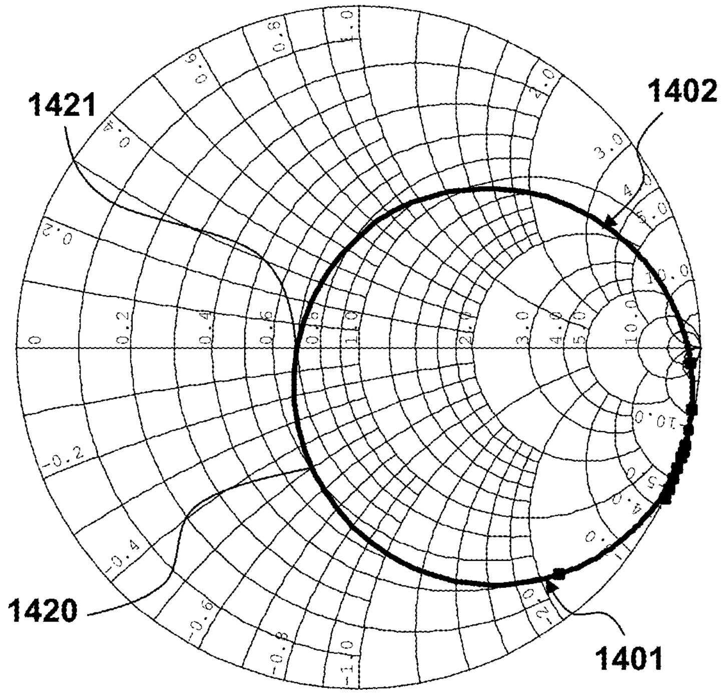
Figure 14C:
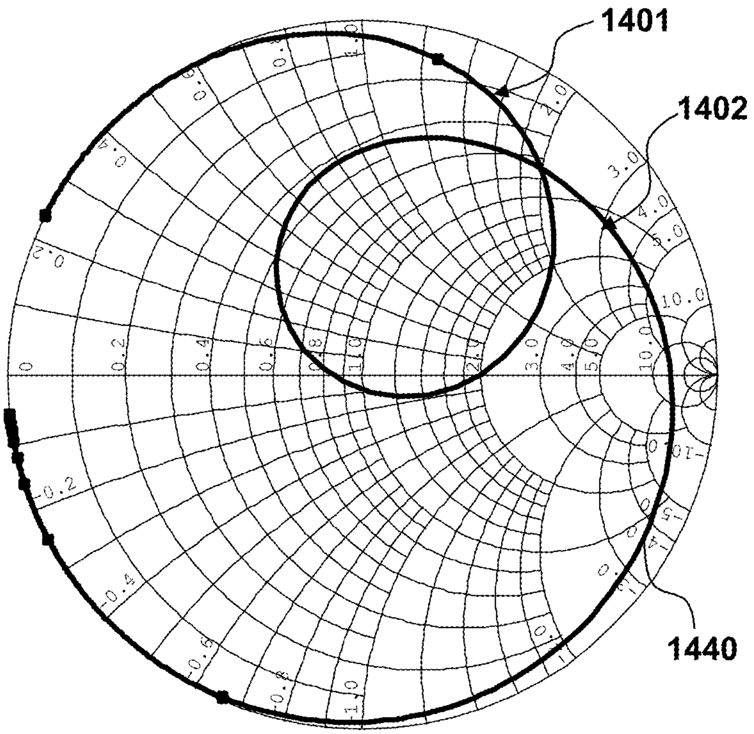

The reactance cancellation circuit 1310 is connected to the first port 1301 and comprises two stages having a substantially capacitive behavior and forming an L-shaped structure with a parallel capacitor 1303 and a series capacitor 1304. The capacitive behavior of the reactance cancellation circuit 1310 advantageously compensates the inductive component of the input impedance of the radiating structure 1200, transforming curve 1400 (FIG. 14A) into curve 1420 (FIG. 14B). Said curve 1420 corresponds to the input impedance that would be observed at the second port 1302 if the broadband matching circuit 1311 and the fine tuning circuit 1312 were removed and said second port 1302 were directly connected to a port 1320. In effect, the curve 1420 crosses the horizontal axis of the Smith Chart (i.e., imaginary part of the input impedance equal to zero) at a point 1421 located between point 1401 and point 1402.

The broadband matching circuit 1311 is connected in cascade after the reactance cancellation circuit 1310 and is similar in topology to the ones already discussed in connection with FIG. 5 and FIG. 9. Again, the broadband matching circuit 1311 includes one stage substantially behaving as an LC parallel resonant circuit comprising a capacitor 1305 and an inductor 1306 connected in parallel.

The broadband matching circuit 1311 further transforms the input impedance of the antenna structure and converts curve 1420 into curve 1440, said curve 1440 being the input impedance that would be observed at the second port 1302 if the fine tuning circuit 1312 were removed and said second port 1302 were directly connected to a port 1321. Curve 1440 features a compact loop that unfortunately is shifted towards the upper half of the Smith chart. If said loop were centered on the center of the Smith chart, impedance matching would be obtained over a much broader range of frequencies.

Figure 14D:
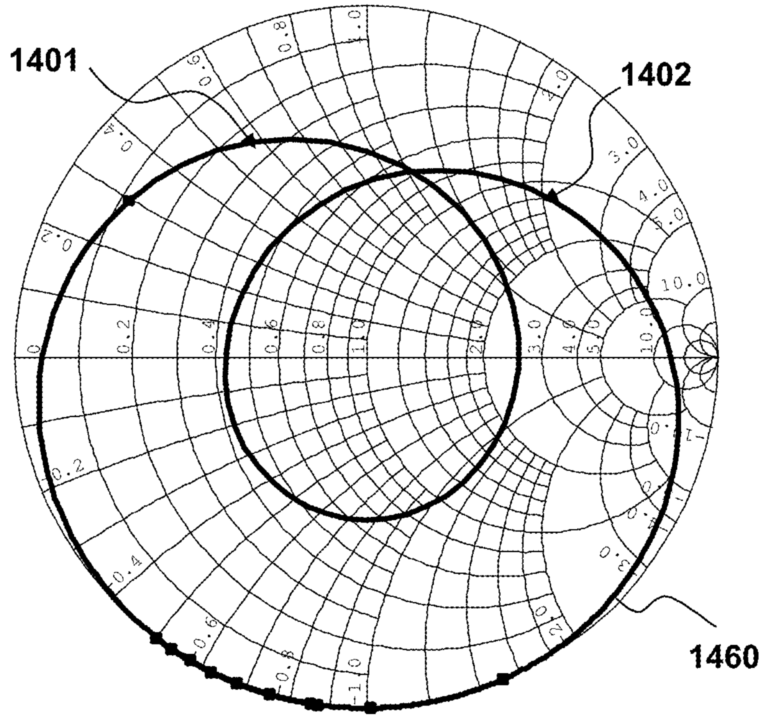

Finally, the fine tuning circuit 1312 is connected in cascade between the broadband matching circuit 1311 and the second port 1302, and includes one stage having a substantially capacitive behavior for all frequencies of the first frequency region. In particular said stage comprises a series circuit element (lumped capacitor 1307). The fine tuning circuit 1312 provides the additional transformation of the input impedance necessary to re-center the loop of curve 1440 on the center of the Smith chart. In FIG. 14D, curve 1460 represents the input impedance measured at the second port 1402, or equivalently at the external port of the radiating system. Said curve 1460 attains the level of VSWR required to provide operability to the radiating system in its first frequency region.

Figure 15:
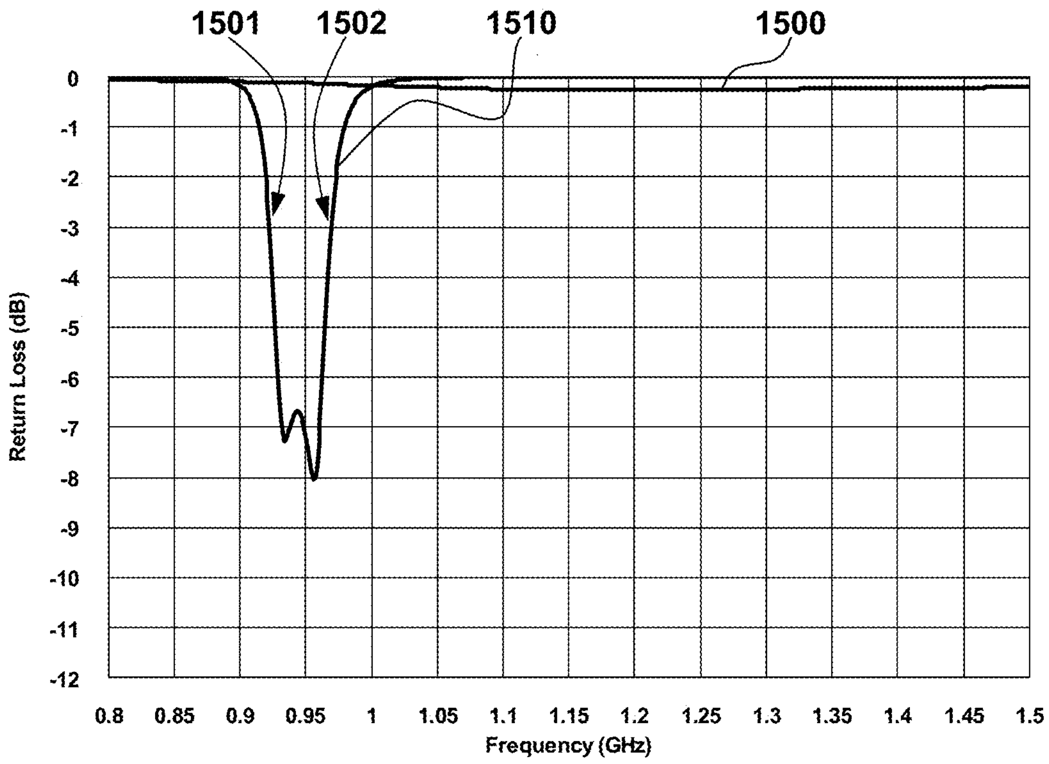
FIG. 15—Typical input return losses at the internal port of the radiating structure of FIGS. 12A-12B compared with those at the external port of a radiating system obtained after interconnecting the radiating structure of FIG. 13 with the radiofrequency system of FIGS. 12A-12B.

Referring now to FIG. 15, it is shown there a comparison between the typical input return losses observed at the internal port of the radiating structure 1200 when the radiofrequency system 1300 is disconnected (see curve 1500 in dash-dotted line) and the typical input return losses at the external port of the radiating system resulting from the interconnection of said radiofrequency system 1300 with the radiating structure 1200 (see curve 1510 in solid line). The presence of radiofrequency system 1300 improves substantially the return losses of the radiating structure 1200 for all frequencies of the first frequency region (delimited in the figure by points 1501 and 1502 on the curve 1510).

Figure 16A:
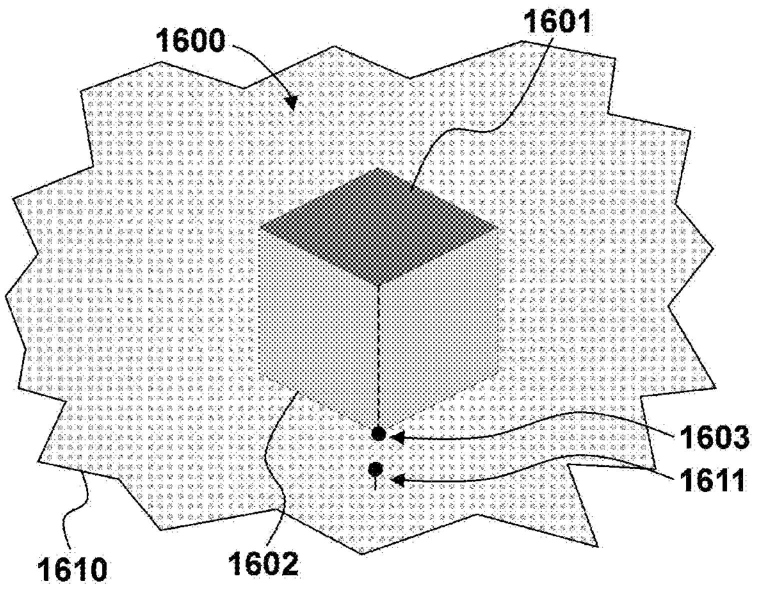
FIGS. 16A, 16B, 16C—Examples of radiation boosters comprising a conductive part.
Figure 16B:
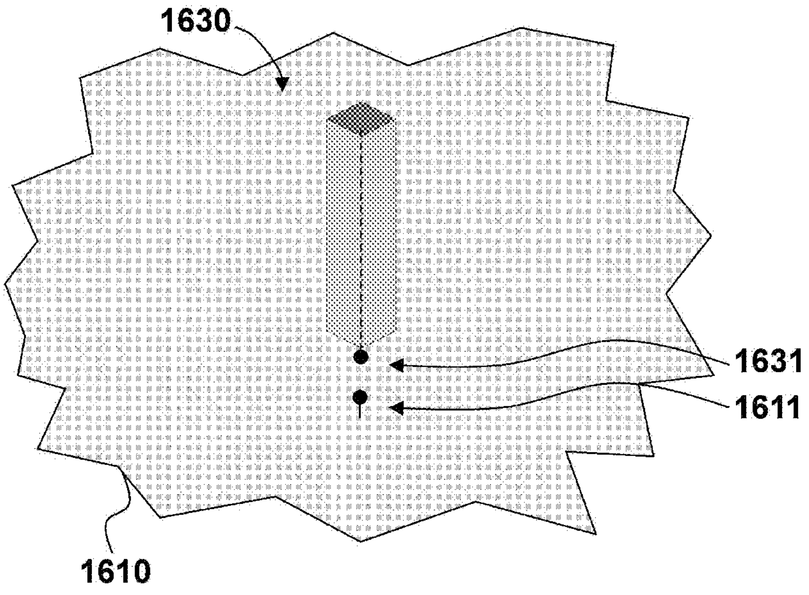
Figure 16C:
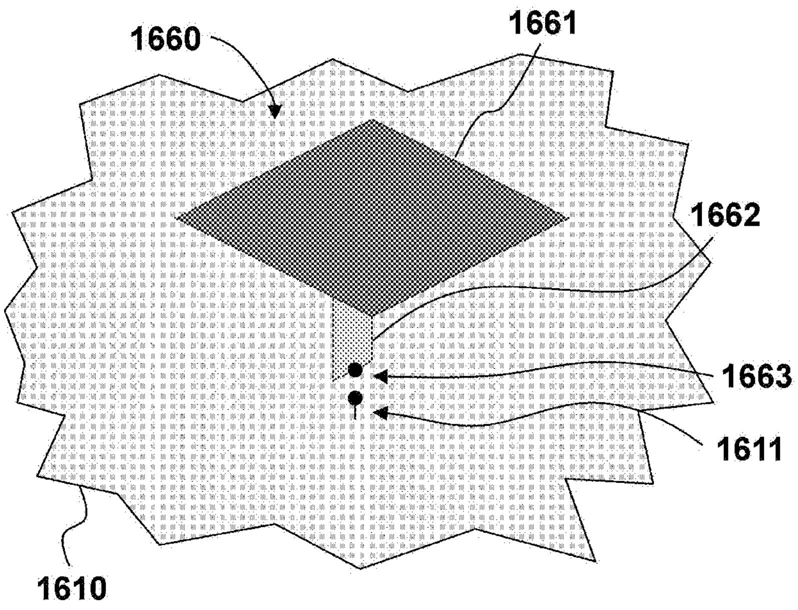

FIGS. 16A-16C show three preferred examples of radiation boosters comprising a conductive part. Each of the radiation boosters 1600, 1630, 1660 may advantageously excite a radiation mode on a ground plane layer 1610. In these examples, the radiation boosters 1600, 1630, 1660 are preferably not connected to the ground plane layer 1610.

FIG. 16A depicts a radiation booster 1600 including a conductive part featuring a polyhedral shape comprising a plurality of faces. More precisely, said conductive part takes the shape of a cube having six substantially square faces. Nevertheless, other polyhedral shapes are also possible.

In this particular example, two of the faces of the radiation booster (namely, the top face 1601 and the bottom face 1602) are substantially parallel to the ground plane layer 1610, which may facilitate the integration of the radiation booster 1600 into a wireless handheld or portable device by mounting said radiation booster 1600 on a PCB of the wireless device, and in particular the PCB that also comprises the ground plane layer 1610. However, in other examples, the radiation booster 1600 may not be substantially parallel to the ground plane layer 1610.

In this case, a booster box associated to said radiation booster 1600 coincides with the external surface of the radiation booster 1600. Since the smallest dimension of said booster box is not smaller than the 90% of the largest dimension of said booster box, the radiation booster 1600 takes full advantage of being a three-dimensional structure that occupies a volume.

The radiation booster 1600 also comprises a connection point 1603 advantageously located substantially close to a corner of the radiation booster 1600, said corner being in particular also a corner of the bottom face 1602. Said connection point 1603 defines together with a connection point of the ground plane layer 1611 an internal port of a radiating structure.

FIG. 16B shows radiation booster 1630 that includes a conductive part also featuring a polyhedral shape. In this example, said conductive part takes the form of a parallelepiped having substantially a square top face, a bottom face and four substantially rectangular lateral faces. However, other shapes for the top and bottom faces are also possible (such as for instance, but not limited to, triangle, pentagon, hexagon, octagon, circle, or ellipse) and/or for the lateral faces. Furthermore, the conductive part of the radiation booster could also have been shaped as a cylinder having circular or elliptical top and bottom faces. The conductive part of the radiation booster 1630 is mounted with respect to the ground plane layer in such a way that the top and bottom faces of the conductive part of said radiation booster 1630 are substantially parallel to the ground plane layer 1610.

As in the example of FIG. 16A, a booster box associated to the radiation booster 1630 also coincides with the external surface of the radiation booster 1630. However in the case of FIG. 16B, the smallest dimension of the booster box associated to the radiation booster 1630 is much smaller than the 70% of the largest dimension of said booster box. Therefore, although the radiation booster 1630 is not planar (i.e., two dimensional), it does not take full advantage of being a three-dimensional structure either.

The radiation booster 1630 further comprises a connection point 1631, located substantially close to a corner of the radiation booster 1630, which defines together with the connection point of the ground plane layer 1611 an internal port of a radiating structure.

In FIG. 16C it is shown a radiation booster 1660 including also a conductive part. Said conductive part comprises a conductive polygonal shape 1661 being substantially square and arranged substantially parallel to the ground plane layer 1610 at a predetermined height with respect said ground plane layer 1610. In other examples, the conductive polygonal shape 1661 may be shaped differently (for instance, as a polygon having a different number of sides of the same or different lengths, or as a circle or an ellipse).

Said conductive part further comprises a conductive strip 1662 having a substantially elongated shape and featuring two ends: A first end of the conductive strip 1662 is connected to the conductive polygonal shape 1661; and a second end of the conductive strip 1662 includes a connection point 1663, which together with the connection point of the ground plane layer 1611 defines an internal port of a radiating structure. In this example, the conductive strip 1662 is arranged substantially perpendicular to the ground plane layer 1610.

A radiating structure resulting from the combination of any of the radiation boosters 1600, 1630, 1660 in FIGS. 16A-16C with the ground plane layer 1610, features an input impedance (measured at the internal port of the radiating structure in absence of radiofrequency system) having an imaginary part with an important capacitive component. Therefore, such radiating structure could be advantageously interconnected with a radiofrequency system such as those in FIG. 5 or FIG. 9.

Referring now to FIGS. 17A-17E, it is shown some preferred placements of the radiation boosters of FIGS. 16A-16C with respect to a ground plane layer of a radiating structure.

Figure 17A:
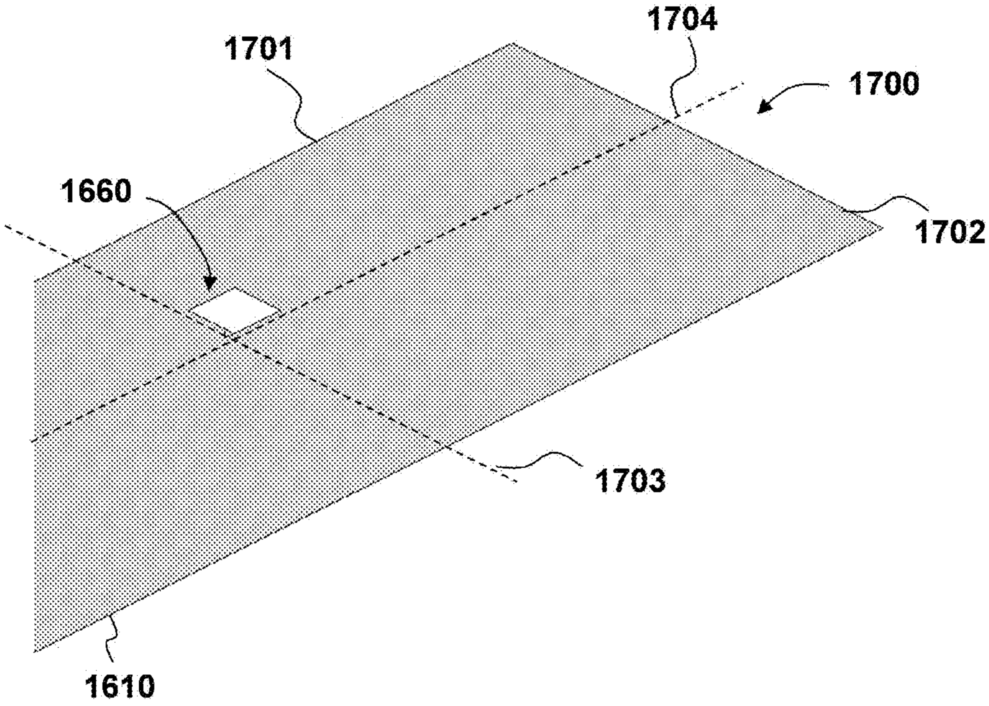
FIGS. 17A-17E—Examples of some preferred placements of the radiation boosters of FIGS. 16A-16C with respect to the ground plane layer of a radiating structure.

In particular, FIG. 17A presents a radiating structure 1700 comprising the radiation booster 1660 and the ground plane layer 1610. The ground plane layer 1610 features a substantially rectangular shape having a long edge 1701 and a short edge 1702. In this example, the radiation booster 1660 is arranged substantially centered with respect to the ground plane layer 1610. That is, the radiation booster 1660 is substantially close to the point of the ground plane layer 1610 defined by the intersection of a first line 1703 (perpendicular to the long edge 1701 and crossing said long edge 1701 at its middle point) and a second line 1704 (perpendicular to the short edge 1702 and crossing said short edge 1702 at its middle point). Therefore, in this example the projection of the radiation booster 1660 on the plane containing the ground plane layer 1610 completely overlaps the ground plane layer 1610.

Figure 17B:
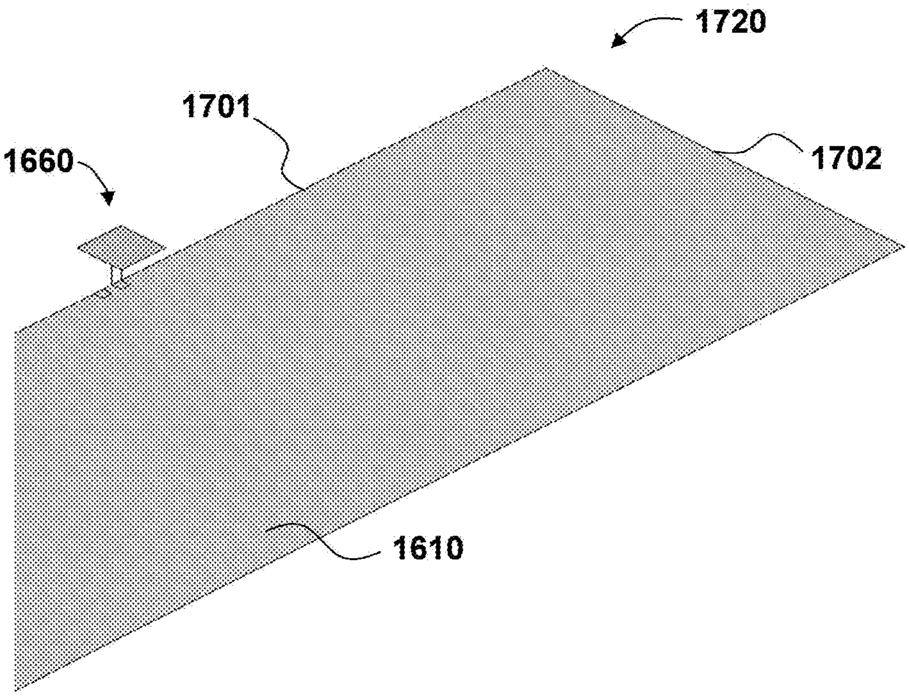

FIG. 17B shows a radiating structure 1720 similar to that of FIG. 17A, but in which the radiation booster 1660 has been arranged with respect to the ground plane layer 1610 in such a manner that the radiation booster is substantially close to the middle point of the long edge 1701. Consequently, in this radiating structure 1720 approximately only 50% of the area of the projection of the radiation booster 1660 on the plane containing the ground plane layer 1610 overlaps the ground plane layer 1610. A radiating structure such as the one in FIG. 17B may be advantageous when it is required to excite a radiation mode on the ground plane layer 1610 in which the currents are substantially aligned with respect the short edge 1702.

Figure 17C:
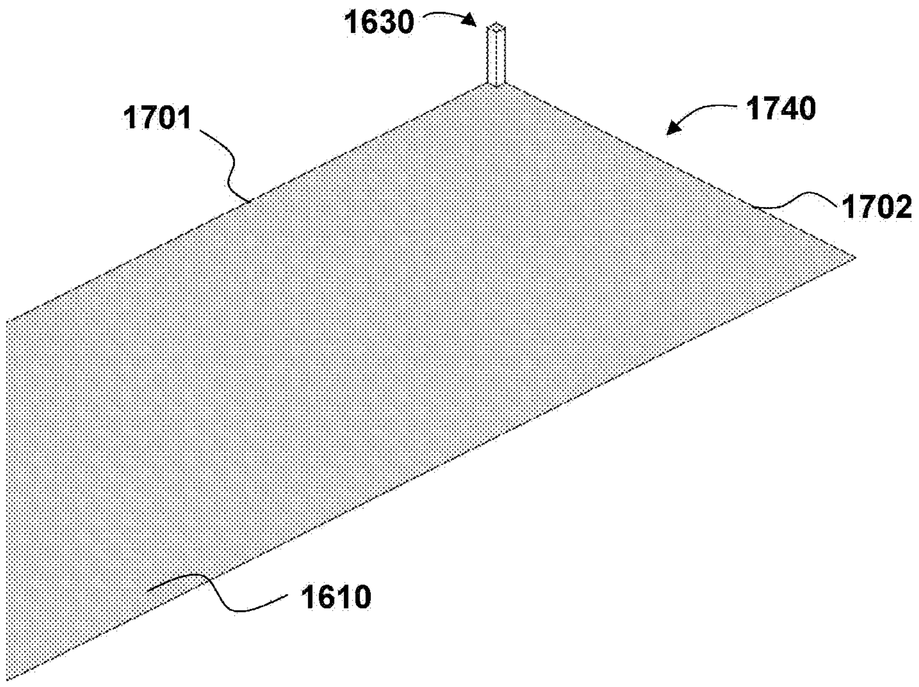
Figure 17D:
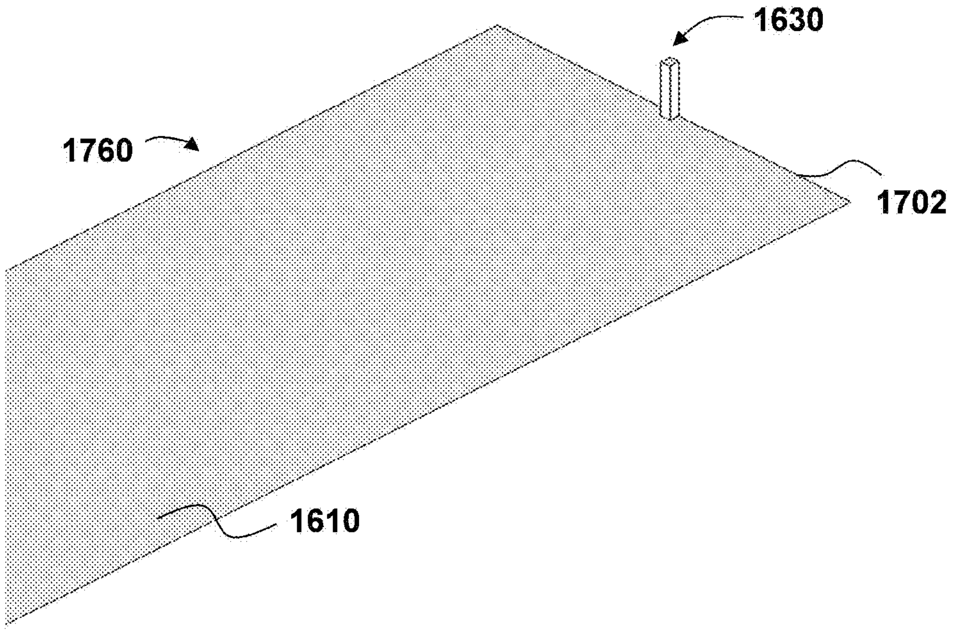

FIGS. 17C and 17D present two additional radiating structures comprising the radiation booster 1630 located substantially close to the short edge 1702. In the case of the radiating structure 1740, the radiation booster 1630 is advantageously located on a corner of the ground plane layer 1610, said corner being defined by the intersection of the long edge 1701 and the short edge 1702. On the other hand, in the radiating structure 1760 the radiation booster is located substantially close to the middle point of the short edge 1702.

Figure 17E:
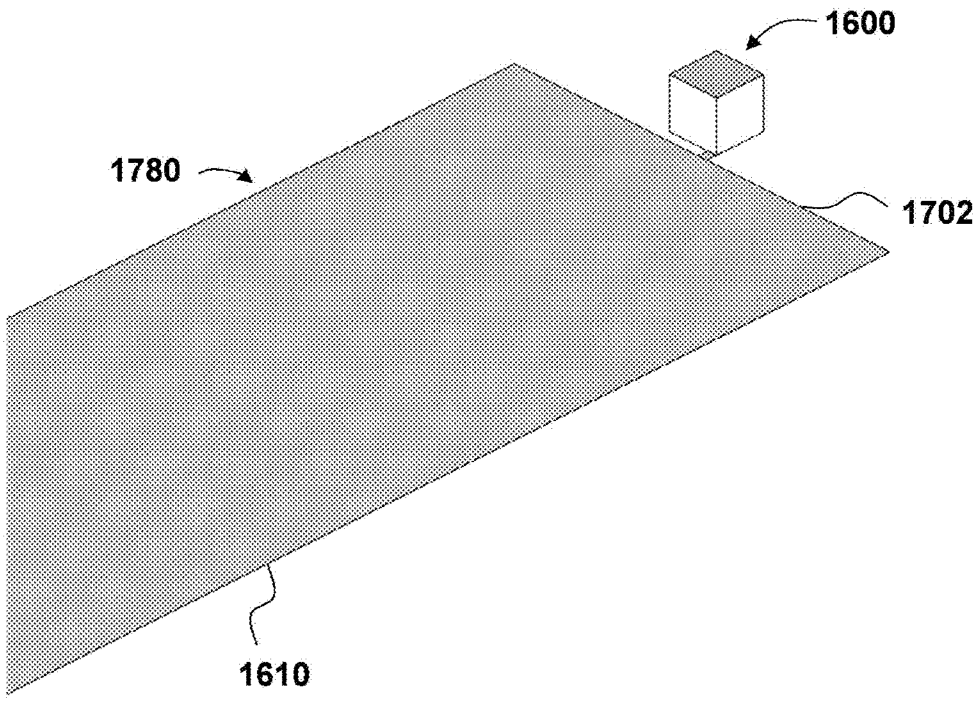

Finally, FIG. 17E shows a radiating structure 1780, which resembles the radiating structure in FIG. 17D, but using the radiation booster 1600 instead. In this example, it is advantageous to protrude the radiation booster 1600 beyond the short edge 1702, avoiding any overlapping between the projection of the radiation booster 1600 on the plane of the ground plane layer 1610 and the ground plane layer 1610.

Although FIGS. 17A-17E present some examples of radiating structures using a radiation booster as those described in FIGS. 16A-16C, other possible embodiments according to the present invention would result from replacing the particular radiation booster shown in FIGS. 17A-17E by any of the other radiation boosters shown in FIGS. 16A-16C.

Figure 18:
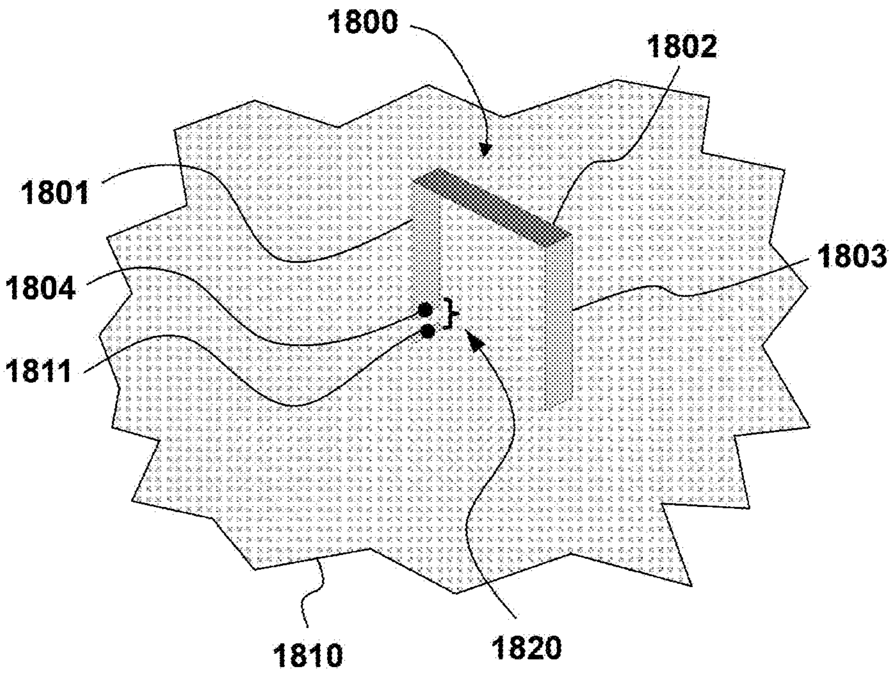
FIG. 18—Another example of a radiation booster comprising a conductive part, wherein said conductive part is connected to the ground plane layer of a radiating structure.

Referring now to FIG. 18, it is shown another example of a radiation booster. Radiation booster 1800 includes a conductive part comprising a plurality of conductive strips. In the figure, said conductive part comprises three conductive strips, although in other examples said conductive part may comprise more or fewer than three conductive strips. As depicted in FIG. 18, a first conductive strip 1801 and a third conductive strip 1803 are arranged substantially perpendicular to a ground plane layer 1810. A second strip 1802 is arranged substantially parallel to the ground plane layer 1810 and connected to the other two conductive strips, so that a first end of the second conductive strip 1802 is connected to a first end of the first conductive strip 1801 and a second end of the second conductive strip 1802 is connected to a first end of the third conductive strip 1803.

In this example, said conductive part of the radiation booster 1800 is connected to the ground plane layer 1810. For that purpose, a second end of the third conductive strip 1803 is connected to the ground plane layer 1810.

The radiation booster comprises a connection point 1804 located on a second end of the first conductive strip 1801, said connection point 1804 defining together with a connection point of the ground plane layer 1811 an internal port of a radiating structure 1820. Such a radiation booster 1800 may be advantageous when it is desired to have a radiating structure that features an input impedance at the internal port 1820 (in absence of a radiofrequency system) having a positive imaginary part for all the frequencies of the first frequency region (i.e., said imaginary part being an inductive component).

FIGS. 19A-19E present some preferred placements of the radiation booster 1800 with respect to the ground plane layer 1810. The ground plane layer 1810 features a substantially rectangular shape having a long edge 1901 and a short edge 1902.

Figure 19A:
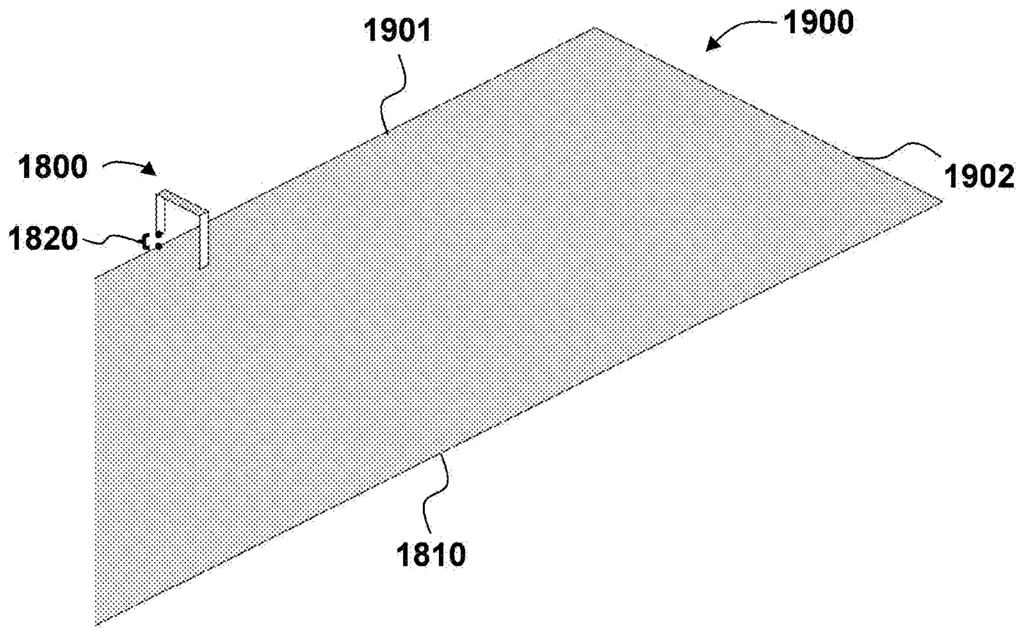
FIGS. 19A-19E—Examples of some preferred placements of the radiation booster of FIG. 18 with respect to the ground plane layer of a radiating structure.

In FIG. 19A it is shown a radiating structure 1900 in which the radiation booster 1800 is arranged substantially close to the long edge of the ground plane layer 1901. More precisely, the radiation booster 1800 is substantially close to the middle point of said long edge 1901. Moreover, the second conductive strip 1802 of the radiation booster 1800 is oriented substantially parallel to the short edge of the ground plane layer 1902, so that the first conductive strip 1801 is closer to the long edge 1901 than it is the third conductive strip 1803. Such an arrangement has turned out to be advantageous to enhance the coupling of energy between the radiation booster and the ground plane layer.

Figure 19B:
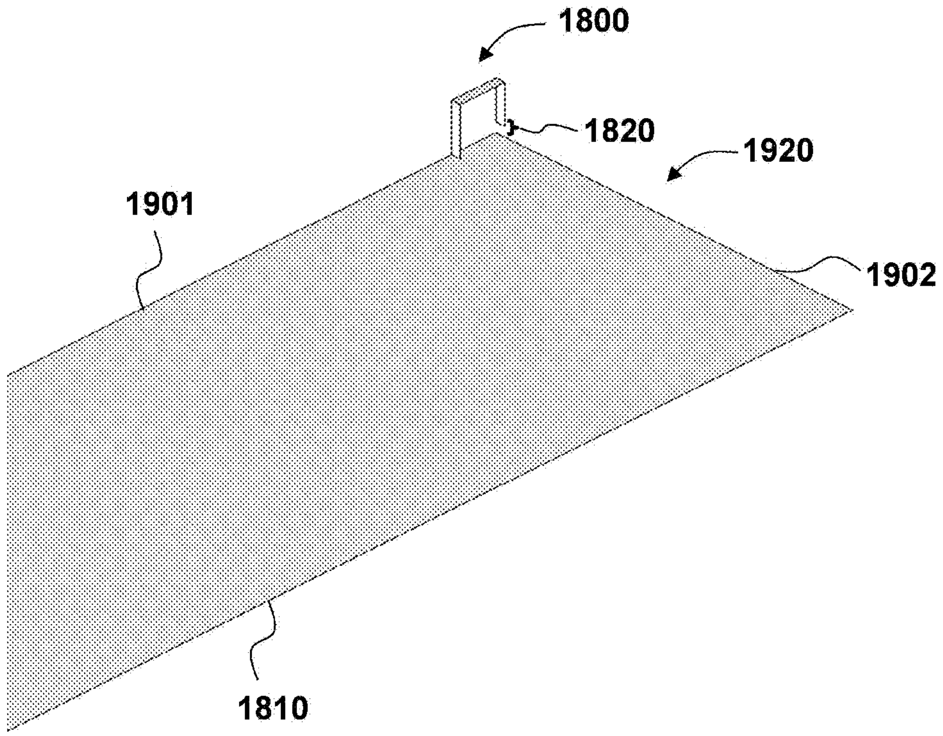

FIG. 19B presents another example of a radiating structure 1920 in which the radiation booster 1800 is also arranged substantially close to the long edge 1901 as in the previous case. However, now the radiation booster 1800 is advantageously located on a corner of the ground plane layer (said corner being defined by the intersection of the long edge 1901 and the short edge 1902), and its second conductive strip 1802 is oriented substantially parallel to the long edge of the ground plane layer 1901. That is, the radiation booster 1800 is arranged in such a manner that the first conductive strip 1801 is closer to said corner of the ground plane layer 1810 than it is the third conductive strip 1803.

Figure 19C:
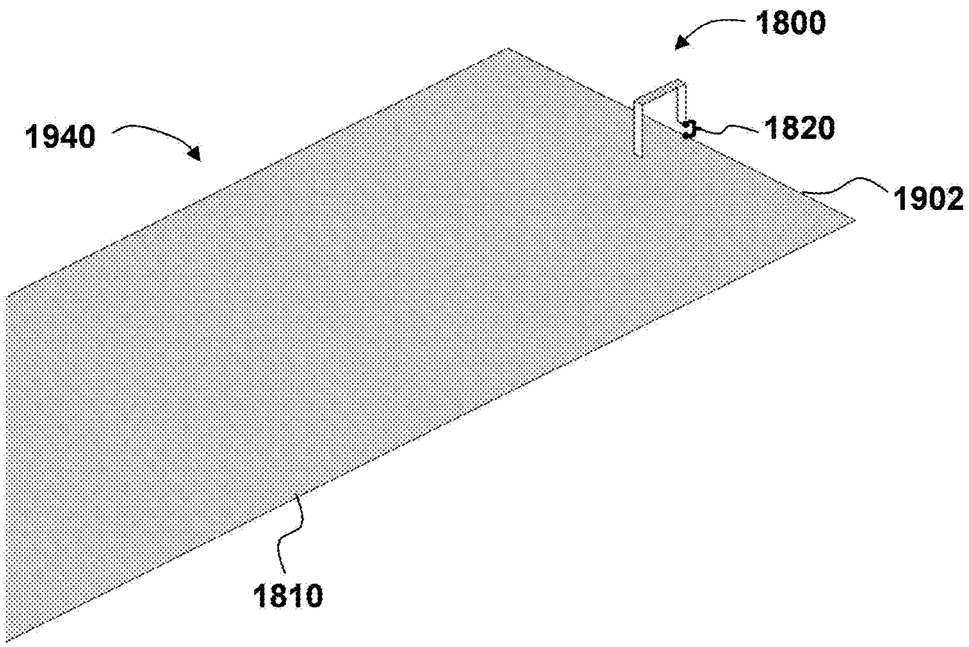

FIG. 19C shows a further radiating structure 1940 including the radiation booster 1800 still arranged in such a way that its second conductive strip 1802 is oriented substantially parallel to the long edge of the ground plane layer 1901, as in FIG. 19B. However, now the radiation booster 1800 is placed substantially close to the short edge of the ground plane layer 1902, and more precisely approximately on the middle point of said short edge 1902. Additionally, the first conductive strip of the radiation booster 1801 is closer to the short edge 1902 than it is the third conductive strip 1803.

Figure 19D:
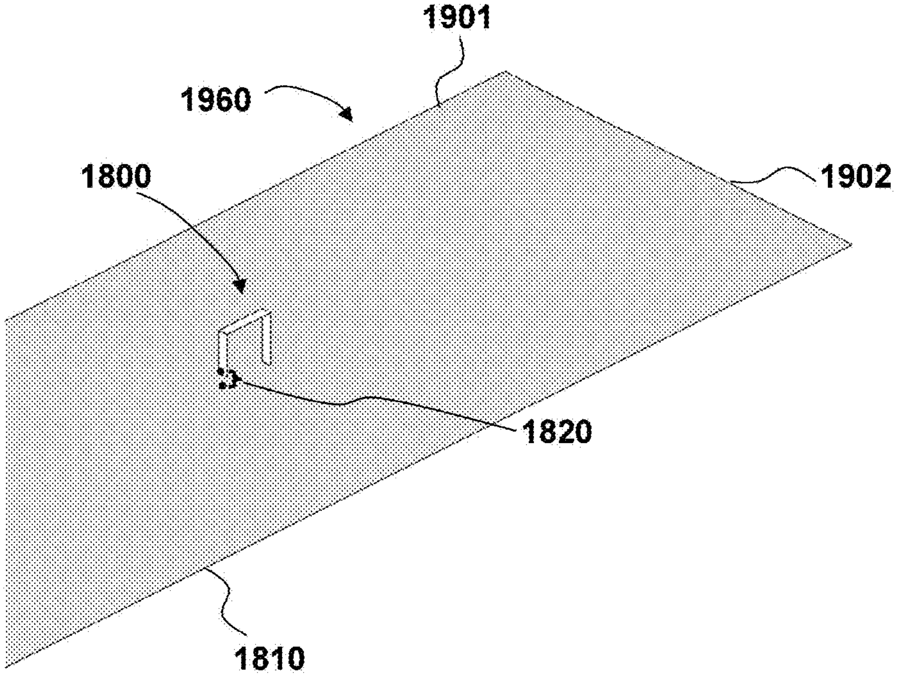

Another possible placement of the radiation booster 1800 is as indicated in the radiating structure 1960 shown in FIG. 19D, in which the radiation booster 1800 is substantially centered on the ground plane layer 1810. As in previous examples, it is preferred arranging said radiation booster 1800 so that its second conductive strip 1802 is aligned substantially parallel to the long edge of the ground plane layer 1901.

Figure 19E:
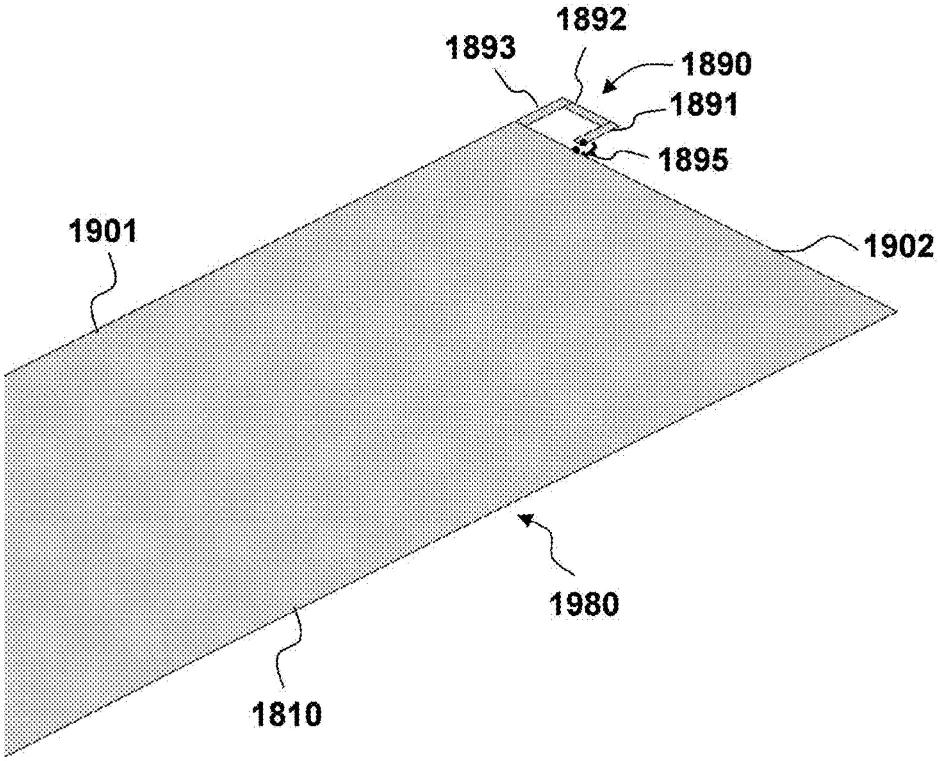

FIG. 19E presents a somewhat different radiating structure comprising a radiation booster inspired in the one shown in FIG. 18. A radiating structure 1980 comprises a radiation booster 1890 including a conductive part having three conductive strips 1891, 1892, 1893. Unlike the previous examples, the radiation booster 1890 is coplanar to the ground plane layer 1810, making it possible to embed the radiation booster 1890 and the ground plane layer 1810 in a same PCB.

Conductive strip 1891 includes a connection point that together with a connection point of the ground plane layer 1810 defines an internal port of the radiating structure 1895. Conductive strip 1893 is connected to the ground plane layer 1810. Conductive strip 1892 connects conductive strip 1891 with conductive strip 1893.

As it can be observed, the radiation booster 1890 protrudes beyond the short edge of the ground plane layer 1902, so that there is no ground plane in the projection of said radiation booster 1890 on the plane containing the ground plane layer 1810. Moreover, the radiation booster 1890 is advantageously located on a corner of the ground plane layer 1810 (in particular, the corner defined by the intersection of the long edge 1901 and the short edge 1902) and the conductive strip 1893 is closer to said corner than it is the conductive strip 1891.

Although FIGS. 19A-19E present some examples of radiating structures using a radiation booster as that described in FIG. 18, other possible embodiments according to the present invention would result from reorienting the radiation booster 1800 to have its second conductive strip 1802 aligned with respect to a given edge of a ground plane layer 1810, or from replacing the radiation booster 1800 with its coplanar equivalent (such as radiation booster 1890).

Figure 20A:
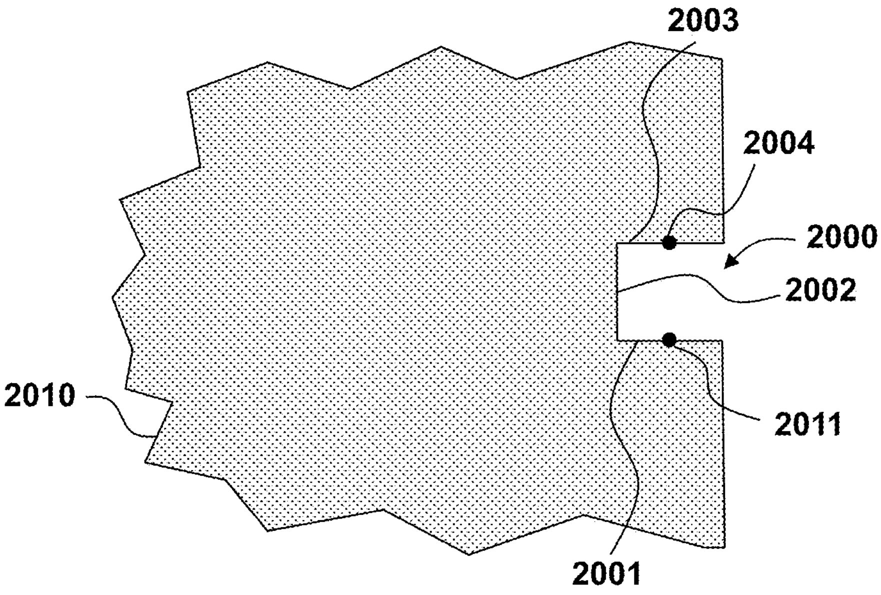
FIGS. 20A, 20B—Examples of radiation boosters comprising a gap.
Figure 20B:
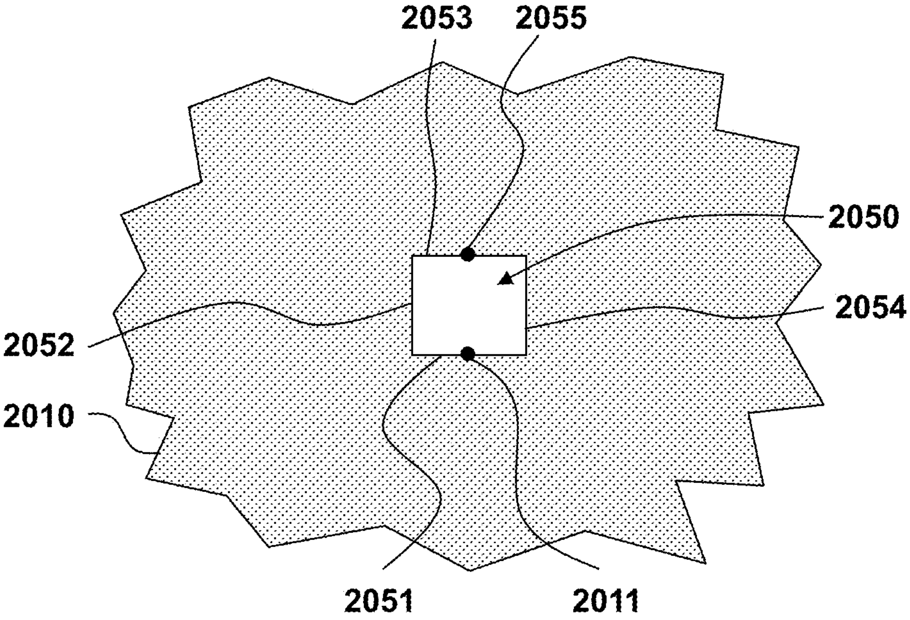

In FIGS. 20A-20B there are shown two examples of radiation boosters comprising a gap. The radiation booster 2000 in FIG. 20A has already been discussed in connection with the radiation structure of FIGS. 12A-12B. An alternative radiation booster is depicted in FIG. 20B, in which a radiation booster 2050 comprises a gap delimited by a plurality of segments defining a closed curve (i.e., a curve that does not intersect the perimeter of the ground plane layer 2010). In this example, segments 2051-2054 delimit a gap having a polygonal shape (in fact, the shape of a square).

The radiation booster 2050 comprises a connection point 2055 located at a first point along the curve delimiting said gap. In particular said connection point 2055 is located on a point of segment 2053. The ground plane layer 2010 also includes a connection point 2011, said connection point 2011 being located at a second point along said curve, and more precisely on a point of segment 2051. Although not always required, the connection point of the radiation booster 2055 and the connection point of the ground plane layer 2011 are advantageously located on segments at opposite sides of said gap of the radiation booster 2050 (segment 2053 and segment 2051 respectively).

Of course, FIG. 20A and FIG. 20B just present a couple of examples of a radiation booster. Other possible examples may include a different number of segments to delimit the gap (such as for instance two, three, four, five, six or more) and/or said segments could be straight, curved or a combination thereof.

FIGS. 21A-21D present some preferred placements for the radiation boosters 2000 and 2050 with respect to the ground plane layer 2010. The ground plane layer 2010 features a substantially rectangular shape having a long edge 2101 and a short edge 2102.

Figure 21A:
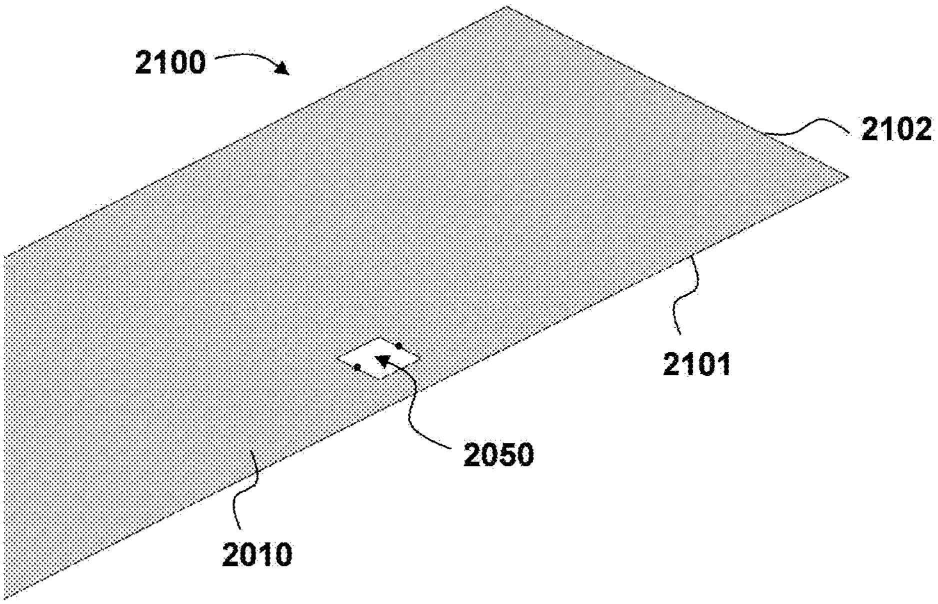
FIGS. 21A-21D—Examples of some preferred placements of the radiation boosters of FIGS. 20A and 20B with respect to the ground plane layer of a radiating structure.

In FIG. 21A it is shown a radiating structure 2100 similar to the one shown in FIGS. 12A-12B but in which the radiation booster 2050 is used instead. Said radiation booster 2050 is arranged substantially close to the long edge of the ground plane layer 2101. In particular, the radiation booster 2050 is substantially close to the middle point of said long edge 2101. In this example, the segments 2051 and 2053 (i.e., the segments containing the connection points) are arranged so that they are substantially parallel to the short edge of the ground plane layer 2102. Such an arrangement is advantageous to properly excite a radiation mode on the ground plane layer 2010.

Figure 21B:
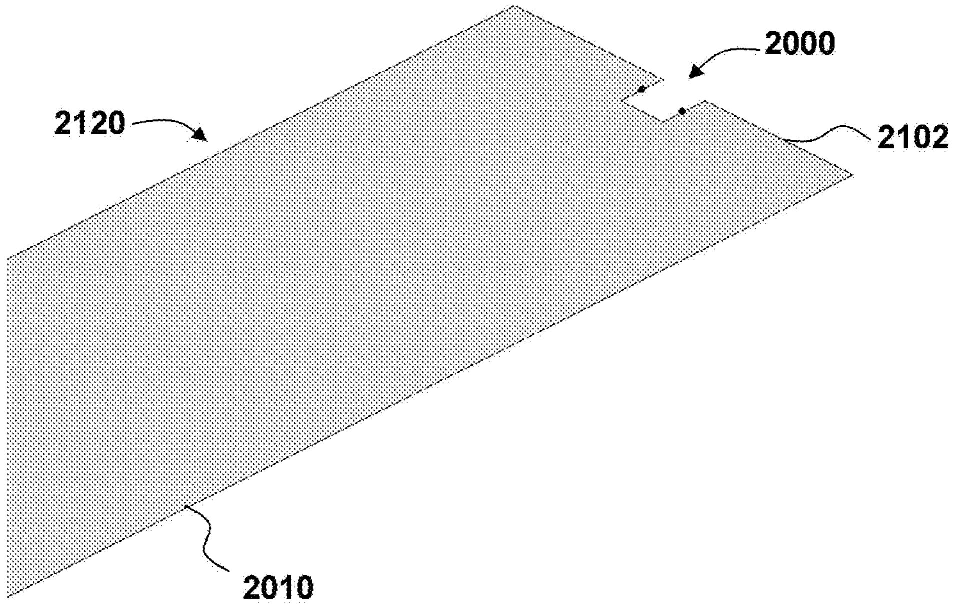
Figure 21C:
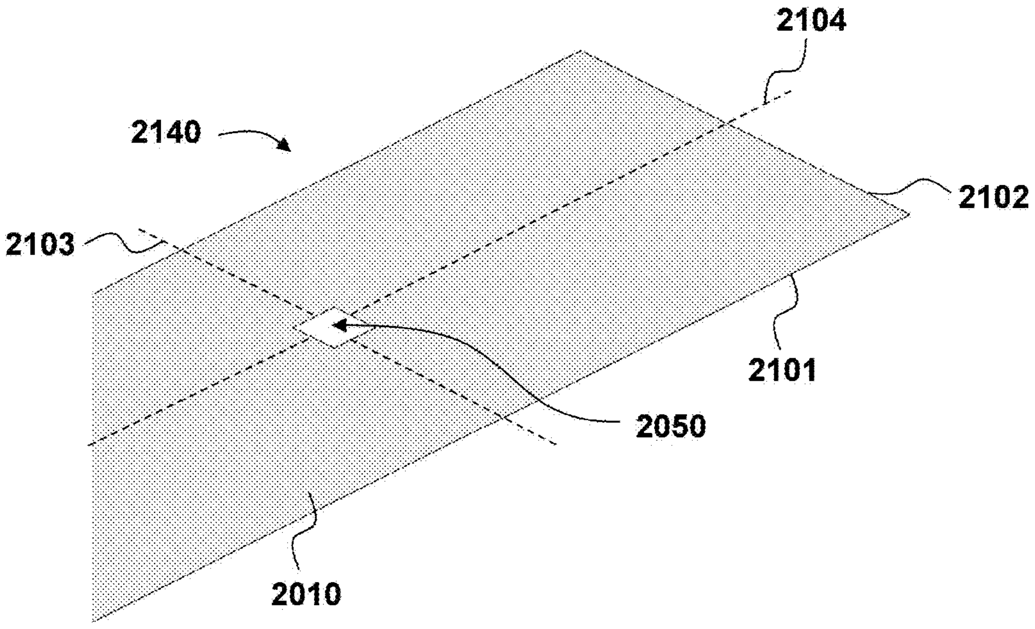
Figure 21D:
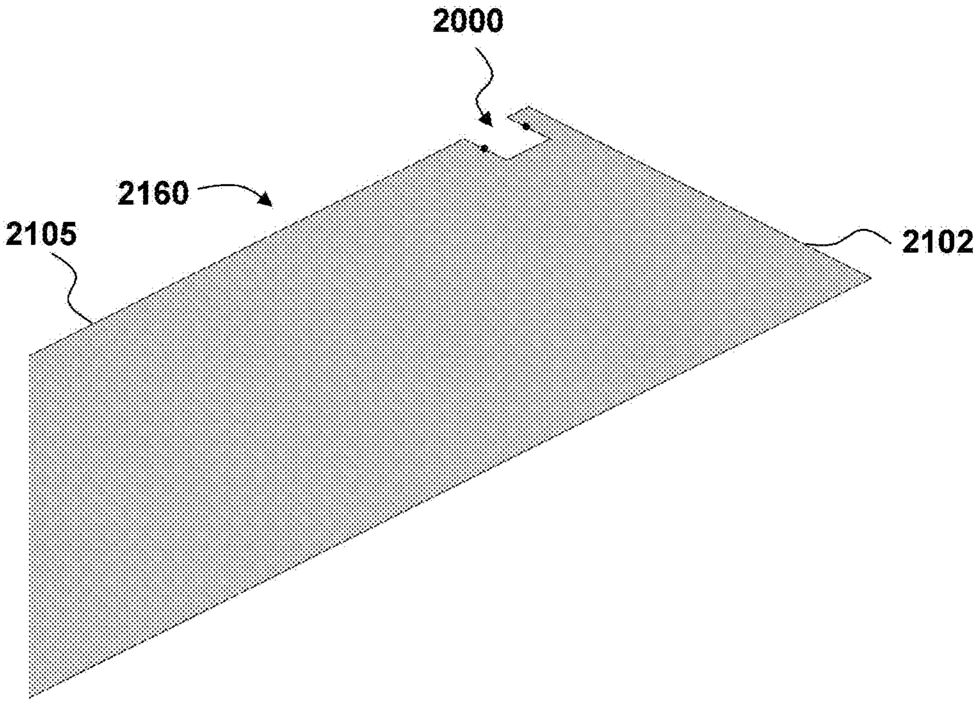

FIG. 21C presents a radiating structure 2140 also comprising the radiation booster 2050 as in FIG. 21A, but in which said radiation booster 2050 is arranged substantially centered with respect to the ground plane layer 2010. That is, the radiation booster 2050 is substantially close to the point of the ground plane layer 2010 defined by the intersection of a first line 2103 (perpendicular to the long edge 2101 and crossing said long edge 2101 at its middle point) and a second line 2104 (perpendicular to the short edge 2102 and crossing said short edge 2102 at its middle point). Again, in the radiation structure 2140, the segments 2051 and 2053 (i.e., the segments containing the connection points) are arranged so that they are substantially parallel to the short edge of the ground plane layer 2102.

FIG. 21B presents another radiating structure 2120 including the radiation booster 2000 placed intersecting the short edge of the ground plane layer 2102 approximately on the middle point of said short edge 2102. Alternatively, the radiating structure 2160 in FIG. 21D includes the radiation booster 2000 arranged intersecting another long edge of the ground plane layer 2105. Now the radiation booster 2000 is advantageously located substantially close to a corner of the ground plane layer (said corner being defined by the intersection of the long edge 2105 and the short edge 2102).

FIG. 22, FIGS. 23A-23B, and FIG. 24 present some further examples of radiating structures including a radiation booster comprising a gap.

Figure 22:
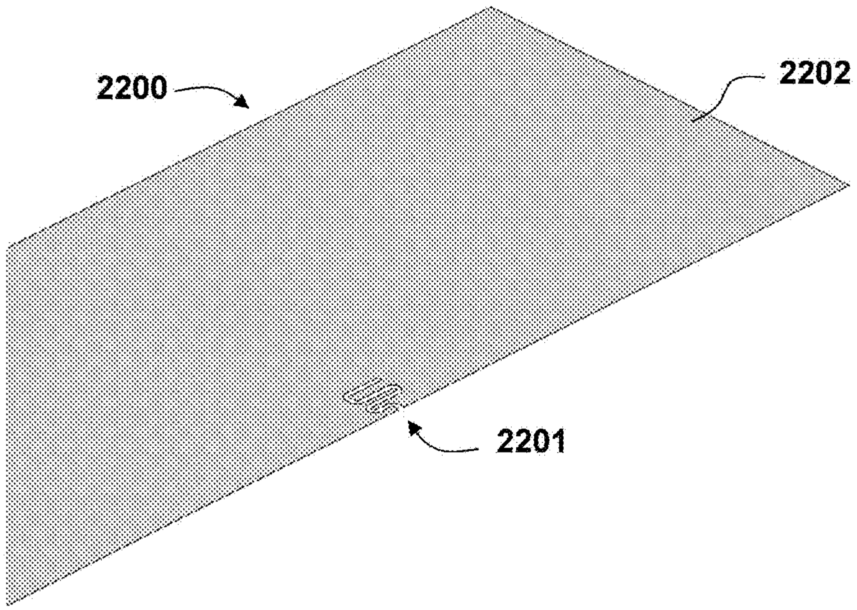
FIG. 22—Example of a preferred radiating structure including a radiation booster comprising a gap.

Referring now to FIG. 22, a radiating structure 2200 comprises a radiation booster 2201 and a substantially rectangular ground plane layer 2202. In this example, the radiation booster 2201 comprises a gap having a meandering shape. Said gap is delimited by a plurality of segments defining a curve that comprises more than ten (10) segments and that intersects the perimeter of the ground plane layer 2202 (i.e., the curve is open).

Figure 24:
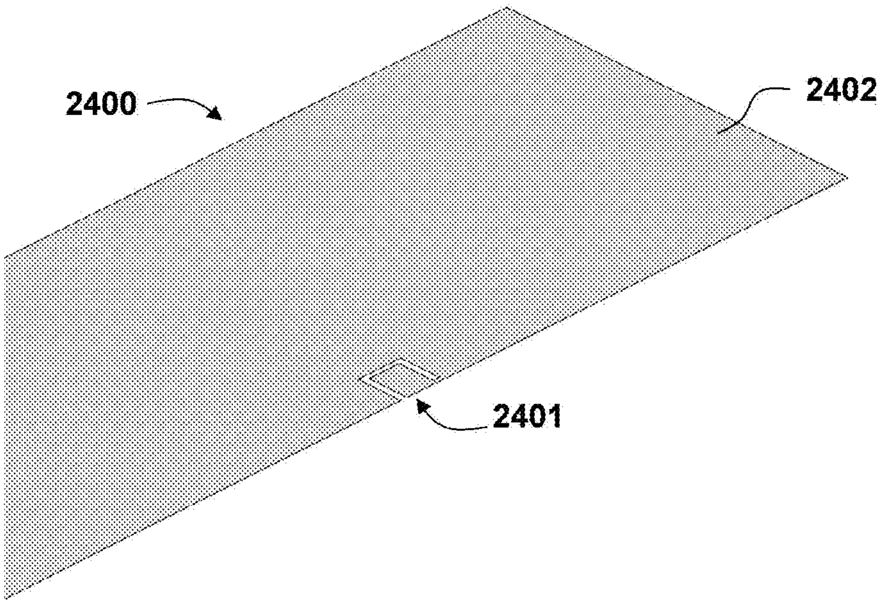
FIG. 24—Further example of a preferred radiating structure including a radiation booster comprising a gap.

FIG. 24 presents another example of a radiating structure 2400 comprising a radiation booster 2401 and a ground plane layer 2402. The radiation booster 2401 includes a gap having a U-shape. Said gap is delimited by a plurality of segments defining a curve that intersects the perimeter of the ground plane layer 2402 (i.e., the curve is open). In this example said curve comprises seven (7) segments.

Figure 23A:
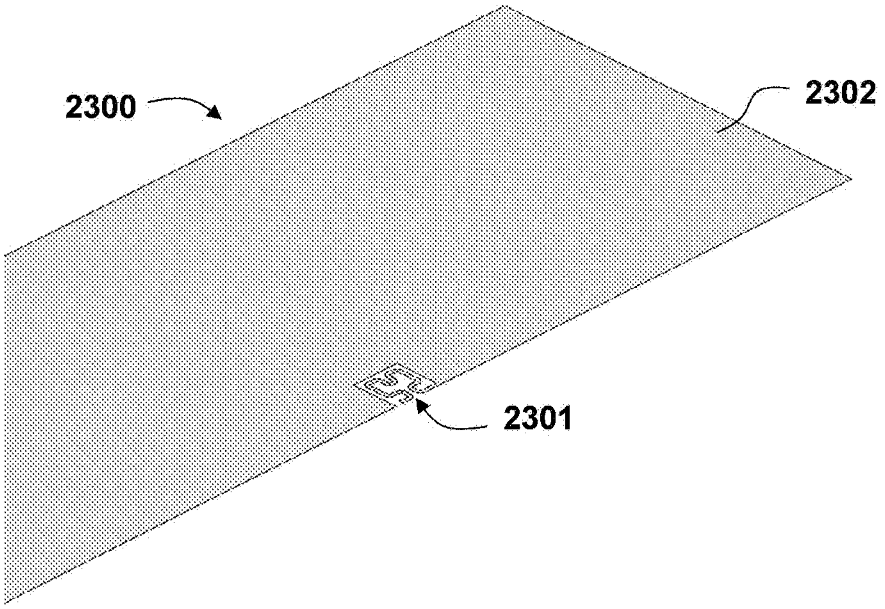
FIGS. 23A, 23B—(FIG. 23A) Example of another preferred radiating structure including a radiation booster comprising a gap.
Figure 23B:
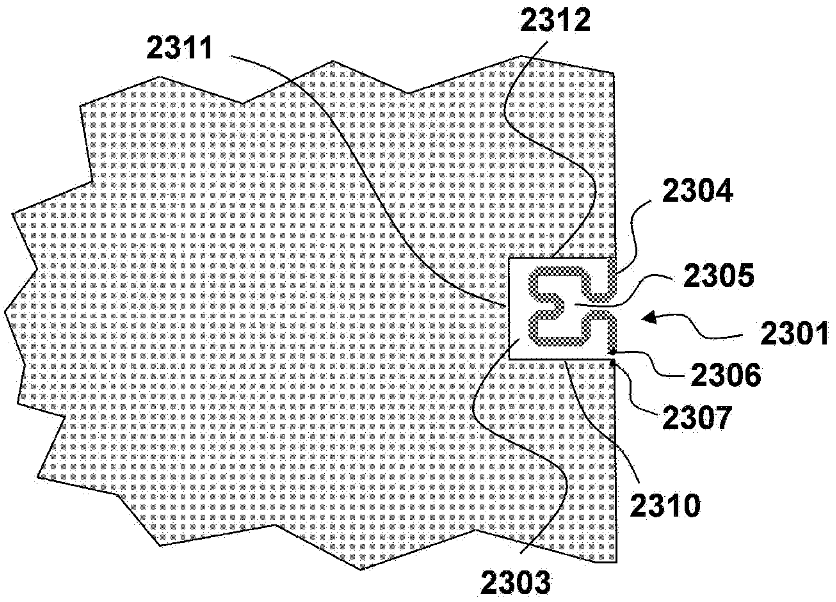

A further example is depicted in FIGS. 23A-23B, in which a radiating structure 2300 having a radiation booster 2301 and a substantially rectangular ground plane layer 2302. The radiation booster 2301 comprises an inner gap 2303, an outer gap 2305 and a conductive strip 2304 separating said inner gap 2303 from said outer gap 2305. The conductive strip 2304 features a shape inspired in a Hilbert curve. The inner gap 2303 is delimited by segments 2310-2312 and by a plurality of segments of the conductive strip 2304, defining a curve that intersects the perimeter of the ground plane layer 2302.

The radiation booster 2301 comprises a connection point 2306 located at a first point along said curve, said first point being at an end of the conductive strip 2304. The ground plane layer 2302 also comprises a connection point 2307 located at a second point along said curve delimiting the inner gap 2303, and in particular said second point being substantially close to an end of segment 2310.

In these examples, the radiation boosters 2201, 2301, 2401 are arranged with respect to the ground plane layer 2202, 2302, 2402 in such a manner that said radiation boosters 2201, 2301, 2401 are located substantially close to a long edge of the ground plane layer 2202, 2302, 2402, and in particular substantially centered with respect to said long edge. Such an arrangement is particularly advantageous when the input impedance of a radiating structure an has an inductive component. However, other placements for the radiation boosters 2201, 2301, 2401 are also possible.

Moreover, a connection point of these radiation boosters 2201, 2301, 2401 is preferably located on a point of a first segment of the curve delimiting the gap of said radiation boosters 2201, 2301, 2401, said first segment intersecting the perimeter of the ground plane layer 2202, 2302, 2402. Likewise, a connection point of the ground plane layer is preferably located on a point of a second segment of said curve, said second segment being opposite to said first segment and said second segment also intersecting the perimeter of the ground plane layer 2202, 2302, 2402.

These radiating structures 2200, 2300, 2400 feature an input impedance (measured at their internal port when disconnected from a radiofrequency system) having an imaginary part with an inductive component. Therefore, such radiating structures could be advantageously interconnected with a radiofrequency system such as the one shown in FIG. 13.

Figure 25:
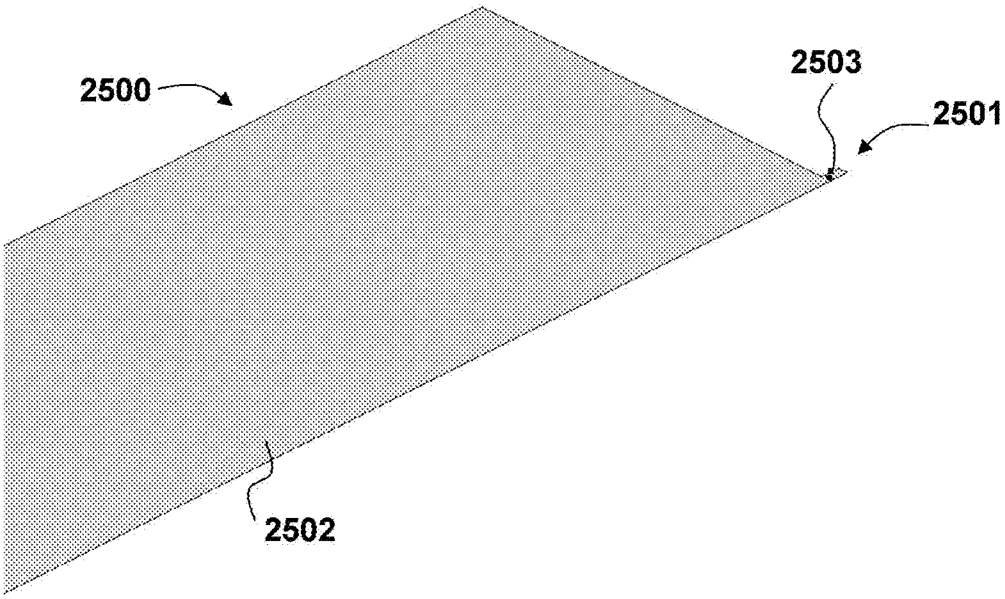
FIG. 25—Example of a preferred radiating structure including a radiation booster having a substantially planar conductive part.

A further radiating structure is depicted in FIG. 25, in which a radiating structure 2500 comprises a radiation booster 2501 and a substantially rectangular ground plane layer 2502. The radiation booster 2501 includes a conductive part having a substantially square conductive polygonal shape 2503 and being coplanar to the ground plane layer 2502. The arrangement of the radiation booster 2501 with respect to the ground plane layer is similar to that of the example in FIGS. 4A-4B.

Figure 26:
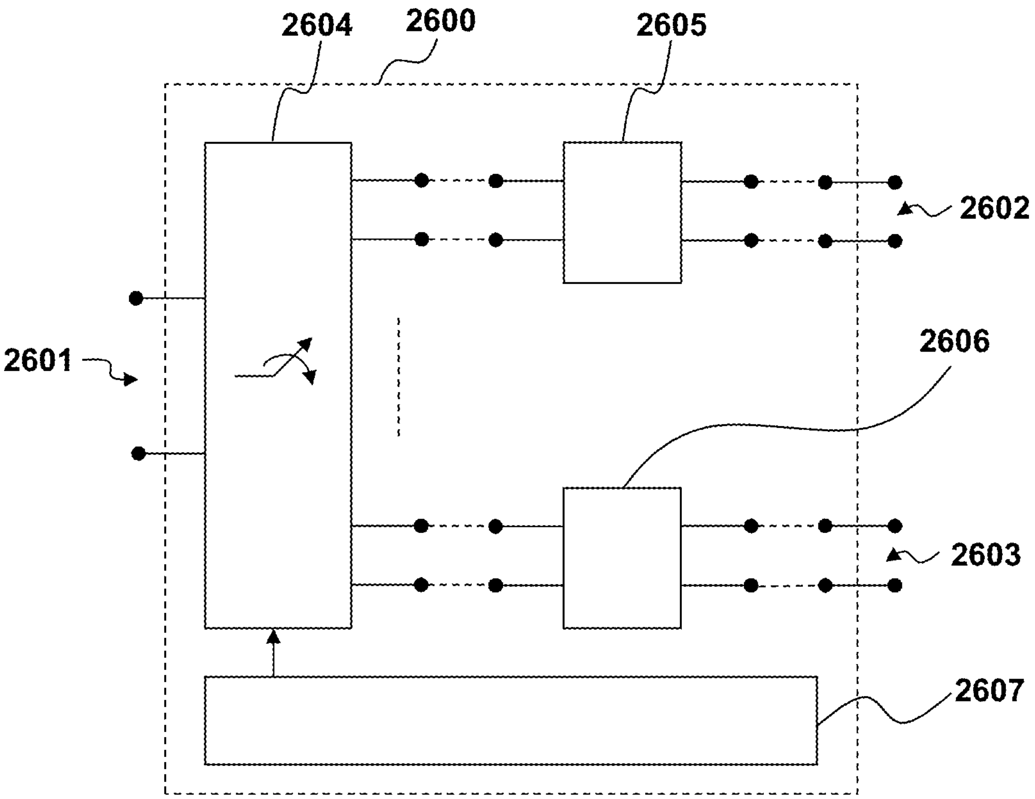
FIG. 26—Example of a reconfigurable radiofrequency system for a radiating system comprising a controllable switching matrix and a control circuit.
Figure 27:
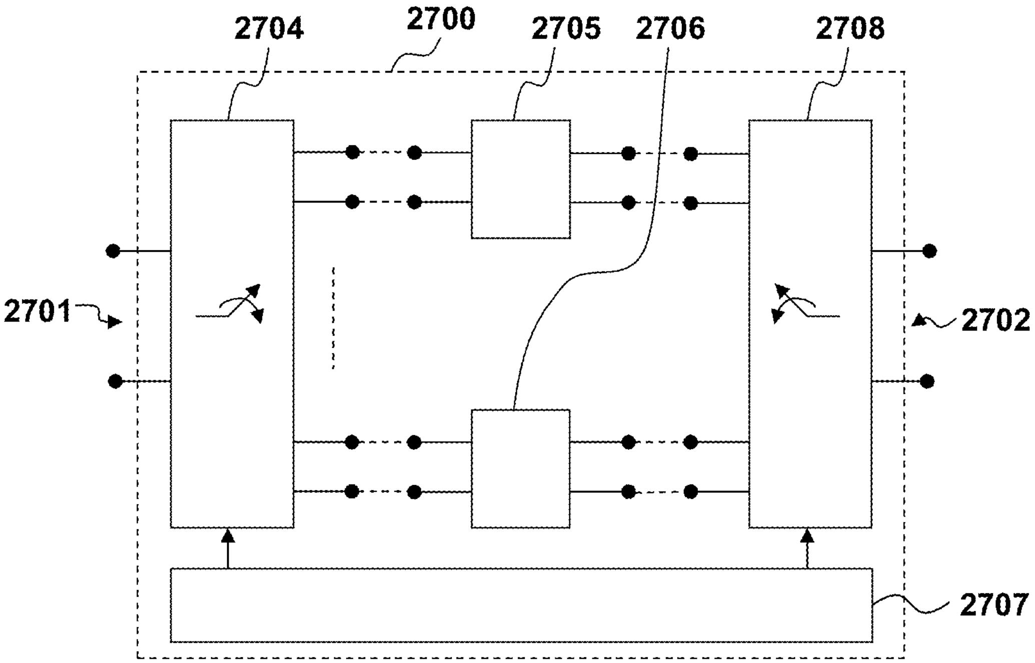
FIG. 27—Another example of a reconfigurable radiofrequency system for a radiating system comprising two controllable switching matrices and a control circuit.
Figure 28:
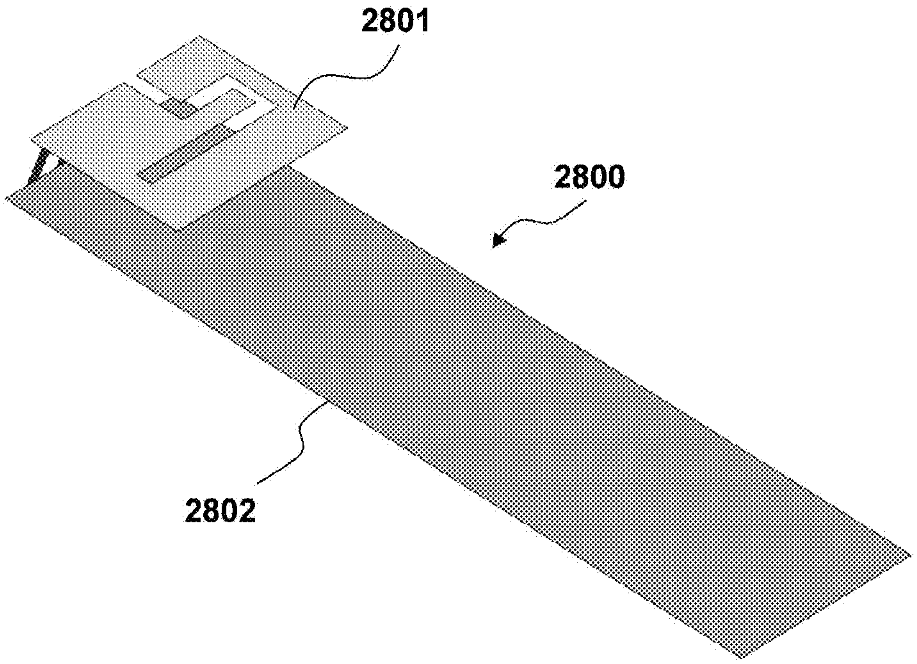
FIG. 28 (PRIOR ART)
FIG. 28—Radiating structure of a typical wireless handheld or portable device.

FIG. 26 and FIG. 27 are two examples of radiofrequency systems comprising switching matrices.

Referring now to FIG. 26, it is shown a radiofrequency system 2600 comprising a switching matrix 2604, a first matching network 2605 and a second matching network 2606. The radiofrequency system 2600 further comprises a first port 2601 for interconnection with the internal port of a radiating structure.

The switching matrix 2604 is connected between said first port 2601 and the first and second matching networks 2605, 2606 and allows selecting which one of the first and second matching networks 2605, 2606 is operationally connected to the first port 2601. The radiofrequency system 2600 also includes a control circuit 2607 that acts on the switching matrix 2604 to select which one of the first and second matching networks 2605, 2606 is selected at any given time.

In this example, the radiofrequency system 2600 comprises a second port 2602 and a third port 2603 connected to the first matching network 2605 and to the second matching network 2606 respectively.

An alternative example is presented in FIG. 27, in which a radiofrequency system 2700 comprises a first switching matrix 2704, a first matching network 2705, a second matching network 2706, and a second switching matrix 2708. The radiofrequency system also includes a first port 2701 for connection to an internal port of a radiating structure and a second port 2702, which may become an external port of a radiating system for a wireless handheld or portable device. The first switching matrix 2704 is connected between the first port 2701 and the first and second matching networks 2705, 2706, while the second switching matrix 2708 is connected between the first and second matching networks 2705, 2706 and the second port 2702.

A control circuit 2707 included in the radiofrequency system 2700 acts on the first and second switching matrices 2704, 2708 to select which one of the first and second matching networks 2705, 2706 is operationally connected to the first port 2701 and the second port 2702.

Although the radiofrequency systems 2600, 2700 have been described as comprising two matching networks, other possible radiofrequency systems according to the present invention could include three, four or more matching networks selectable by one or more switching matrices.

What is claimed is:

1. A radiation booster for a wireless communication device comprising:

a conductive part on at least a surface of the radiation booster;

wherein a radiation booster is configured to be combined with a ground plane layer forming a radiating structure, the radiating structure being interconnected with a radiofrequency system;

wherein the wireless communication device operates in at least a first frequency region;

wherein the ratio between a side of the ground plane layer and a free-space wavelength corresponding to a lowest frequency of the first frequency region is greater than 0.1; and wherein the radiating structure has a first resonance frequency at a frequency higher than the first frequency region when the radiating structure is disconnected from the radiofrequency system.

2. The radiation booster of claim 1, wherein the conductive part features a polygonal shape.

3. The radiation booster of claim 1, wherein the conductive part features a polyhedral shape comprising a plurality of faces.

4. The radiation booster of claim 1, wherein the conductive part is disposed in a surface-mount technology (SMT) component.

5. The radiation booster of claim 1, wherein the ratio between a side of the ground plane layer and the free-space wavelength corresponding to the lowest frequency of the first frequency region is greater than 0.2.

6. The radiation booster of claim 1, wherein the ratio between a side of the ground plane layer and the free-space wavelength corresponding to the lowest frequency of the first frequency region is greater than 0.3.

7. The radiation booster of claim 1, wherein the ratio between a side of the ground plane layer and the free-space wavelength corresponding to the lowest frequency of the first frequency region is greater than 0.4.

8. The radiation booster of claim 1, wherein the ratio between the first resonance frequency of the radiating structure and the highest frequency of the first frequency region is greater than 3.0.

9. The radiation booster of claim 1, wherein the ratio between the first resonance frequency of the radiating structure and the highest frequency of the first frequency region is greater than 3.8.

10. The radiation booster of claim 1, wherein the ratio between the first resonance frequency of the radiating structure and the highest frequency of the first frequency region is greater than 4.2.

11. A radiation booster for a wireless communication device comprising:

a radiation booster configured to be combined with a ground plane layer forming a radiating structure, the radiating structure being interconnected with a radiofrequency system;

a gap defined in the ground plane layer and delimited by one or more segments defining a curve;

wherein the radiation booster comprises a connection point located at a first point along the curve, and the ground plane layer comprises a connection point located at a second point along the curve, the second point being different from the first point;

wherein the wireless device operates in at least a first frequency region;

wherein the ratio between a side of the ground plane layer and a free-space wavelength corresponding to a lowest frequency of the first frequency region is greater than 0.1; and wherein the radiating structure has a first resonance frequency at a frequency higher than the first frequency region.

12. The radiation booster of claim 11, wherein the gap intersects the perimeter of the ground plane layer so that the curve delimiting the gap is open.

13. The radiation booster of claim 11, wherein the gap does not intersect the perimeter of the ground plane layer so that the curve delimiting the gap is closed.

14. The radiation booster of claim 11, wherein the connection point of the radiation booster and the connection point of the ground plane layer are located on two segments that are on opposite sides of the gap of the radiation booster.

15. The radiation booster of claim 11, wherein the gap has a polygonal shape.

16. The radiation booster of claim 11, wherein the ratio between a side of the ground plane layer and the free-space wavelength corresponding to the lowest frequency of the first frequency region is greater than 0.2.

17. The radiation booster of claim 11, wherein the ratio between a side of the ground plane layer and the free-space wavelength corresponding to the lowest frequency of the first frequency region is greater than 0.3.

18. The radiation booster of claim 11, wherein the ratio between the first resonance frequency of the radiating structure and the highest frequency of the first frequency region is greater than 3.0.

19. The radiation booster of claim 11, wherein the ratio between the first resonance frequency of the radiating structure and the highest frequency of the first frequency region is greater than 3.8.

20. The radiation booster of claim 11, wherein the ratio between the first resonance frequency of the radiating structure and the highest frequency of the first frequency region is greater than 4.2.

* * * * *